(12) United States Patent
Zheng et al.

(10) Patent No.: US 10,924,134 B2
(45) Date of Patent: Feb. 16, 2021

(54) APPARATUS AND METHOD FOR CHANNEL CODING IN COMMUNICATION SYSTEM

(71) Applicant: HUAWEI TECHNOLOGIES CO., LTD., Guangdong (CN)

(72) Inventors: Chen Zheng, Shanghai (CN); Liang Ma, Shanghai (CN); Xiaojian Liu, Shenzhen (CN); Yuejun Wei, Shanghai (CN); Xin Zeng, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/584,911

(22) Filed: Sep. 26, 2019

(65) Prior Publication Data
US 2020/0044665 A1 Feb. 6, 2020

Related U.S. Application Data

(63) Continuation of application No. 16/205,186, filed on Nov. 29, 2018, now Pat. No. 10,432,219, which is a
(Continued)

(30) Foreign Application Priority Data

May 5, 2017 (CN) .......................... 2017 1 0314217
May 25, 2017 (CN) .......................... 2017 1 0381396
(Continued)

(51) Int. Cl.
H03M 13/11 (2006.01)
H03M 13/00 (2006.01)
H04L 1/00 (2006.01)

(52) U.S. Cl.
CPC ........ H03M 13/1102 (2013.01); H03M 13/11 (2013.01); H03M 13/116 (2013.01);
(Continued)

(58) Field of Classification Search
CPC ... H04L 1/0041; H04L 1/0057; H04L 1/0067; H04L 1/1819; H04L 1/1812;
(Continued)

(56) References Cited

U.S. PATENT DOCUMENTS 7,178,082 B2  2/2007 Yu et al.
7,188,297 B2  3/2007 Blankenship et al.
(Continued)

FOREIGN PATENT DOCUMENTS

CA  2940011 A1  8/2015
CN  1805291 A   7/2006
(Continued)

OTHER PUBLICATIONS

3GPP TS 38.321 V0.0.3 (May 2017);3rd Generation Partnership Project;Technical Specification Group Radio Access Network;NR;Medium Access Control (MAC) protocol specification(Release 15),total 20 pages.
(Continued)

Primary Examiner — Shelly A Chase
(74) Attorney, Agent, or Firm — Huawei Technologies Co., Ltd.

(57) ABSTRACT

This application relates to communicating information between communication devices. A channel coding method is disclosed. A communication device obtains an input sequence of K bits. The communication device encodes the input sequence using a low density parity check (LDPC) matrix H, to obtain an encoded sequence. The LDPC matrix H is determined according to a base matrix and a lifting factor Z. The base matrix includes m rows and n columns, m is greater than or equal to 5, and n is greater than or equal to 27. The lifting factor Z satisfies a relationship of $22*Z \geq K$. According to the encoding method provided in the embodiments, information bit sequences of a plurality of lengths can be encoded for transmission between the communication devices.

29 Claims, 38 Drawing Sheets

Related U.S. Application Data continuation of application No. PCT/CN2017/092877, filed on Jul. 13, 2017.

(30) Foreign Application Priority Data

| May 26, 2017 | (WO) | ............... PCT/CN2017/086227 |
| Jun. 2, 2017 | (WO) | ............... PCT/CN2017/087073 |
| Jun. 9, 2017 | (WO) | ............... PCT/CN2017/087830 |
| Jun. 12, 2017 | (WO) | ............... PCT/CN2017/087943 |
| Jun. 27, 2017 | (WO) | ............... PCT/CN2017/090417 |

(52) U.S. Cl.
CPC ..... *H03M 13/616* (2013.01); *H03M 13/6393* (2013.01); *H03M 13/6516* (2013.01); *H04L 1/00* (2013.01)

(58) Field of Classification Search
CPC ......... H03M 13/1102; H03M 13/1148; H03M 13/036; H03M 13/116; H03M 13/616; H03M 13/6393

See application file for complete search history.

(56) References Cited

U.S. PATENT DOCUMENTS

| 7,600,174 | B2 | 10/2009 | Kyung et al. |
| 7,743,312 | B2 | 6/2010 | Choi et al. |
| 7,934,140 | B2 | 4/2011 | Oh et al. |
| 8,196,012 | B2 | 6/2012 | Lau et al. |
| 8,433,984 | B2 | 4/2013 | Khandekar et al. |
| 2004/0186992 | A1 | 9/2004 | Matsumoto |
| 2005/0283709 | A1 | 12/2005 | Kyung et al. |
| 2006/0129904 | A1 | 6/2006 | Blankenship et al. |
| 2006/0206781 | A1 | 9/2006 | Choi et al. |
| 2008/0178065 | A1* | 7/2008 | Khandekar ........ H03M 13/1185 714/801 |
| 2009/0132886 | A1 | 5/2009 | Oh et al. |
| 2010/0131818 | A1 | 5/2010 | Zhou et al. |
| 2010/0281329 | A1 | 11/2010 | Yokokawa et al. |
| 2011/0083052 | A1 | 4/2011 | Lau et al. |
| 2012/0185757 | A1 | 7/2012 | Jeong et al. |
| 2014/0229789 | A1 | 8/2014 | Richardson |
| 2014/0344639 | A1 | 11/2014 | Kyung et al. |
| 2016/0094246 | A1 | 3/2016 | Vasista Srinivasan Ranganathan et al. |
| 2016/0173132 | A1 | 6/2016 | Cho |
| 2017/0359086 | A1* | 12/2017 | Kudekar ............... H04L 1/1812 |
| 2019/0288708 | A1 | 9/2019 | Ma et al. |

FOREIGN PATENT DOCUMENTS

| CN | 1941635 | A | 4/2007 |
| CN | 101159435 | A | 4/2008 |
| CN | 101162907 | A | 4/2008 |
| CN | 101378304 | A | 3/2009 |
| CN | 101395804 | A | 3/2009 |
| CN | 100539442 | C | 9/2009 |
| CN | 101572554 | A | 11/2009 |
| CN | 101911506 | A | 12/2010 |
| CN | 102035556 | A | 4/2011 |
| CN | 102638274 | A | 8/2012 |
| CN | 105075128 | A | 11/2015 |
| CN | 106471782 | A | 3/2017 |
| CN | 104168030 | B | 11/2017 |
| CN | 108173621 | A | 6/2018 |
| EP | 1699139 | A2 | 9/2006 |
| EP | 1596501 | B1 | 4/2009 |
| JP | 2011041076 | A | 2/2011 |
| RU | 2443053 | C2 | 2/2012 |
| WO | 2003056705 | A1 | 7/2003 |
| WO | 2004006442 | A1 | 1/2004 |
| WO | 2009026798 | A1 | 3/2009 |
| WO | 2018082290 | A1 | 5/2018 |
| WO | 2018173162 | A1 | 9/2018 |

OTHER PUBLICATIONS

Xiangyun Chen,"Elementary Transformation of Matrix and Its Application",Journal of Higher Correspondence Education(Natural Sciences),vol. 25 No. 2.2012,with an machine translation,total 8 pages.

3GPP TS 38.331 V0.0.2 (Mar. 2017);3rd Generation Partnership Project;Technical Specification Group Radio Access Network;NR-;Radio Resource Control (RRC);Protocol specification(Release 15 );total 13 pages.

3GPP TS 38.413 V0.0.2 (May 2017);3rd Generation Partnership Project;Technical Specification Group Radio Access Network;NG Radio Access Network(NG-RAN);NG Application Protocol (NGAP)(Release 15);total 39 pages.

3GPP TS 38.300 V0.2.0 (May 2017);3rd Generation Partnership Project;Technical Specification Group Radio Access Network;NG Radio Access Network;Overall Description;Stage 2(Release 15);total 33 pages.

LG Electronics,"LDPC Codes Design for eMBB data channel",3GPP TSG RAN WG1 NR ad-hoc R1-1700518, Spokane, USA Jan. 16-20, 2017,total 6 pages.

Huawei et al.,"LDPC design for eMBB data",3GPP TSG RAN WGl Meeting #88bis RI-1704250,Spokane, USA, Apr. 3-7, 2017,total 6 pages.

Mediatek Inc.,"A multi-codebook embedded compact QC-LDPC design",3GPP TSG-RAN WGl NR R1-1704457, Spokane, USA, Apr. 3-7, 2017,total 11 pages.

Samsung,"Design of LDPC Proto-matrix",3GPP TSG RAN WG1 #88bis Rt-1705419,Spokane, USA, Apr. 3-7, 2017,total 5 pages.

IEEE Std 802.16™-2012, (Revision of IEEE Std 802.16-2009), IEEE Standard for Air Interface for Broadband Wireless Access Systems, IEEE Computer Society and the IEEE Microwave Theory and Techniques Society, Sponsored by the LAN/MAN Standards Committee, Aug. 17, 2012, total 2544 pages.

"Short Block Length LDPC Codes for TC Synchronization and Channel Coding", Experimental Specification CCSDS 231.1-O-1, Research and Development for Space Data System Standards, Orange Book, Apr. 2015, total 39 pages.

3GPP TR 38.912 V1.0.0 (Mar. 2017);3rd Generation Partnership Project;Technical Specification Group Radio Access Network;Study on New Radio (NR) Access Technology(Release 14),total 74 pages.

ETSI EN 302 755 V1.4.1,Digital Video Broadcasting (DBV);Frame structure channel coding and modulation for a second generation digital terrestrial television broadcasting system(DVB-T2),total 188 pages, Jul. 2015.

ETSI EN 302 769 V1.3.1 (Oct. 2015),Digital Video Broadcasting (DVB);Frame structure channel coding and modulation for a second generation digital transmission system for cable systems (DVB-C2),total 112 pages.

IEEE Std 802.11™-2016(Revision of IEEE Std 802.11-2012),Part 11: Wireless LAN Medium Access Control (MAC) and Physical Layer (PHY) Specifications,IEEE Computer Society,Sponsored by the LAN/MAN Standards Committee, total 3534 pages.

Intel Corporation,"LDPC code design for NR",3GPP TSG RAN WG1 Meeting #85 R1-164183,Nanjing, China, May 23-27, 2016,total 4 pages.

KT Corp.,"Number of LDPC codes in NR",3GPP TSG RAN WG1 Meeting #88 R1-1703210,Athens, Greece, Feb. 13-17, 2017,total 3 pages.

MediaTek,"Discussion on LDPC code design and performance evaluation",3GPP TSG-RAN WG1 #85 R1-165453, Nanjing, China, May 23-27, 2016,total 7 pages.

Qualcomm et al.,"WF on LDPC Matrix",3GPP TSG RAN WG1 Meeting #88 R1-1703xxx,Athens, Greece ,Feb. 13-17, 2017,total 4 pages.

R.G. Gallager,"Low-Density Parity-Check Codes",IRE Transactions on Information Theory,1962,total 8 pages.

(56) References Cited

OTHER PUBLICATIONS

Samsung,"Consideration on LDPC Proto-Matrix Design",3GPP TSG RAN WG1 #88 R1-1703000,Athens, Greece, Feb. 13-17, 2017,total 4 pages.
ZTE et al.,"Compact LDPC design for eMBB",3GPP TSG RAN WG1 AH NR Meeting R1-1701473,Spokane, USA Jan. 16-20, 2017,total 19 pages.
ZTE, ZTE Microelectronics,"Performance evaluation of LDPC codes for eMBB",3GPP TSG RAN WG1 Meeting #88 R1-1701597,Athens, Greece Feb. 13-17, 2017,total 6 pages.
"Panyuh Joo et al.,""LDPC coding for OFDMA PHY""",IEEE 802.16 Broadband Wireless Access Working Group, IEEEC802. 16d-04/86r1,May 1, 2004,total 12 pages."
"Huawei et al.,""LDPC design for eMBB data""",3GPP TSG RAN WG1 Meeting #89 R1-1706970,Hangzhou, China, May 15-19, 2017,total 11 pages."
"Huawei et al.,""Performance evaluation of LDPC codes""",3GPP TSG RAN WG1 Meeting #89 R1-1706971,Hangzhou, China, May 15-19, 2017,total 12 pages."
"Huawei et al.,""Throughput of LDPC codes""",3GPP TSG RAN WG1 Meeting #89 R1-1706972,Hangzhou, China, May 15-19, 2017,total 7 pages."
"Huawei et al.,""Rate matching for LDPC codes""",3GPP TSG RAN WG1 Meeting #89 R1-1706973,Hangzhou, China, May 15-19, 2017,total 4 pages."
"Nokia et al.,""WF on Candidate LDPC Base Matrices""", 3GPP TSG RAN WG1 Meeting #89 R1-1709751,Hangzhou, China, May 15-19, 2017. with ""Simulation results for LDPC codes"",Prepared by Zeng Xin,total 33 pages."
"Huawei et al.,""LDPC design for base graph 1""",3GPP TSG RAN WG1 Meeting AH#2 R1-1711436,Qingdao, P.R. China,Jun. 27-30, 2017,total 4 pages."
"Huawei et al.,""LDPC design for base graph 2""",3GPP TSG RAN WG1 Meeting AH#2 R1-1711437,Qingdao, P.R. China,Jun. 27-30, 2017,total 4 pages."
"Huawei et al,.""Rate matching for LDPC codes""",3GPP TSG RAN WG1 NR Ad-Hoc#2 R1-1711438,Qingdao, China,Jun. 27-30, 2017,total 6 pages."
"Nokia et al.,""Summary of [89-24] Email discussion on LDPC code base graph #1 for NR""",3GPP TSG RAN WG1 NRAd-Hoc #2 R1-1711545,Qingdao, P.R. China Jun. 27-30, 2017,total 4 pages."
"Nokia et al.,""WF on LDPC parity check matrices""",3GPP TSG RAN WG1 NR AH #2 R1-1711982,Qingdao, China, Jun. 27-30, 2017,total 2 pages."
"Huawei et al.,""LDPC design for base graph 1""",3GPP TSG RAN WG1 Meeting AH#2 R1-1711727,Qingdao, P.R. China,Jun. 27-30, 2017,total 4 pages."
Mediatek Inc., Multi-codebook embedded compact QC-LDPC designs [online], 3GPP TSG RAN WG1 #88b, Apr. 4, 2014, R1-1706175,Total 14 Pages.

* cited by examiner

| 1 | 1 | 1 | 1 | 1 | 1 | 1 | 1 | 1 | 1 | 1 | 1 | 1 | 1 | 1 | 1 | 1 | 1 | 0 | 0 |
|---|---|---|---|---|---|---|---|---|---|---|---|---|---|---|---|---|---|---|---|
| 1 | 1 | 1 | 1 | 1 | 1 | 1 | 1 | 1 | 1 | 1 | 1 | 1 | 1 | 1 | 1 | 1 | 1 | 1 | 0 |
| 1 | 0 | 1 | 1 | 1 | 1 | 1 | 1 | 1 | 1 | 1 | 1 | 1 | 1 | 1 | 1 | 1 | 0 | 1 | 0 |
| 1 | 1 | 0 | 0 | 0 | 0 | 0 | 0 | 0 | 0 | 0 | 0 | 0 | 0 | 0 | 0 | 0 | 0 | 0 | 1 |

10a

| 2 | 276 | 50 | 337 | 422 | 354 | 305 | 273 | 191 | 348 | 220 | 127 | 373 | 411 | 340 | 321 | 0 | 0 | -1 | -1 |
|---|---|---|---|---|---|---|---|---|---|---|---|---|---|---|---|---|---|---|---|
| 44 | 209 | 318 | 295 | 289 | 300 | 94 | 174 | 372 | 411 | 100 | 92 | 482 | 185 | 191 | 420 | 1 | 0 | 0 | -1 |
| 294 | -1 | 213 | 90 | 461 | 112 | 46 | 307 | 221 | 375 | 19 | 136 | 469 | 176 | 377 | 364 | 0 | -1 | 0 | -1 |
| 416 | 135 | -1 | -1 | -1 | -1 | -1 | -1 | -1 | -1 | -1 | -1 | -1 | -1 | -1 | -1 | -1 | -1 | -1 | 0 |

10b $$-1 \to \begin{bmatrix} 0 & 0 & 0 & 0 \\ 0 & 0 & 0 & 0 \\ 0 & 0 & 0 & 0 \\ 0 & 0 & 0 & 0 \end{bmatrix}, 0 \to \begin{bmatrix} 1 & 0 & 0 & 0 \\ 0 & 1 & 0 & 0 \\ 0 & 0 & 1 & 0 \\ 0 & 0 & 0 & 1 \end{bmatrix}, 1 \to \begin{bmatrix} 0 & 1 & 0 & 0 \\ 0 & 0 & 1 & 0 \\ 0 & 0 & 0 & 1 \\ 1 & 0 & 0 & 0 \end{bmatrix}, 2 \to \begin{bmatrix} 0 & 0 & 1 & 0 \\ 0 & 0 & 0 & 1 \\ 1 & 0 & 0 & 0 \\ 0 & 1 & 0 & 0 \end{bmatrix}, 3 \to \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

APPARATUS AND METHOD FOR CHANNEL CODING IN COMMUNICATION SYSTEM

CROSS-REFERENCE TO RELATED APPLICATIONS

This application is a continuation of U.S. patent application Ser. No. 16/205,186, filed on Nov. 29, 2018, which is a continuation of International Application No. PCT/CN2017/092877, filed on Jul. 13, 2017. The International Application PCT/CN2017/092877 claims priority to International Application No. PCT/CN2017/090417, filed on Jun. 27, 2017, International Patent Application No. PCT/CN2017/087943, filed on Jun. 12, 2017, International Patent Application No. PCT/CN2017/087830, filed on Jun. 9, 2017, International Patent Application No. PCT/CN2017/087073, filed on Jun. 2, 2017, International Patent Application No. PCT/CN2017/086227, filed on May 26, 2017, Chinese Patent Application No. 201710381396.2, filed on May 25, 2017, and Chinese Patent Application No. 201710314217.3, filed on May 5, 2017. All of the aforementioned patent applications are hereby incorporated by reference in their entireties.

TECHNICAL FIELD

Embodiments of the present application relate to the communications field, and in particular, to apparatuses and methods for channel coding in communication systems.

BACKGROUND

Low density parity check (LDPC) code is a type of linear block code having a sparse check matrix, and is characterized by flexible structure and low decoding complexity. Because decoding the LDPC code uses a partially parallel iterative decoding algorithm, the LDPC code has a higher throughput than a conventional turbo code. The LDPC code can be used as an error-correcting code in a communication system, so as to increase channel transmission reliability and power utilization. LDPC codes may be further widely used in space communications, fiber optic communications, personal communication systems, Asymmetrical Digital Subscriber Loop (ADSL), magnetic recording devices, and the like. The LDPC code has been currently considered as one of channel coding modes in the fifth generation (5G) mobile communication systems.

In actual applications, LDPC matrices having different special structures may be used. A LDPC matrix H, characterized by a special structure, may be obtained by expanding an LDPC base matrix having a quasi cyclic (QC) structure. QC-LDPC coding scheme is suitable for hardware with high parallelism, and provides a higher throughput. Furthermore, it is possible to design a LDPC matrix that is suitable for channel coding.

SUMMARY

Embodiments of the present application provide an information processing method, a communications apparatus, and a communications system, to support encoding and decoding of information bit sequences of various lengths and meet flexible code length and code rate requirements of the communication system.

According to a first aspect, an encoding method and an encoder are provided, and the encoder encodes an input sequence by using a low density parity check (LDPC) matrix.

According to a second aspect, a decoding method and a decoder are provided, and the decoder decodes an input sequence by using a low density parity check (LDPC) matrix.

In a first implementation of the first aspect or the second aspect, a base graph of the LDPC matrix is represented by a matrix of m rows and n columns, m is an integer greater than or equal to 5, and n is an integer greater than or equal to 27. The base graph includes at least a submatrix A and a submatrix B. The submatrix A is a matrix of five rows and 22 columns. The submatrix B is a matrix of five rows and five columns, and the submatrix B includes a column whose weight is 3 and a submatrix B' with a bi-diagonal structure.

Optionally, in the submatrix A, one column has a weight of 5, one column has a weight of 4, and other 20 columns have a weight of 3.

Optionally, in the submatrix B, one column has a weight of 3, and three columns have a weight of 2.

Based on the foregoing implementation, the submatrix B further includes one column whose weight is 1.

In a second implementation of the first aspect or the second aspect, a base graph of the LDPC matrix is represented by a matrix of m rows and n columns, m is an integer greater than or equal to 5, and n is an integer greater than or equal to 27. The base graph includes at least a submatrix A and a submatrix B. The submatrix A is a matrix of five rows and 22 columns; and the submatrix B is a matrix of five rows and five columns. In a matrix including the submatrix A and the submatrix B, one column has a weight of 5, one column has a weight of 4, 21 columns have a weight of 3, three columns have a weight of 2, and one column has a weight of 1.

Optionally, in the matrix including the submatrix A and the submatrix B, one row has a weight greater than or equal to 1 and less than or equal to 5, and other four rows have weights greater than or equal to 17 and less than or equal to 21.

For example, in the matrix including the submatrix A and the submatrix B, one row has a weight of 3, and other four rows have a weight of 19. In this case, the matrix including the submatrix A and the submatrix B may include rows or columns in a matrix block of five rows that comprises row 0 to row 4 and column 0 to column 26 in a base graph 30*a* shown in FIG. 3*a*. The rows can be switched with each other, and the columns can also be switched with each other. For example, in the matrix block including the submatrix A and the submatrix B in the base graph 30*a*, row 3 and row 0 may be switched with each other, row 2 and row 1 may be switched with each other, and column 23 and column 25 may be switched with each other, to obtain a core matrix in a base graph 80*a* shown in FIG. 8*a*.

Based on the foregoing implementations, a part that is in a base matrix of the LDPC matrix and that corresponds to the submatrix A and the submatrix B may be represented by, for example, any one of base matrices 30*b*-1, 30*b*-2, 30*b*-3, 30*b*-4, and 30*b*-5 shown in FIGS. 3*b*-1, and 30*b*-6, 30*b*-7, 30*b*-8, 30*b*-9, and 30*b*-10 shown in FIG. 3*b*-2.

A part that is in a base matrix of the LDPC matrix and that corresponds to the submatrix A and the submatrix B may be represented by a matrix obtained by performing column permutation, row permutation, or row permutation and column permutation on any one of the base matrices 30*b*-1, 30*b*-2, 30*b*-3, 30*b*-4, 30*b*-5, 30*b*-6, 30*b*-7, 30*b*-8, 30*b*-9, or 30*b*-10. For example, the part that is in the base matrix of the LDPC matrix and that corresponds to the submatrix A and the submatrix B may include rows or columns in any one of the base matrices 30b-1, 30b-2, 30b-3, 30b-4, 30b-5, 30b-6, 30b-7, 30b-8, 30b-9, or 30b-10.

Based on the foregoing implementations, a part that is in a base matrix of the LDPC matrix and that corresponds to the submatrix A and the submatrix B may be represented by any one of base matrices 80b-1, 80b-2, 80b-3, 80b-4, 80b-5 shown in FIG. 8b-1, or 80b-6 shown in FIG. 8b-2. 80b-4 is a matrix obtained by performing row permutation and column permutation on 30b-3, 80b-5 is a matrix obtained by performing row permutation and column permutation are performed on 30b-4, and 80b-6 is a matrix obtained by performing row permutation and column permutation are performed on 30b-5.

To support different block lengths, an LDPC code needs different lifting factors Z. Based on the foregoing implementations, in a possible implementation, base matrices corresponding to different lifting factors Z are used based on the different lifting factors Z.

For example,
- if the lifting factor Z is one of {16, 18, 20, 22, 24, 26, 28, 30}, a part that is in a base matrix of the base graph 30a and that corresponds to the submatrix A and the submatrix B may be the base matrix 30b-1 shown in FIG. 3b-1; or
- if the lifting factor Z is one of {32, 36, 40, 44, 48, 52, 56, 60}, a part that is in a base matrix of the base graph 30a and that corresponds to the submatrix A and the submatrix B may be the base matrix 30b-2 shown in FIG. 3b-1; or
- if the lifting factor Z is one of {60, 64, 72, 80, 88, 96, 104, 112, 120}, a part that is in a base matrix of the base graph 30a and that corresponds to the submatrix A and the submatrix B may be the base matrix 30b-3 shown in FIG. 3b-1; or
- if the lifting factor Z is one of {128, 144, 160, 176, 192, 208, 224, 240}, a part that is in a base matrix of the base graph 30a and that corresponds to the submatrix A and the submatrix B may be the base matrix 30b-4 shown in FIG. 3b-1; or
- if the lifting factor Z is one of {256, 288, 320, 352, 384}, a part that is in a base matrix of the base graph 30a and that corresponds to the submatrix A and the submatrix B may be the base matrix 30b-5 shown in FIG. 3b-1.

In another possible implementation,
- if the lifting factor Z is one of {24, 26, 28, 30}, a part that is in a base matrix of the base graph 80a and that corresponds to the submatrix A and the submatrix B may be the base matrix 80b-1 shown in FIG. 8b-1; or
- if the lifting factor Z is one of {32, 36, 40, 44}, a part that is in a base matrix of the base graph 80a and that corresponds to the submatrix A and the submatrix B may be the base matrix 80b-2 shown in FIG. 8b-1; or
- if the lifting factor Z is one of {48, 52, 56, 60}, a part that is in a base matrix of the base graph 80a and that corresponds to the submatrix A and the submatrix B may be the base matrix 80b-3 shown in FIG. 8b-1; or
- if the lifting factor Z is one of {60, 64, 72, 80, 88, 96, 104, 112, 120}, a part that is in a base matrix of the base graph 80a and that corresponds to the submatrix A and the submatrix B may be the base matrix 80b-4 shown in FIG. 8b-1; or
- if the lifting factor Z is one of {128, 144, 160, 176, 192, 208, 224, 240}, a part that is in a base matrix of the base graph 80a and that corresponds to the submatrix A and the submatrix B may be the base matrix 80b-5 shown in FIG. 8b-1; or
- if the lifting factor Z is one of {256, 288, 320, 352, 384}, a part that is in a base matrix of the base graph 80a and that corresponds to the submatrix A and the submatrix B may be the base matrix 80b-6 shown in FIG. 8b-2.

In another possible implementation, the submatrix A may further include two columns of built-in puncture bits.

Further, to obtain a flexible code rate, a submatrix C, a submatrix D, and a submatrix E of corresponding sizes may be added based on a core matrix, to obtain different code rates.

The submatrix C is an all-zero matrix of five rows and $m_D$ columns;
the submatrix D is a matrix of $m_D$ rows and 27 columns;
the submatrix E is an identity matrix of $m_D$ rows and $m_D$ columns; and
$m_D$ is an integer and $0 \leq m_D \leq 41$.

The submatrix D includes $m_D$ rows in a matrix F, the matrix F has 41 rows and 27 columns, and weights of the rows in the matrix F are respectively 7, 7, 9, 8, 7, 7, 8, 6, 6, 5, 6, 5, 5, 6, 5, 5, 5, 5, 4, 4, 4, 5, 4, 5, 4, 4, 4, 4, 3, 4, 4, 4, 4, 3, 3, 4, 4, 3, 3, 3, and 4.

In a possible implementation, the matrix F is a matrix including row 5 to row 45 and column 0 to column 26 in the base graph 30a.

In a possible implementation, a shift matrix of the matrix F may be represented by any one of base matrices 30c-1 shown in FIG. 3c-2, 30c-2 shown in FIG. 3c-3, 30c-3 shown in FIG. 3c-4, 30c-4 shown in FIG. 3c-5, or 30c-5 shown in FIG. 3c-6.

In another possible implementation, row 17 and row 19 in the base graph 30a may be switched with each other, and column 39 and column 41 may be switched with each other, to obtain the base graph matrix 80a shown in FIG. 8a. For another example, the submatrix D includes $m_D$ rows in a matrix F, row permutation may not be performed between the $m_D$ rows, or row permutation may be performed between one or more of the $m_D$ rows, and the submatrix E still has a diagonal structure. For example, the submatrix D includes $m_D$ rows in the matrix F, row 12 and row 14 in the matrix F are switched with each other, and the submatrix E still has a diagonal structure, to obtain the base graph 80a.

To support different block lengths, an LDPC code needs different lifting factors Z. Based on the foregoing implementations, in a possible implementation, base matrices corresponding to different lifting factors Z are used based on the different lifting factors Z. For example, in a possible implementation,
- if the lifting factor Z is one of {16, 18, 20, 22, 24, 26, 28, 30}, the submatrix D in the base matrix may include $m_D$ rows in a shift matrix 30c-1 shown in FIG. 3c-2; or
- if the lifting factor Z is one of {32, 36, 40, 44, 48, 52, 56, 60}, the submatrix D in the base matrix may include $m_D$ rows in a shift matrix 30c-2 shown in FIG. 3c-3; or
- if the lifting factor Z is one of {60, 64, 72, 80, 88, 96, 104, 112, 120}, the submatrix D in the base matrix may include $m_D$ rows in a shift matrix 30c-3 shown in FIG. 3c-4; or
- if the lifting factor Z is one of {128, 144, 160, 176, 192, 208, 224, 240}, the submatrix D in the base matrix may include $m_D$ rows in a shift matrix 30c-4 shown in FIG. 3c-5; or
- if the lifting factor Z is one of {256, 288, 320, 352, 384}, the submatrix D in the base matrix may include $m_D$ rows in a shift matrix 30c-5 shown in FIG. 3c-6.

In another possible implementation, a lifting factor set may be {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}.

If the lifting factor Z is one of {24, 26, 28, 30}, the shift matrix of the matrix F may be 80c-1 shown in FIG. 8c-2; or
if the lifting factor Z is one of {32, 36, 40, 44}, the shift matrix of the matrix F may be 80c-2 shown in FIG. 8c-3; or
if the lifting factor Z is one of {48, 52, 56, 60}, the shift matrix of the matrix F may be 80c-3 shown in FIG. 8c-4; or
if the lifting factor Z is one of {60, 64, 72, 80, 88, 96, 104, 112, 120}, the shift matrix of the matrix F may be 80c-4 shown in FIG. 8c-5; or
if the lifting factor Z is one of {128, 144, 160, 176, 192, 208, 224, 240}, the shift matrix of the matrix F may be 80c-5 shown in FIG. 8c-6; or
if the lifting factor Z is one of {256, 288, 320, 352, 384}, the shift matrix of the matrix F may be 80c-6 shown in FIG. 8c-7.

The base graph and the base matrix of the LDPC matrix in the first implementation can meet performance requirements of code blocks whose block lengths are 352 to 8448 bits.

Based on any one of the foregoing aspects or the possible implementations of the aspects, in another possible implementation, the method further includes: determining a lifting factor Z. For example, a value of the lifting factor Z is determined based on a length K of the input sequence. For example, if the length of the input sequence is K, a minimum value that meets $22*Z \geq K$ may be determined from a plurality of lifting factors defined in a system.

For a communications device at a transmit end, the encoding an input sequence by using an LDPC matrix includes: encoding the input sequence by using an LDPC matrix corresponding to the lifting factor Z.

For a communications device at a receive end, the decoding an input sequence by using an LDPC matrix includes: decoding the input sequence by using an LDPC matrix corresponding to the lifting factor Z.

Based on any one of the foregoing aspects or the possible implementations of the aspects, in another possible implementation, the base matrix of the LDPC matrix may be stored in a memory.

Based on any one of the foregoing aspects or the possible implementations of the aspects, in another possible implementation, the base graph of the LDPC matrix is stored in the memory, and a shift value of a non-zero-element in the base matrix of the LDPC matrix may be stored in the memory.

Based on the foregoing possible implementations, in a possible design, at least one of a base graph and a base matrix for LDPC encoding or decoding is obtained by performing row permutation, or column permutation, or row permutation and column permutation on at least one of the base graph and the base matrix of the LDPC matrix.

According to a third aspect, a communications apparatus is provided, and the apparatus may include software modules and/or hardware components configured to perform any one of the possible implementations of the first aspect in the foregoing method design.

In a possible design, the communications apparatus provided in the third aspect includes the encoder described in the first aspect, a determining unit, and a processing unit. The determining unit is configured to determine a lifting factor Z required for encoding an input sequence. The processing unit is configured to encode the input sequence by using an LDPC matrix corresponding to the lifting factor Z.

Optionally, the communications apparatus further includes a transceiver, and the transceiver is configured to send a signal corresponding to encoded information data.

According to a fourth aspect, a communications apparatus is provided, and the apparatus may include a module configured to perform any one of the possible implementations of the second aspect in the foregoing method design. The module may be software and/or hardware.

In a possible design, the communications apparatus provided in the fourth aspect includes the decoder described in the second aspect, an obtaining unit, and a processing unit. The obtaining unit is configured to obtain a soft value sequence of an LDPC code and a lifting factor Z. The processing unit is configured to decode the soft value sequence of the LDPC code based on a base matrix $H_B$ corresponding to the lifting factor Z, to obtain an information bit sequence.

The communications apparatus further includes a transceiver, and the transceiver is configured to receive a signal including an LDPC code.

According to a fifth aspect, a communications apparatus is provided, including one or more processors.

In a possible design, the one or more processors may implement functions of the encoder in the first aspect. In another possible design, the encoder in the first aspect may be a part of the processor, and the processor may implement other functions in addition to functions of the encoder in the first aspect.

In a possible design, the one or more processors may implement functions of the decoder in the second aspect. In another possible design, the decoder in the second aspect may be a part of the processor.

Optionally, the communications apparatus may further include a transceiver and an antenna.

Optionally, the communications apparatus may further include a component configured to generate a transport block cyclical redundancy check (CRC), a component used for code block segmentation and CRC check, an interleaver used for interleaving, a modulator used for modulation processing, or the like.

Optionally, the communications apparatus may further include a demodulator used for demodulation, a de-interleaver used for de-interleaving, a component used for de-rate matching, or the like. Functions of these components may be implemented by the one or more processors.

In a possible design, functions of these components may be implemented by the one or more processors.

According to a sixth aspect, an embodiment of the present application provides a communications system, and the system includes the communications apparatus described in the third aspect and the communications apparatus described in the fourth aspect.

According to a seventh aspect, an embodiment of the present application provides a communications system, and the system includes one or more communications apparatuses described in the fifth aspect.

According to another aspect, an embodiment of the present application provides a computer storage medium, where the computer storage medium stores a program, and when the program is run, a computer is caused to perform the methods described in the foregoing aspects.

According to another aspect of this application, a computer program product including an instruction is provided.

When the instruction is run on a computer, the computer is caused to perform the methods in the foregoing aspects.

According to the information processing method, the apparatus, the communications device, and the communications system in the embodiments of the present application, flexible code length and code rate requirements of the communication system can be met in terms of encoding performance and error floor.

BRIEF DESCRIPTION OF DRAWINGS

FIG. 1 shows schematic diagrams of a base graph, a base matrix, and circular permutation matrices of an LDPC code;

Figure 3A:
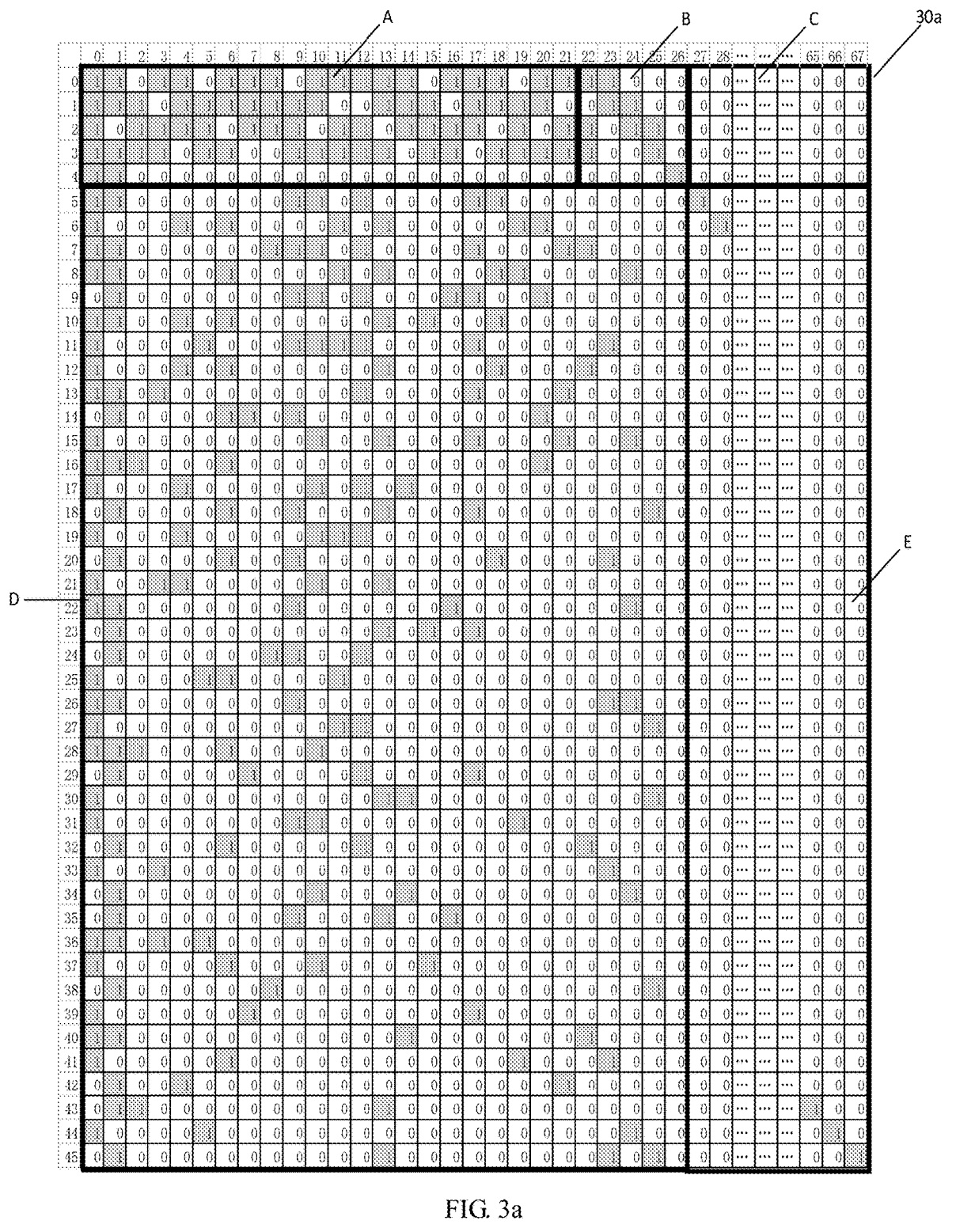
Figure 3B-1:
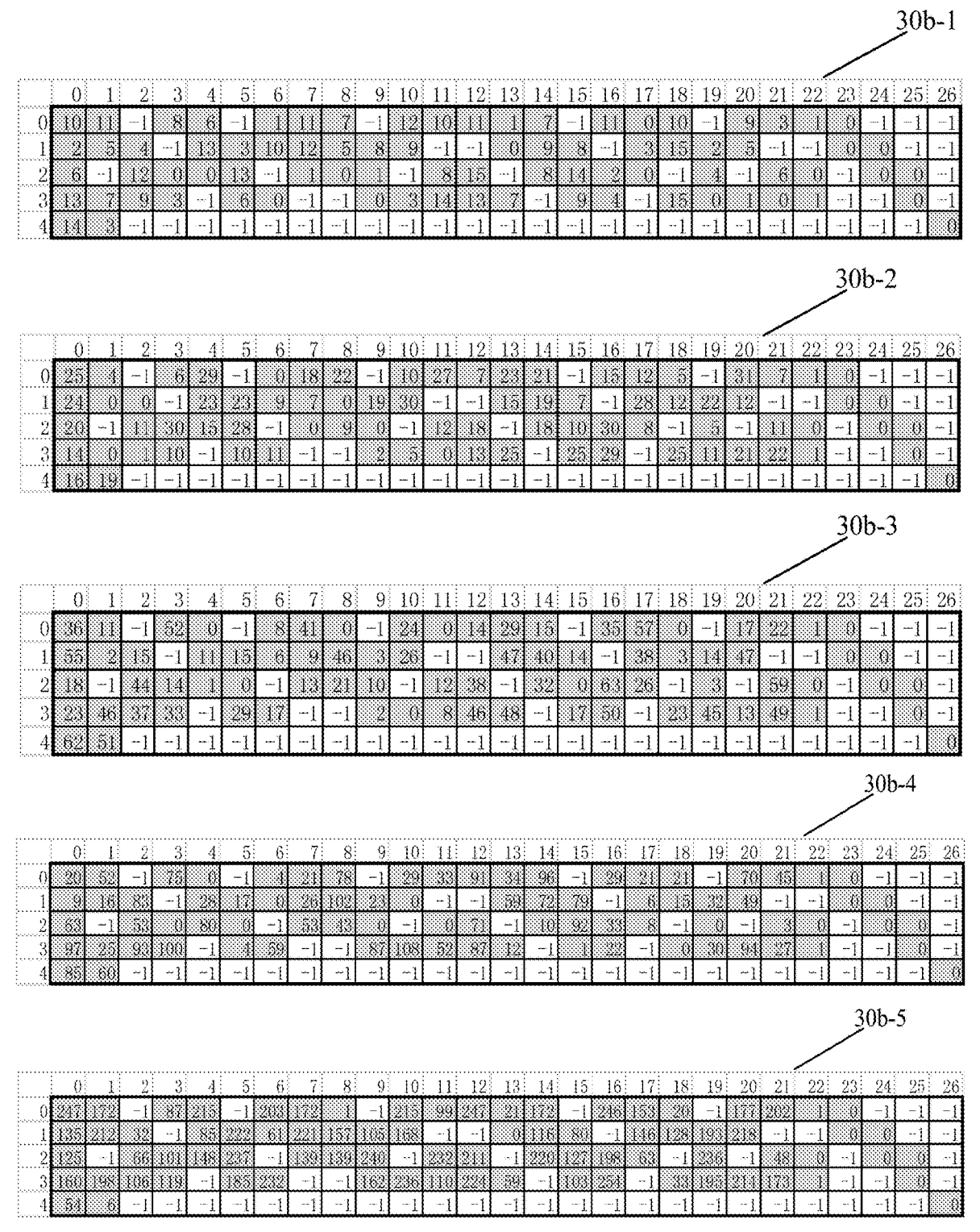
Figure 3B-2:
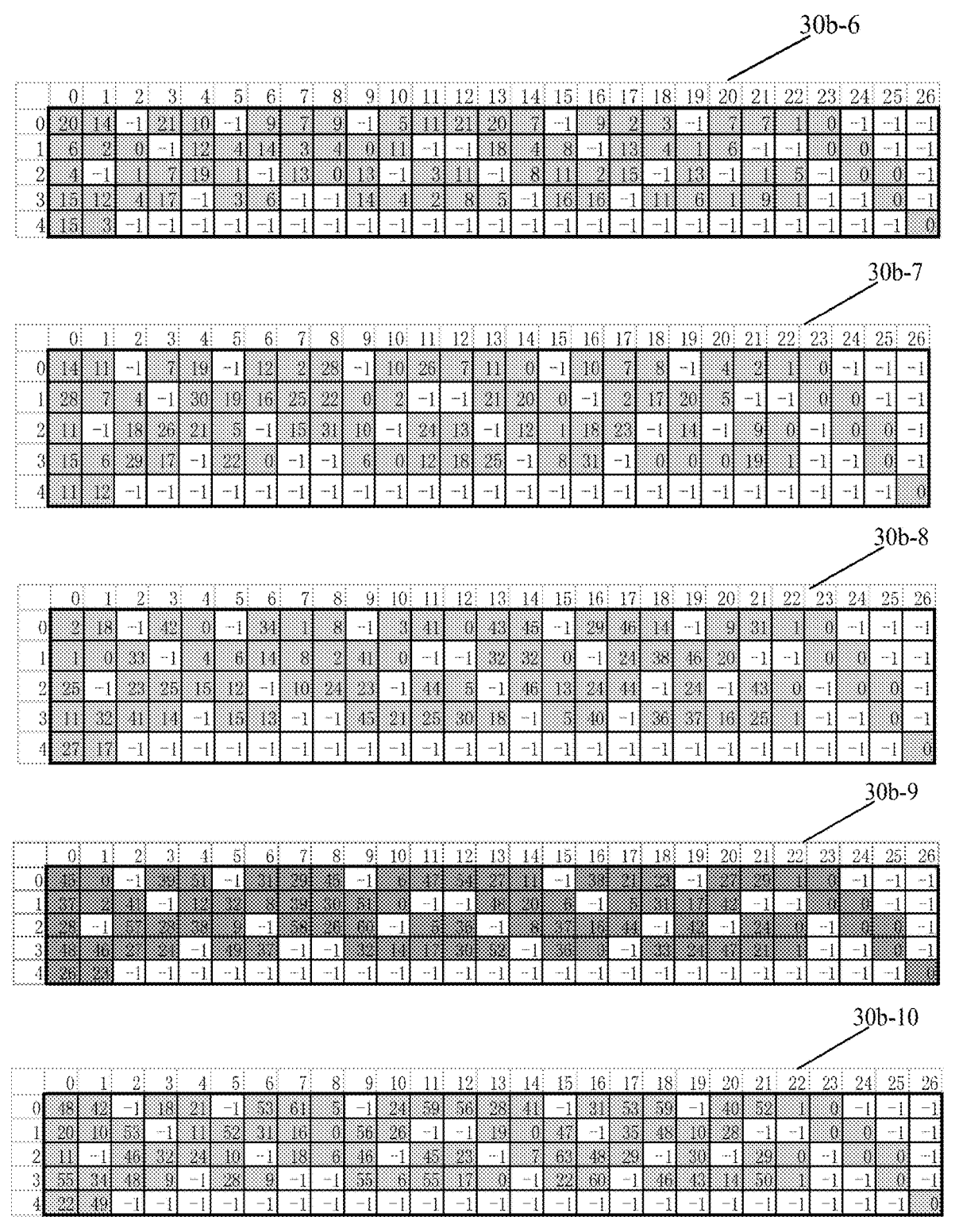

FIG. 3a is a schematic diagram of a base graph of an LDPC code according to an embodiment of the present application;

FIG. 3b-1 and FIG. 3b-2 show schematic diagrams of base matrices of an LDPC code according to an embodiment of the present application;

Figure 11A:
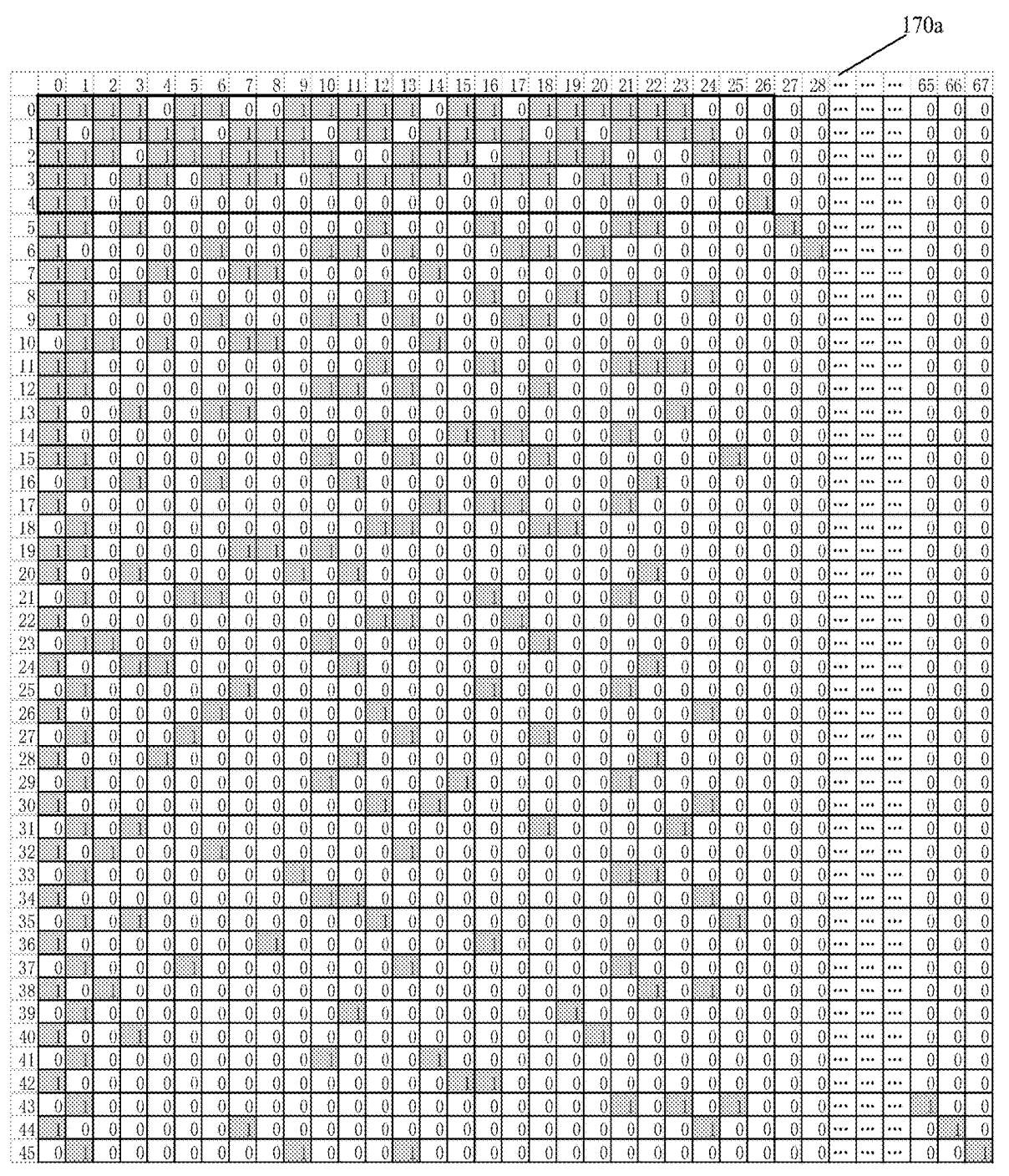
Figure 11B:
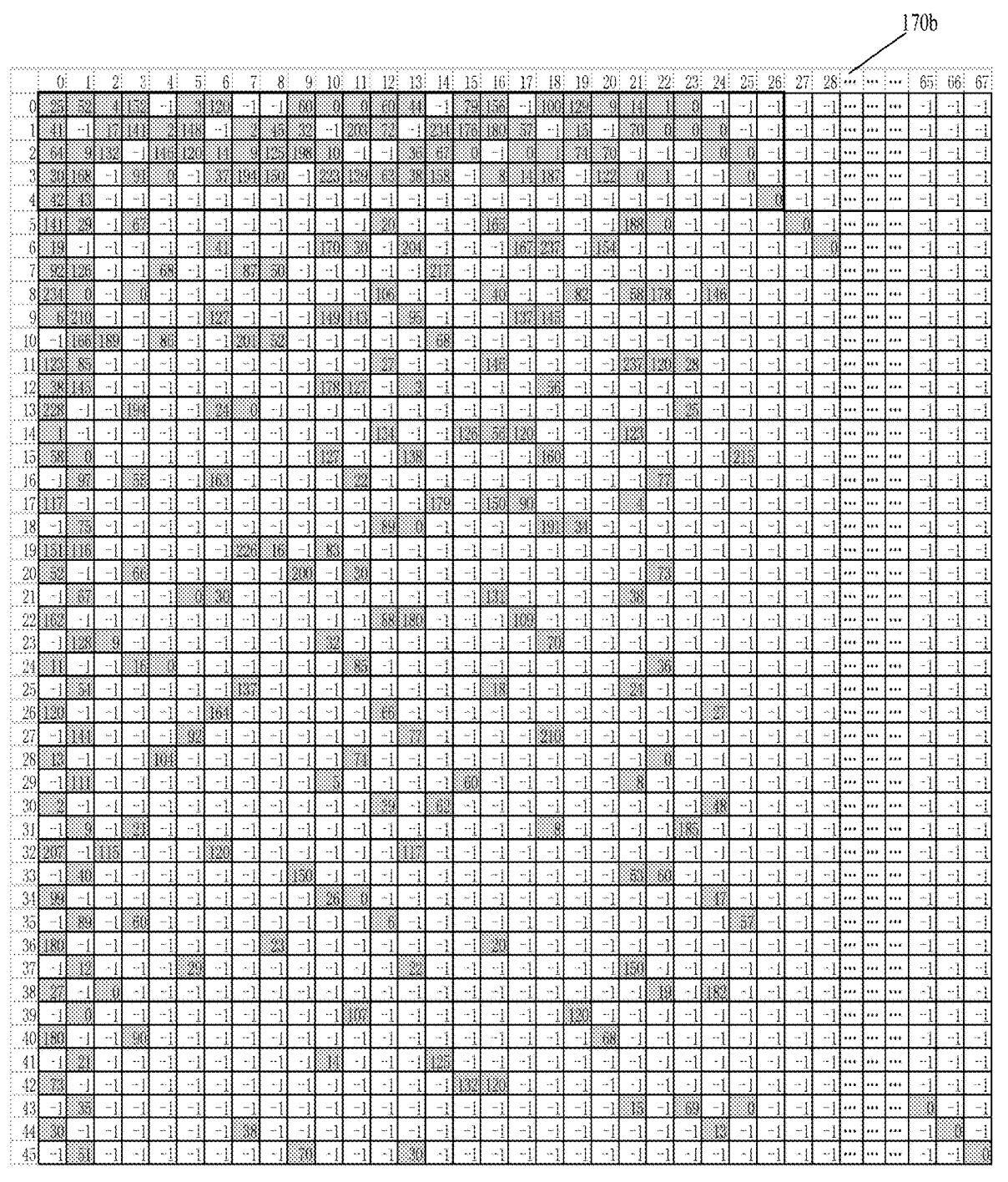

FIG. 3c-1 to FIG. 3c-11 show schematic diagrams of base matrices of LDPC code according to another embodiment of the present application;

FIG. 4 is a schematic performance diagram provided by an embodiment of the present application;

FIG. 5 is a schematic performance diagram provided by another embodiment of the present application;

FIG. 6 is a block diagram of an information processing apparatus according to an embodiment of the present application;

FIG. 7 is a block diagram of a communications system according to an embodiment of the present application;

FIG. 8b-1 and FIG. 8b-2 show schematic diagrams of base matrices of an LDPC code according to yet another embodiment of the present application;

FIG. 8c-1 to FIG. 8c-10 show schematic diagrams of base matrices of LDPC code according to still another embodiment of the present application;

FIG. 9 is a schematic performance diagram of an LDPC code according to an embodiment of the present application;

FIG. 10 is a schematic performance diagram of an LDPC code according to another embodiment of the present application;

FIG. 11a is a schematic diagram of a base graph of an LDPC code according to yet another embodiment of the present application;

FIG. 11b is a schematic diagram of a base matrix based on the base graph of the LDPC code provided in FIG. 11a; and FIG. 12 is a schematic diagram of a base graph according to still another embodiment of the present application.

DETAILED DESCRIPTION OF EMBODIMENTS

Figure 2:
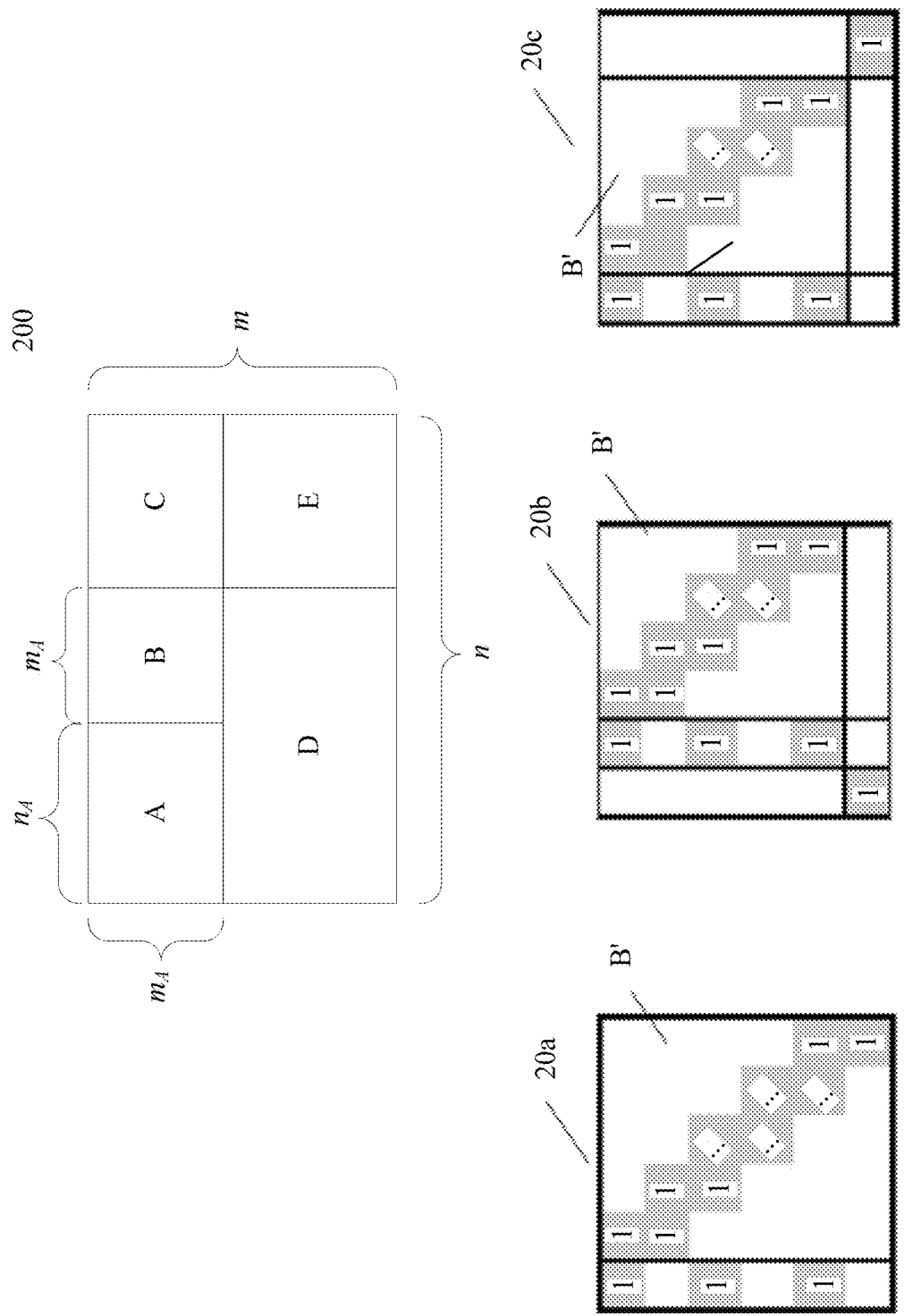
FIG. 2 is a schematic structural diagram of a base graph of an LDPC code.

For ease of understanding, some terms used in this application are described below.

In this application, terms "network" and "system" are often interchangeably used, and "apparatus" and "device" are also often interchangeably used. A "communication apparatus" may refer to a chip (such as a baseband chip, a digital signal processing chip, or a general-purpose chip), a terminal, a base station, or any other networking device.

A terminal is a device having a communication function. It may be a handheld device, an in-vehicle device, a wearable device, a computing device, or any other processing device that is connected to a wireless modem and having wireless communication functions. The terminal may be called by different names in different networks, such as user equipment, mobile station, subscriber unit, station, cellular phone, personal digital assistant, wireless modem, wireless communications device, handheld device, laptop computer, cordless phone, and wireless local loop station. For ease of description, these devices are simply referred to as a "terminal" in this application.

A base station (BS) may also be referred to as a base station device, and is a device deployed in a radio access network to provide wireless communication functions. The base station may be called by different names in different wireless access systems. For example, a base station in a Universal Mobile Telecommunications System (UMTS) network is referred to as a NodeB, a base station in an LTE network is referred to as an evolved NodeB (eNB or eNodeB), a base station in a new radio (NR) network is referred to as a transmission reception point (TRP) or a next generation NodeB (gNB). Base stations in other networks may be called by other names. This is not limited in the present application.

The following describes the technical solutions in the embodiments of the present application with reference to the accompanying drawings.

An LDPC code can be represented by a parity-check matrix H. The parity-check matrix H code can be obtained by using a base graph and a shift value. The base graph is a matrix of m rows and n columns and includes m*n matrix elements (also called entries). Symbol * means multiply hereinafter. Value of each matrix element is either 0 or 1. An element whose value is 0 is referred to as a zero-element, which may be replaced by an all-zero matrix of Z rows and Z columns. An element whose value is 1 is referred to as a non-zero-element, which may be replaced by a circular permutation matrix of Z rows and Z columns. In both cases, Z is a positive integer. In other words, each element of the base graph represents one all-zero matrix or one circular permutation matrix. FIG. 1 shows an example 10a of a base graph of an LDPC code with QC structure, in which elements are either 0 or 1, where m=4, and n=20.

It should be noted that, in this application, row indexes and column indexes of base graphs and base matrices are numbered starting from 0, and this is merely for ease of description. For example, column 0 indicates a first column in a base graph or a base matrix, and column 1 indicates a second column in the base graph or the base matrix, row 0 indicates a first row in the base graph or the base matrix, row 1 indicates a second row in the base graph or the base matrix, and so on.

It is understood that row indexes and column indexes may alternatively be numbered from 1, or any number.

If a value of an element in row i and column j (i and j are respectively row and column indexes as defined above, i.e. starting from 0) in the base graph is 1 (i.e. it is a non-zero-element), it is assigned a shift value $P_{i,j}$. $P_{i,j}$ is an integer greater than or equal to 0. In constructing a parity-check matrix H of the LDPC code, the non-zero-element in the row i and the column j of the base graph is replaced by a Z*Z circular permutation matrix corresponding to $P_{i,j}$. The circular permutation matrix corresponding to $P_{i,j}$ equals to a matrix obtained by performing a right cyclic shift for $P_{i,j}$ times on a Z*Z identity matrix. Each element in the base graph whose value is 0 (i.e. it is a zero-element) is replaced by a Z*Z all-zero matrix. Shift values $P_{i,j}$ may be indicated in the base graph as shown in 10b of FIG. 1. A non-zeroelement in the base graph 10a corresponds to a shift value in 10b at the same column and same row.

Z is a lifting factor, or sometimes be referred to as a lifting size. Z may be determined based on code block sizes that are supported by a system and size of information data. It can be seen that for a base graph of m rows*n columns, the parity-check matrix H has a size of (m*Z)*(n*Z). For example, if the lifting factor Z is 4, each zero-element in the base graph 10a is replaced by one 4*4 all-zero matrix 11a. If $P_{2,3}$ is 2, a non-zero-element in row 2 and column 3 in the base graph is replaced by a 4*4 circular permutation matrix 11d, and the matrix 11d is obtained by performing a right cyclic shift on a 4*4 identity matrix 11b twice. If $P_{2,4}$ is 0, a non-zero-element in row 2 and column 4 is replaced by the identity matrix 11b. It should be noted that only examples are described herein, and the examples do not constitute a limitation.

Value of $P_{i,j}$ may depend on the lifting factor Z. For a non-zero element of the base graph at row i, column j, $P_{i,j}$ may be different for different lifting factors Z. For ease of implementation, an m*n base matrix may be defined. Elements in the base matrix are in a one-to-one correspondence with elements in the base graph. A zero-element in the base graph has a same position in the base matrix, and the element is indicated by a value −1. A non-zero-element in row i and column j, whose value is 1 in the base graph, has a same position in the base matrix. The non-zero element is indicated by a shift value $P_{i,j}$. $P_{i,j}$ is a positive integer greater than or equal to 0. In the embodiments of the application, sometimes the base matrix is also referred to as a shift matrix of the base graph.

FIG. 1 shows a base matrix 10b corresponding to the base graph 10a.

Normally, the base graph or the base matrix of the LDPC code may further include p columns of built-in puncture bits, where p may be 1 or 2. These columns may be used in encoding, but system bits corresponding to the encoding using these columns are not sent. A code rate of the base matrix of the LDPC code meets R=(n−m)/(n−p). If a base matrix of four rows and 20 columns (4*20), includes two columns of built-in puncture bits, a code rate is (20−4)/(20−2)=8/9.

An LDPC code used in a wireless communication system is a QC-LDPC code, and parity bits part in a base graph of the QC-LDPC code has a bi-diagonal structure or a raptor-like structure, so that encoding can be simplified and incremental redundancy hybrid repeat can be supported. In a decoder for the QC-LDPC code, a QC-LDPC shift network (QSN), a Banyan network, or a Benes network is usually used to implement a cyclic shift of information.

A base graph of the QC-LDPC code with the raptor-like structure is a matrix of m rows and n columns, and the base graph may include five submatrices: A, B, C, D, and E. A weight of the matrix is determined by a quantity of non-zero-elements in the matrix. A row weight of a row is a quantity of non-zero-elements in the row, and a column weight of a column is a quantity of non-zero-elements in the column.

As shown in FIG. 2, submatrix A is a matrix of $m_A$ rows and $n_A$ columns, and the submatrix A has a size of $m_A*n_A$. Each column corresponds to Z system bits in the LDPC code, and a system bit is sometimes referred to as an information bit.

Submatrix B is a square matrix of $m_A$ rows and $m_A$ columns, and the submatrix B has a size of $m_A*m_A$. Each column corresponds to Z parity bits in the LDPC code. As shown in 20a of FIG. 2, the submatrix B includes a submatrix B' with a bi-diagonal structure, and a matrix column whose weight is 3 (weight-3 column for short), and the weight-3 column is located at the left side of the submatrix B'. As shown in 20b or 20c of FIG. 2, the submatrix B may further include a matrix column whose weight is 1 (weight-1 matrix column for short), the weight-1 matrix column may be located in a first or last column in the submatrix B. A non-zero-element in the weight-1 matrix column is in a last row in the submatrix B, so that a weight of the last row in the submatrix B is 1.

Generally, a matrix generated based on the submatrix A and the submatrix B is a core matrix, which may be used to support high code-rate encoding.

Continuing in FIG. 2, Submatrix C is an all-zero matrix, and the submatrix C has a size of $m_A*(n-(m_A-n_A))$. Submatrix E is an identity matrix, and the submatrix E has a size of $(m-m_A)*(m-m_A)$. Submatrix D has a size of $(m-m_A)*(n_A+m_A)$, and the submatrix D may be used to generate low bit-rate parity bits.

It may be understood that, the base graph is expressed mathematically, and because submatrix C is an all-zero matrix, and submatrix E is an identity matrix, in a possible implementation, a matrix including the submatrix A and the submatrix B, or a matrix including the submatrix A, the submatrix B, and the submatrix D may be used to represent a base graph of a matrix in encoding or decoding.

Because structures of the submatrix B, the submatrix C, and the submatrix E are relatively fixed, structures of the submatrix A and the submatrix D are determining factors affecting encoding and decoding performance of the LDPC code.

When an LDPC matrix with the raptor-like structure is used for encoding, in a possible implementation, the part of the matrix including the submatrix A and the submatrix B, namely the core matrix, may be first encoded to obtain one or more parity bits corresponding to the submatrix B. Then, the entire matrix is encoded to obtain one or more parity bits corresponding to the submatrix E. Because the submatrix B may include the submatrix B' with the bi-diagonal structure and the weight-1 matrix column, during the encoding, one or more parity bits corresponding to the bi-diagonal structure may be first obtained, and then one or more parity bits corresponding to the weight-1 matrix column may be obtained.

The following provides an example of encoding method. Assuming that the core matrix including the submatrix A and the submatrix B is $H_{core}$, a weight-1 matrix column and a row in which a non-zero-element in the column is located are removed from the $H_{core}$ to obtain a matrix $H_{core\text{-}dual}$. One or more parity bits in the $H_{core\text{-}dual}$ is represented by He= $[H_{e1}\ H_{e2}]$, $H_{e1}$ is a weight-3 matrix column, and $H_{e2}$ has a bi-diagonal structure. According to a defined LDPC code matrix, $H_{core\text{-}dual}\cdot[S\ P_e]^T=0$, where S is an input sequence and is a vector including information bits, $P_e$ is a vector including parity bits, and $[S\ P_e]^T$ indicates a transposed matrix including the input sequence S and $P_e$. Therefore, the parity bit corresponding to $H_{core\text{-}dual}$ may be first calculated based on the input sequence S and $H_{core\text{-}dual}$, where the input sequence S includes all information bits. Then, one or more parity bits corresponding to the weight-1 matrix column in the submatrix B is calculated based on the obtained parity bit corresponding to $H_{core\text{-}dual}$ and the input sequence S. In this case, all parity bits corresponding to the submatrix B may be obtained. After that, one or more parity bits corresponding to the submatrix E is obtained by encoding using the submatrix D and based on the input sequence S and the parity bits corresponding to the submatrix B, to obtain all information bits and all parity bits. These bits form a sequence obtained by encoding, namely, an LDPC code sequence.

Optionally, LDPC encoding may further include a shortening operation and a puncturing operation. The shortened bits and the punctured bits are not sent.

The shortening is usually performed starting from a last information bit, and may be performed in different manners. For example, if a quantity of shortened bits is $s_0$, the last $s_0$ bits in the input sequence S may be set to known bits, such as set to 0 or null or another value, to obtain an input sequence S', and then the input sequence S' is encoded by using an LDPC matrix. For another example, the last ($s_0$ mod Z) bits in the input sequence S may be set to known bits, such as set to 0 or null or another value, to obtain an input sequence S', and the last $$\left\lfloor \frac{s_0}{Z} \right\rfloor$$

columns in the submatrix A are deleted to obtain an LDPC matrix H', and the input sequence S' is encoded by using the LDPC matrix H', or the last $$\left\lfloor \frac{s_0}{Z} \right\rfloor$$

columns in the submatrix A do not participate in encoding of the input sequence S'. After the encoding, the shortened bits are not sent.

The puncturing may be performed on one or more built-in puncture bits, or, one or more parity bits in an input sequence. Usually puncturing one or more parity bits is also from the last one bit in parity bits. Alternatively, puncturing may be performed based on a preset puncturing pattern in the system. In a possible implementation, an input sequence is first encoded, and then based on a quantity p of bits that need to be punctured, the last p bit(s) in parity bits are selected or p bit(s) are selected based on the preset puncturing pattern in the system, where the p bit(s) are not sent. In another possible implementation, p column(s) in a matrix that correspond to punctured bits and p row(s) in which non-zero-elements in these columns are located may also be determined, and the rows and the columns are not used in encoding, and therefore, no corresponding parity bits are generated.

It should be noted that the encoding implementation described herein is merely used as an example. Other known encoding implementations may be used based on the base graph and/or the base matrix provided in this application, and the encoding implementations are not limited in this application. Decoding in this application may be performed in a plurality of decoding methods, for example, a min-sum (MS) decoding method or a belief propagation decoding method. The MS decoding method is sometimes referred to as a flood MS decoding method. For example, an input sequence is initialized and one or more iterations are performed. Hard decision detection is performed after the iteration(s), and a hard decision result is checked. If the decoding result meets a check equation, decoding succeeds, an iteration ends, and a decision result is output. If a decoding result does not meet a check equation, an iteration is performed again within a maximum quantity of iteration times, and if check still fails when the maximum quantity of iteration times is reached, decoding fails. The principle of the MS decoding is known, and details are not described herein.

It should be noted that the decoding method is merely used as an example herein, other decoding methods may be used based on the base graph and/or the base matrix provided in this application, and the decoding method is not limited in this application.

An LDPC code may be obtained based on a base graph and a base matrix, a performance upper limit of the LDPC code may be determined by performing density evolution on the base graph or the base matrix. An error floor of the LDPC code is determined based on a shift value in the base matrix. Improving encoding and decoding performance and lowering the error floor are some of objectives of designing the base graph and the base matrix. In wireless communication systems, code lengths are widely varied. A code block may have a short block length such as 40 bits or 1280 bits, or a code block may have a long block length such as 5000 bits or 8448 bits. FIG. 3a, FIGS. 3b-1 and 3b-2, and FIGS. 3c-1 to 3c-11 are examples of a base graph and base matrices of an LDPC code, and these examples can meet a performance requirement of a code block having a block length of up to 8448 bits.

Additionally, FIG. 8a, FIGS. 8b-1 and 8b-2, and FIGS. 8c-1 to 8c-10 provide examples of a base graph and base matrices of another LDPC code. FIG. 11a and FIG. 11b provide examples of a base graph and a base matrix of yet another LDPC code.

Figure 4:
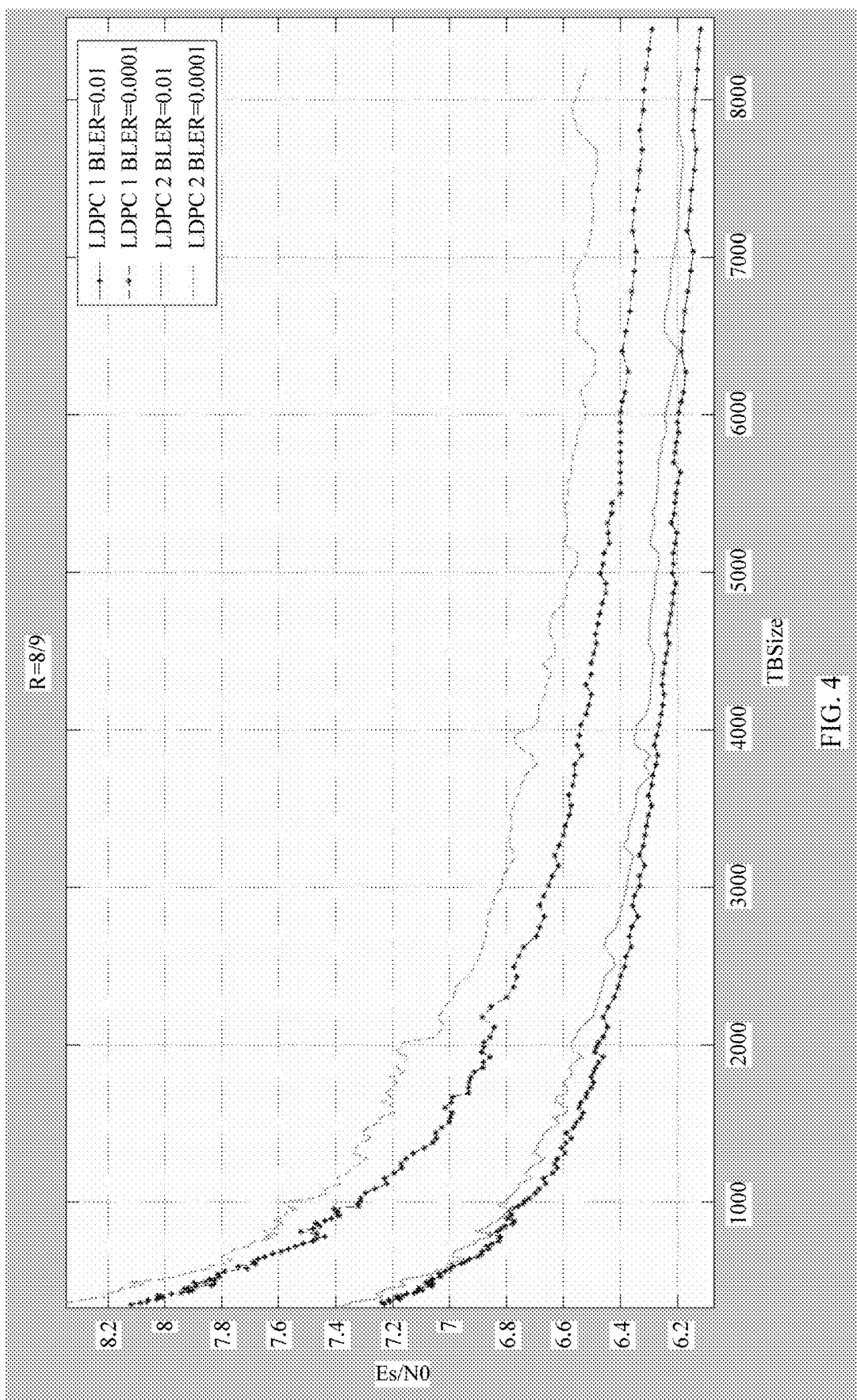
Figure 5:
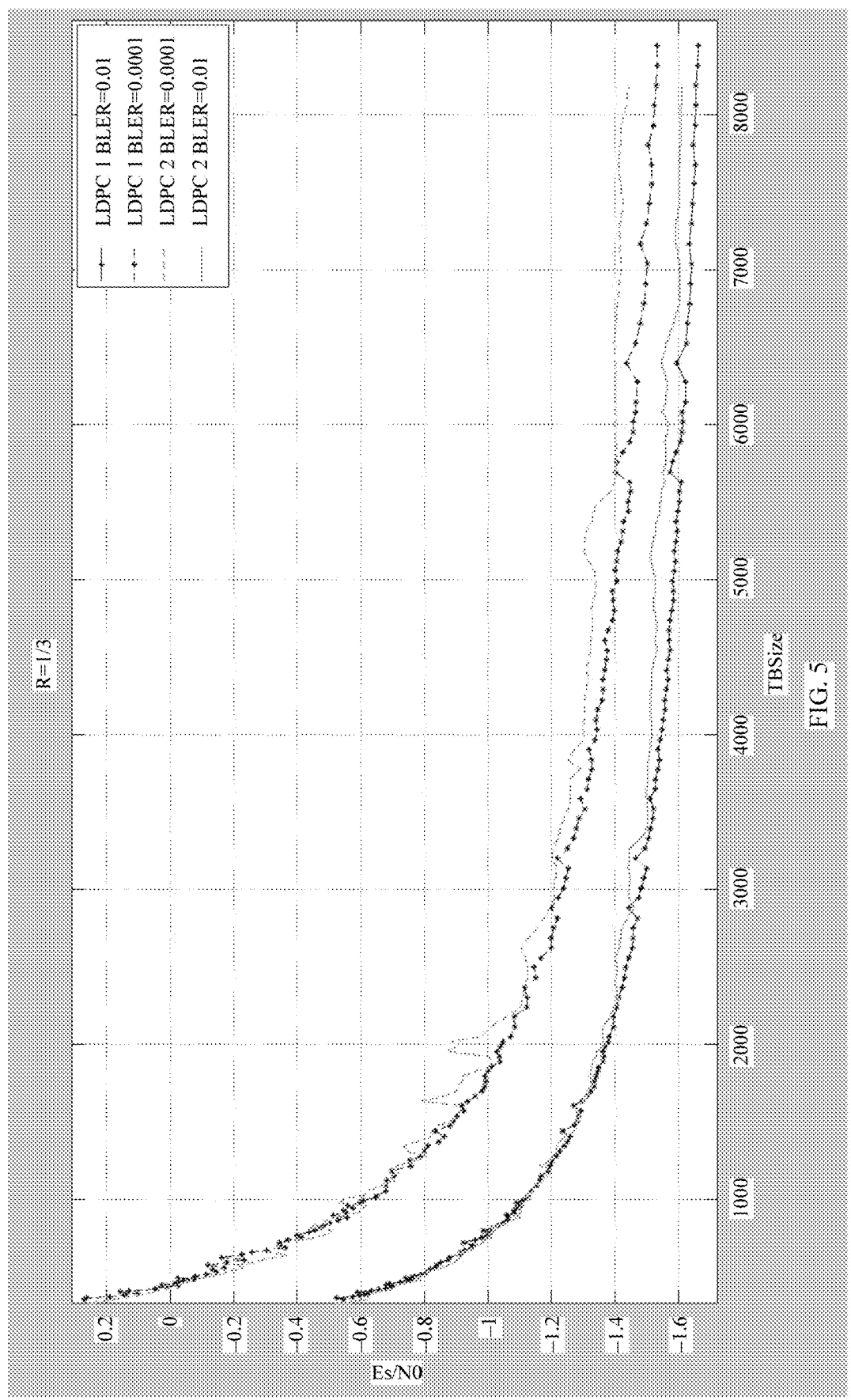

For ease of description and understanding, row indexes and column indexes are respectively shown on the uppermost side and the leftmost side in FIG. 3a, FIGS. 3b-1 and 3b-2, FIGS. 3c-1 to 3c-11, FIG. 8a, FIGS. 8b-1 and 8b-2, FIGS. 8c-1 to 8c-10, FIG. 11a and FIG. 11b. For example, FIG. 3a shows a base graph 30a of an LDPC code. The base graph has 46 rows and 68 columns. In the figure, 0 to 67 in the uppermost row indicate column indexes, and 0 to 45 in the leftmost column indicate row indexes. Shown in FIG. 4 and FIG. 5 are performance diagrams of the LDPC code shown in FIG. 3a, FIGS. 3b-1 and 3b-2, and FIGS. 3c-1 to 3c-11 at two different code rates.

In the base graph 30a, submatrix A corresponds to system bits, has five rows and 22 columns, and includes elements in row 0 to row 4 and column 0 to column 21. Submatrix B corresponds to parity bits, has five rows and five columns, and includes elements in the row 0 to the row 4 and column 22 to column 26.

The submatrix A and the submatrix B form a core matrix in the base graph 30a of the LDPC code, and to be specific, form a matrix of five rows and 27 columns, and may be used for high bit-rate encoding. For example, in the core matrix including the submatrix A and the submatrix B, one column has a weight of 5, one column has a weight of 4, 21 columns have a weight of 3, three columns have a weight of 2, and one column has a weight of 1.

The submatrix A may include two columns of built-in puncture bits, and after puncturing, a code rate that can be supported by the core matrix is 22/(27−2)=0.88. In the submatrix A, one column has a weight of 5, one column has a weight of 4, and other 20 columns have a weight of 3. For example, weights of the two columns of built-in puncture bits may be respectively 5 and 4.

Both a weight of a last row (row 4) and a weight of a last column (column 4 in the submatrix B, that is, column 26 in the core matrix) in the submatrix B are 1. The submatrix B includes one weight-3 column, and to be specific, a weight of column 0 in the submatrix B (column 22 in the core matrix) is 3. Column 1 to column 3 in the submatrix B (column 23 to column 25 in the core matrix) and row 0 to row 3 in the submatrix B form a bi-diagonal structure.

The core matrix in the base graph 30a includes four rows whose weights are 19 and one row whose weight is 3. Weights of the rows in the core matrix including the submatrix A and the submatrix B are 19, 19, 19, 19, and 3. It should be noted that the rows in the core matrix may be switched, for example, row 0 and row 2 are switched with each other, and row 1 and row 3 are switched with each other. The row whose weight is 3 may be row 4 in column 0 to column 26 in the core matrix in the base graph 30a, and the rows whose weights are 19 may be respectively row 0 to row 3 in column 0 to column 26 in the core matrix in the base graph 30a. These rows may be switched with each other, and the columns may also be switched with each other. For example, column 8 and column 25 in the core matrix may be switched with each other, and column 10 and column 26 may be switched with each other. For example, row 3 and row 0 in the core matrix may be switched with each other, and row 2 and row 1 may be switched with each other. To maintain the bi-diagonal structure in the submatrix B, on this basis, column 23 and column 25 may be switched with each other to obtain a core matrix in a base graph 80a shown in FIG. 8a, that is, a matrix including row 0 to row 5 and column 0 to column 26 in 80a. It should be noted that, only examples are provided herein. In an actual application, row permutation and column permutation may be flexibly designed based on a system requirement.

Table 1 shows an example of column permutation for the base graph 80a. For ease of description, a sequence, obtained by column permutation, of 27 columns in the core matrix is provided herein. Column indexes are column indexes of the matrix after the permutation, and are numbered from 0. Column indexes before the permutation are column indexes of the matrix before the permutation. As shown in Table 1, column 8 and column 10 in the matrix before the permutation are switched to column 25 and column 26, column 9 in the matrix before the permutation is switched to column 8, column 11 to column 21 in the matrix before the permutation are switched to column 9 to column 19, and column 25 and column 26 in the matrix before the permutation are switched to column 20 and column 21. In this manner, performance of a specific code rate and a specific code length may be improved.

Figure 9:
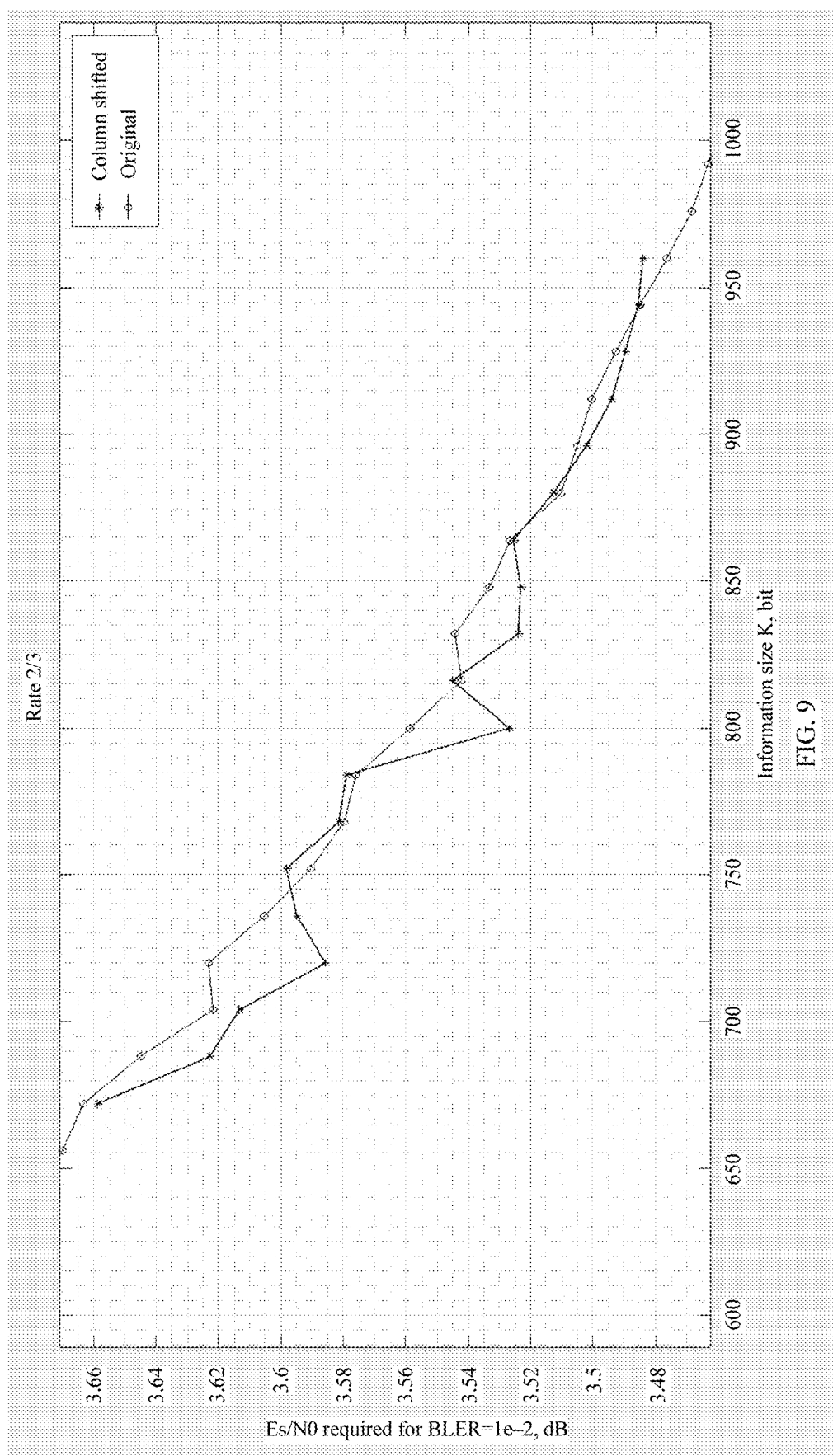

FIG. 9 is a performance diagram based on the base matrix shown in Table 1. Performance is improved in a case of a code rate of ⅔, a block error rate (BLER) of 1E-2, and a code length ranging from 672 to 960.

Figure 10:
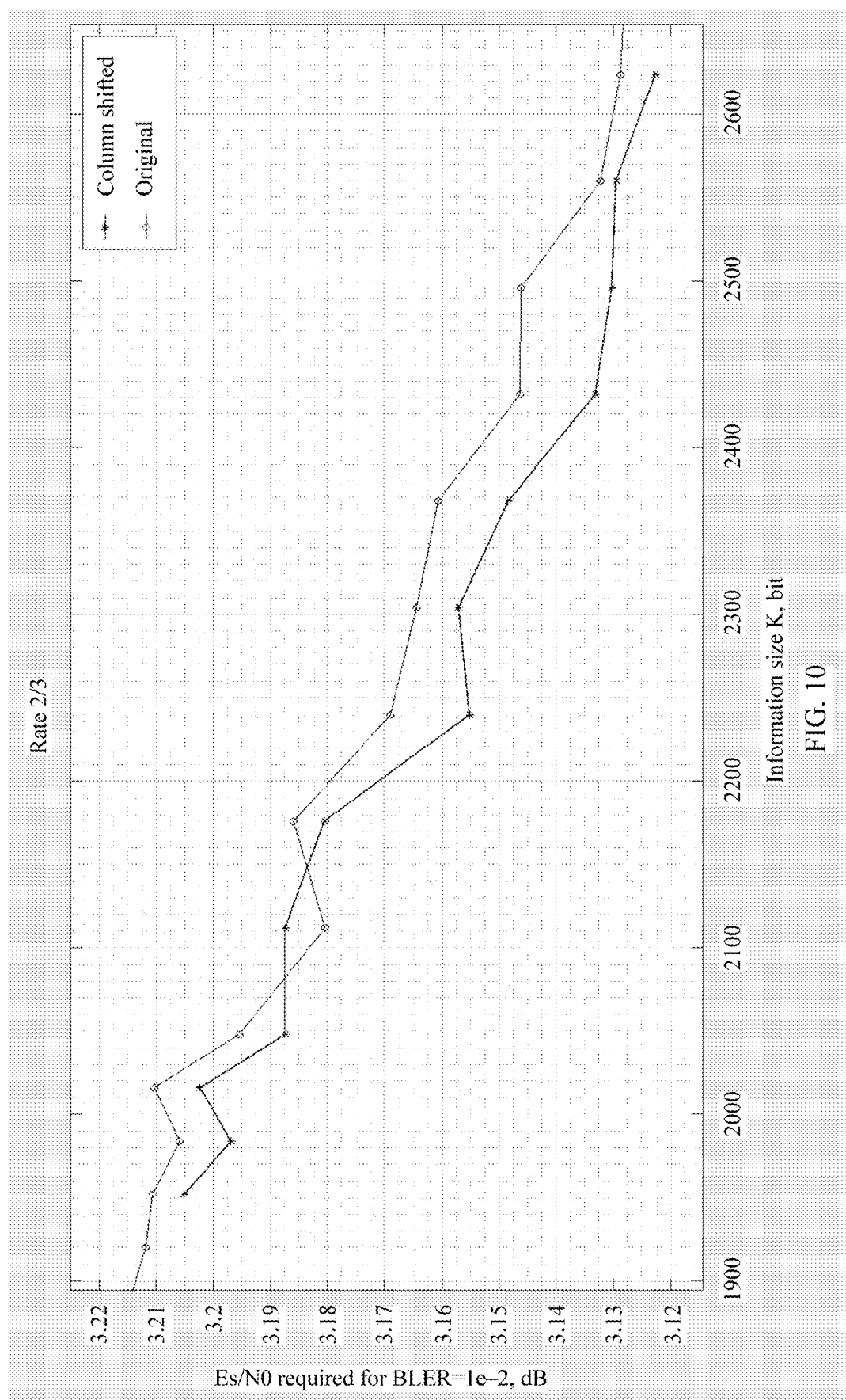

FIG. 10 is another performance diagram based on the base matrix shown in Table 1. Performance is improved in a case of a code rate of ⅔, a BLER of 1E-2, and a code length ranging from 1952 to 2624.

It may be understood that because in a matrix, rows may be switched with each other, columns may also be switched with each other, row permutation does not change weights of the columns in the matrix, column permutation does not change weights of the rows in the matrix, and a quantity of non-zero-elements in the matrix is unchanged. The weights of the rows in the base graph 80a after row permutation and column permutation are unchanged. Performance is not affected for a base graph obtained by performing row permutation, or column permutation, or row permutation and column permutation.

It should be noted that in this application, that performance is not affected means that impact is acceptable and falls within a tolerable range as a whole. For example, performance is little affected as a whole because performance deteriorates in an allowable range in some scenarios or in some ranges, but performance is improved in some scenarios or in some ranges.

The core matrix in the base graph 30a and that in the base graph 80a are used as examples. After row permutation is performed on the base graph 30a, the core matrix in the base graph 80a still includes the columns in the core matrix in the base graph 30a, one row has a weight of 3, and other four rows have a weight of 19, except that the order of the rows changes. If column permutation is performed on the base graph 30a, for example, column 5 and column 7 are switched with each other, it can be found that a core matrix that is of the base graph 30a and that is obtained by performing the column permutation still includes the columns in the core matrix in the base graph 30a. One column has a weight of 5, one column has a weight of 4, 21 columns have a weight of 3, three columns have a weight of 2, and one column has a weight of 1, except that the order of the columns changes. It should be noted that provided herein are only examples, and the examples do not constitute a limitation.

For a given base graph or a given base matrix of an LDPC code, impact of a few changes to matrix elements on performance is usually acceptable. For example, in an implementation, a few changes may be made based on the core matrix in the base graph 30a. For example, one row has a weight of greater than or equal to 1 and less than or equal to 5, and other four rows have weights greater than or equal to 17 and less than or equal to 21, respectively. For example, one row has a weight of 2, and other four rows have a weight of 18; or one row has a weight of 4, and other four rows respectively have weights of 17, 18, 19, and 19. It may be understood that, weights of some rows may be increased or decreased by 1 or 2 with reference to the solutions provided in this application, and this is not limited in this application.

TABLE 1

| | Column index | | | | | | | | | | | | | |
|---|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| Column index before permutation | 0 | 1 | 2 | 3 | 4 | 5 | 6 | 7 | 9 | 11 | 12 | 13 | 14 | 15 |

| | Column index | | | | | | | | | | | | |
|---|---|---|---|---|---|---|---|---|---|---|---|---|---|
| | 14 | 15 | 16 | 17 | 18 | 19 | 20 | 21 | 22 | 23 | 24 | 25 | 26 |
| Column index before permutation | 16 | 17 | 18 | 19 | 20 | 21 | 25 | 26 | 22 | 23 | 24 | 8 | 10 |

The submatrix A may also include one row, in which elements other than elements in the columns of built-in puncture bits are zero-elements. Further, to minimize a weight of the row in the core matrix or the base graph matrix, the row is usually the same as a row whose weight is 1 in the submatrix B. For example, there are two columns of built-in puncture bits, and to be specific, column 0 and column 1 are columns of built-in puncture bits, as shown in the base graph 30a or 80a. In row 4, elements in column 0 and column 1 are non-zero-elements, elements in column 2 to column 25 are zero-elements, elements in column 26 are non-zero-elements, and a weight of row 4 is 3. Row 4 has a smallest weight in the core matrix, and even in the entire base graph matrix. Such setting can improve encoding and decoding performance.

To support different block lengths, the LDPC code needs different lifting factors Z. For example, the lifting factor Z may be one or more of the following values: 16, 18, 20, 22, 24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, or 384. To ensure LDPC code performance in cases of different block lengths, base matrices corresponding to different lifting factors Z may be used based on the different lifting factors Z. FIG. 3b-1 and FIG. 3b-2 show a plurality of base matrix examples of the core matrix in the base graph 30a. Base matrices are obtained based on the core matrix in the base graph 30a and the lifting factor Z. A non-zero-element in row i and column j in the base graph 30a has a shift value $P_{i,j}$ in row i and column j in the base matrix, and a zero-element in the base graph 30a is represented by −1 or null in the base matrix.

In a possible implementation, one of the following may be selected:

if the lifting factor Z is one of {16, 18, 20, 22, 24, 26, 28, 30}, a part that is in a base matrix of the base graph 30a and that corresponds to the submatrix A and the submatrix B may be shown in a base matrix 30b-1 in FIG. 3b-1; or if the lifting factor Z is one of {32, 36, 40, 44, 48, 52, 56, 60}, a part that is in a base matrix of the base graph 30a and that corresponds to the submatrix A and the submatrix B may be shown in a base matrix 30b-2 in FIG. 3b-1; or if the lifting factor Z is one of {60, 64, 72, 80, 88, 96, 104, 112, 120}, a part that is in a base matrix of the base graph 30a and that corresponds to the submatrix A and the submatrix B may be shown in a base matrix 30b-3 in FIG. 3b-1; or if the lifting factor Z is one of {128, 144, 160, 176, 192, 208, 224, 240}, a part that is in a base matrix of the base graph 30a and that corresponds to the submatrix A and the submatrix B may be shown in a base matrix 30b-4 in FIG. 3b-1; or if the lifting factor Z is one of {256, 288, 320, 352, 384}, a part that is in a base matrix of the base graph 30a and that corresponds to the submatrix A and the submatrix B may be shown in a base matrix 30b-5 in FIG. 3b-1.

In another possible implementation, a lifting factor set may be {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}, and one of the following may be selected:

if the lifting factor Z is one of {24, 26, 28, 30}, a part that is in a base matrix of the base graph 30a and that corresponds to the submatrix A and the submatrix B may be a base matrix 30b-6 shown in FIG. 3b-2; or if the lifting factor Z is one of {32, 36, 40, 44}, a part that is in a base matrix of the base graph 30a and that corresponds to the submatrix A and the submatrix B may be a base matrix 30b-7 shown in FIG. 3b-2; or if the lifting factor Z is one of {48, 52, 56, 60}, a part that is in a base matrix of the base graph 30a and that corresponds to the submatrix A and the submatrix B may be a base matrix 30b-8 shown in FIG. 3b-2; or if the lifting factor Z is one of {60, 64, 72, 80, 88, 96, 104, 112, 120}, a part that is in a base matrix of the base graph 30a and that corresponds to the submatrix A and the submatrix B may be a base matrix 30b-3 shown in FIG. 3b-1; or if the lifting factor Z is one of {128, 144, 160, 176, 192, 208, 224, 240}, a part that is in a base matrix of the base graph 30a and that corresponds to the submatrix A and the submatrix B may be a base matrix shown in 30b-4 in FIG. 3b-1; or if the lifting factor Z is one of {256, 288, 320, 352, 384}, a part that is in a base matrix of the base graph 30a and that corresponds to the submatrix A and the submatrix B may be a base matrix 30b-5 shown in FIG. 3b-1.

Based on the foregoing implementations, in another possible implementation, to further improve performance, the base graph may correspond to more base matrices, and parts that are in the base matrices of the base graph 30a and that correspond to the submatrix A and the submatrix B may correspond to different base matrices. For example, if the lifting factor Z is one of {24, 26, 28, 30}, a part that is in the base matrix of the base graph 30a and that corresponds to the submatrix A and the submatrix B may be a base matrix 30b-6 shown in FIG. 3b-2; or if the lifting factor Z is one of {32, 36, 40, 44}, a part that is in the base matrix of the base graph 30a and that corresponds to the submatrix A and the submatrix B may be a base matrix 30b-7 shown in FIG. 3b-2; or if the lifting factor Z is one of {48, 52, 56, 60}, a part that is in the base matrix of the base graph 30a and that corresponds to the submatrix A and the submatrix B may be a base matrix 30b-8 shown in FIG. 3b-2; or if the lifting factor Z is one of {64, 72, 80, 88}, a part that is in the base matrix of the base graph 30a and that corresponds to the submatrix A and the submatrix B may be a base matrix 30b-9 or 30b-10 shown in FIG. 3b-2; or if the lifting factor Z is one of {96, 104, 112, 120}, a part that is in the base matrix of the base graph 30a and that corresponds to the submatrix A and the submatrix B may be a base matrix 30b-3 shown in FIG. 3b-1; or if the lifting factor Z is one of {128, 144, 160, 176, 192, 208, 224, 240}, a part that is in the base matrix of the base graph 30a and that corresponds to the submatrix A and the submatrix B may be a base matrix 30b-4 shown in FIG. 3b-1; or if the lifting factor Z is one of {256, 288, 320, 352, 384}, a part that is in the base matrix of the base graph 30a and that corresponds to the submatrix A and the submatrix B may be a base matrix 30b-5 shown in FIG. 3b-1.

FIG. 8b shows a plurality of base matrix examples of the core matrix in the base graph 80a. Base matrices are obtained based on the core matrix in the base graph 80a and the lifting factor Z. A non-zero-element in row i and column j in the base graph 80a is a shift value $P_{i,j}$ in row i and column j in the base matrix, and a zero-element in the base graph 80a is represented by −1 or null in a shift matrix.

In another possible implementation, a lifting factor set may be {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}, and one of the following may be selected:

if the lifting factor Z is one of {24, 26, 28, 30}, a part that is in a base matrix of the base graph 80a and that corresponds to the submatrix A and the submatrix B may be a base matrix 80b-1 shown in FIG. 8b-1; or if the lifting factor Z is one of {32, 36, 40, 44}, a part that is in a base matrix of the base graph 80a and that corresponds to the submatrix A and the submatrix B may be a base matrix 80*b*-2 shown in FIG. 8*b*-1; or if the lifting factor Z is one of {48, 52, 56, 60}, a part that is in a base matrix of the base graph 80*a* and that corresponds to the submatrix A and the submatrix B may be a base matrix 80*b*-3 shown in FIG. 8*b*-1; or if the lifting factor Z is one of {60, 64, 72, 80, 88, 96, 104, 112, 120}, a part that is in a base matrix of the base graph 80*a* and that corresponds to the submatrix A and the submatrix B may be a base matrix 80*b*-4 shown in FIG. 8*b*-1; or if the lifting factor Z is one of {128, 144, 160, 176, 192, 208, 224, 240}, a part that is in a base matrix of the base graph 80*a* and that corresponds to the submatrix A and the submatrix B may be a base matrix 80*b*-5 shown in FIG. 8*b*-1; or if the lifting factor Z is one of {256, 288, 320, 352, 384}, a part that is in a base matrix of the base graph 80*a* and that corresponds to the submatrix A and the submatrix B may be a base matrix 80*b*-6 shown in FIG. 8*b*-2.

Based on the foregoing implementation, in another possible implementation, to further improve performance, the base graph may correspond to more base matrices, and parts that are in the base matrices of the base graph 80*a* and that correspond to the submatrix A and the submatrix B may correspond to different base matrices. For example, if the lifting factor Z is one of {24, 26, 28, 30}, a part that is in the base matrix of the base graph 80*a* and that corresponds to the submatrix A and the submatrix B may be a base matrix 80*b*-1 shown in FIG. 8*b*-1; or if the lifting factor Z is one of {32, 36, 40, 44}, a part that is in the base matrix of the base graph 80*a* and that corresponds to the submatrix A and the submatrix B may be a base matrix 80*b*-2 shown in FIG. 8*b*-1; or if the lifting factor Z is one of {48, 52, 56, 60}, a part that is in the base matrix of the base graph 80*a* and that corresponds to the submatrix A and the submatrix B may be a base matrix 80*b*-3 shown in FIG. 8*b*-1; or if the lifting factor Z is one of {64, 72, 80, 88}, a part that is in the base matrix of the base graph 80*a* and that corresponds to the submatrix A and the submatrix B may be a base matrix 80*b*-7 or 80*b*-8 shown in FIG. 8*b*-2; or if the lifting factor Z is one of {96, 104, 112, 120}, a part that is in the base matrix of the base graph 80*a* and that corresponds to the submatrix A and the submatrix B may be a base matrix 80*b*-4 shown in FIG. 8*b*-1; or if the lifting factor Z is one of {128, 144, 160, 176, 192, 208, 224, 240}, a part that is in the base matrix of the base graph 80*a* and that corresponds to the submatrix A and the submatrix B may be a base matrix 80*b*-5 shown in FIG. 8*b*-1; or if the lifting factor Z is one of {256, 288, 320, 352, 384}, a part that is in the base matrix of the base graph 80*a* and that corresponds to the submatrix A and the submatrix B may be a base matrix 80*b*-6 shown in FIG. 8*b*-2.

In another possible implementation, a part that is in a base matrix of the base graph 80*a* and that corresponds to the submatrix A and the submatrix B may be a base matrix 80*b*-9 shown in FIG. 8*b*-2. Because lifting factors Z may be classified in a plurality of manners, a base matrix used for a group of lifting factors Z may be considered in terms of performance accordingly.

For example, a value of the lifting factor Z is determined based on a length K of the input sequence. For example, if the length of the input sequence is K, a minimum value that meets 22*Z≥K may be determined from a plurality of lifting factors defined in the system and may be used as the value of the lifting factor of the matrix. Further, a corresponding base matrix may be selected based on the determined lifting factor. Table 2 shows an example of a correspondence between a base matrix and a lifting factor. A plurality of lifting factors defined in the system are classified into eight groups, that is, eight sets, and set indexes are 1 to 8. Correspondingly, there are eight base matrices PCM1 to PCM 8 (PCM stands for parity-check matrix).

TABLE 2

| Base matrix index | Lifting factor Z | | | | | | | |
|---|---|---|---|---|---|---|---|---|
| PCM 1 | 2 | 4 | 8 | 16 | 32 | 64 | 128 | 256 |
| PCM 2 | 3 | 6 | 12 | 24 | 48 | 96 | 192 | 384 |
| PCM 3 | 5 | 10 | 20 | 40 | 80 | 160 | 320 | |
| PCM 4 | 7 | 14 | 28 | 56 | 112 | 224 | | |
| PCM 5 | 9 | 18 | 36 | 72 | 144 | 288 | | |
| PCM 6 | 11 | 22 | 44 | 88 | 176 | 352 | | |
| PCM 7 | 13 | 26 | 52 | 104 | 208 | | | |
| PCM 8 | 15 | 30 | 60 | 120 | 240 | | | |

For example, the base matrix 80*b*-9 may be used as PCM 8, and in this case, when the lifting factor Z is any one of 15, 30, 60, 120, or 240, 80*b*-9 may be used as a base matrix, and correspondingly, the base matrix is lifted by using the lifting factor Z to obtain an LDPC parity-check matrix. Further, when Z is greater than or equal to 24, the base matrix 80*b*-9 has relatively high performance.

Likewise, rows may be switched with each other, and columns may also be switched with each other in a base matrix. If at least one of row permutation or column permutation is performed on a base graph, same permutation is also performed on a corresponding base matrix.

It can be learned that, in the foregoing implementations, 80*b*-1 is a base matrix obtained by performing row permutation and column permutation on base matrix 30*b*-6. 80*b*-2 is a base matrix obtained by performing row permutation and column permutation on base matrix 30*b*-7. 80*b*-3 is a base matrix obtained by performing row permutation and column permutation on base matrix 30*b*-8. 80*b*-4 is a base matrix obtained by performing row permutation and column permutation on base matrix 30*b*-3. 80*b*-5 is a base matrix obtained by performing row permutation and column permutation on base matrix 30*b*-4. 80*b*-6 is a base matrix obtained by performing row permutation and column permutation on base matrix 30*b*-5. 80*b*-7 is a base matrix obtained by performing row permutation and column permutation on base matrix 30*b*-9. 80*b*-8 is a base matrix obtained by performing row permutation and column permutation on base matrix 30*b*-10.

Certainly, it may be understood that the part that is in the base matrix of the LDPC matrix and that corresponds to the submatrix A and the submatrix B may include rows or columns in any one of the base matrices 30*b*-1, 30*b*-2, 30*b*-3, 30*b*-4, 30*b*-5, 30*b*-6, 30*b*-7, 30*b*-8, 30*b*-9, or 30*b*-10. In other words, the matrix may be obtained by performing column permutation, or row permutation, or row permutation and column permutation on any one of the base matrices 30*b*-1, 30*b*-2, 30*b*-3, 30*b*-4, 30*b*-5, 30*b*-6, 30*b*-7, 30*b*-8, 30*b*-9, or 30*b*-10.

To obtain a flexible code rate, a submatrix C, a submatrix D, and a submatrix E of corresponding sizes may be added based on a core matrix, to obtain different code rates. Because the submatrix C is an all-zero matrix, and the submatrix E is an identity matrix, sizes of the submatrix C and the submatrix E are determined based on code rates, and structures of the submatrix C and the submatrix E are relatively fixed. Mainly the core matrix and the submatrix D affect encoding and decoding performance. Rows and columns are added based on the core matrix to form corresponding C, D, and E, so that different code rates can be obtained. For example, the core matrix in the base graph 30a or the core matrix in the base graph 80a may be used as the core matrix, and the corresponding submatrices C, D, and E are added to meet encoding or decoding requirements for different code rates.

A column count of the submatrix D is a sum of column counts of a submatrix A and a submatrix B, and a row count of the submatrix D is mainly related to a code rate. The base graph 30a is used as an example. A column count $m_D$ of the corresponding submatrix D is $(n_A+m_A)=27$ columns. If a code rate supported by an LDPC code is $R_m$, sizes of a base graph or a base matrix of the LDPC code are m*n, where $n=n_A/R_m+p$, and $m=n-n_A=n_A/R_m+p-n_A$. If the minimum code rate $R_m$ is ⅓, and a quantity p of columns of built-in puncture bits is 2, in the example of the base graph 30a, n=68, m=46, a row count $m_D$ of the submatrix D may be up to $m-m_A=46-5=41$, and $0 \leq m_D \leq 41$.

For ease of description, a matrix F of 41 rows and 27 columns may be defined. In this case, the submatrix D may include $m_D$ rows in the matrix F, and the submatrix D, the submatrix A, the submatrix B, and the submatrix C and the submatrix E of corresponding sizes form a base graph that is of an LDPC code whose code rate is $22/(25+m_D)$. In the base graph 30a, $m_D=41$, and the submatrix D has 41 rows and 27 columns correspondingly. To be specific, the submatrix D is the matrix F, and a corresponding code rate supported by the LDPC code is 22/66=⅓. It can be learned that a matrix including row 5 to row 45 and column 0 to column 26 in the base graph 30a is the matrix F.

Row weights of the matrix F shown in base graph 30a as an example are sequentially 7, 7, 9, 8, 7, 7, 8, 6, 6, 5, 6, 5, 5, 6, 5, 5, 5, 5, 4, 4, 4, 5, 4, 5, 4, 4, 4, 4, 3, 4, 4, 4, 4, 3, 3, 4, 4, 3, 3, 3, and 4.

Because the submatrix E is an identity matrix, weights of rows in the base graph 30a are 8, 8, 10, 9, 8, 8, 9, 7, 7, 6, 7, 6, 6, 7, 6, 6, 6, 6, 5, 5, 5, 6, 5, 6, 5, 5, 5, 5, 4, 5, 5, 5, 5, 4, 4, 5, 5, 4, 4, 4, and 5.

In the present application, if there is at most one non-zero-element in two adjacent rows in a same column in a base graph, the two rows are mutually orthogonal.

In a possible implementation, the matrix F may be a matrix with a quasi-orthogonal structure. In a matrix block including columns other than columns of built-in puncture bits in the matrix F, there is a maximum of only one non-zero-element in any two adjacent rows in a same column, that is, the matrix block including the columns other than the columns of built-in puncture bits in the matrix F has an orthogonal structure. In the example of the base graph 30a, the matrix F is a matrix including row 5 to row 45 and column 0 to column 26, and column 0 and column 1 are columns of built-in puncture bits. In a matrix block including row 5 to row 45 and column 2 to column 26, row 5 and row 6 are mutually orthogonal, row 6 and row 7 are mutually orthogonal, row 23 and row 24 are mutually orthogonal, row 32 and row 33 are mutually orthogonal, and so on. If $m_D=15$, the submatrix D in the base graph of the LDPC code has 15 rows and 27 columns. The submatrix D may be a matrix including row 0 to row 14 in the matrix F in the base graph 30a, that is, row 5 to row 19 in the base graph 30a, and column 0 to column 26. A corresponding code rate supported by the LDPC code is 22/40=0.55. At this code rate, the base graph of the LDPC code corresponds to a matrix including row 0 to row 19 and column 0 to column 41 in the base graph 30a. The submatrix E is an identity matrix of 15 rows and 15 columns, and the submatrix C is an all-zero matrix of 5 rows and 15 columns.

If $m_D=19$, the submatrix D in the base graph of the LDPC code has 19 rows and 27 columns. The submatrix D may be a matrix including row 0 to row 18 in the matrix F in the base graph 30a, that is, row 5 to row 23 in the base graph 30a, and column 0 to column 26. A corresponding code rate supported by the LDPC code is 22/44=½. At this code rate, the base graph of the LDPC code corresponds to a matrix including row 0 to row 23 and column 0 to column 41 in the base graph 30a. The submatrix E is an identity matrix of 19 rows and 19 columns, and the submatrix C is an all-zero matrix of five rows and 19 columns.

The same is true if $m_D$ is another value, and details are not described.

It should be noted that rows may be switched with each other, and columns may also be switched with each other in the base graph and the base matrix of the LDPC code. For example, row 17 and row 19 in the base graph 30a may be switched with each other, and column 39 and column 41 may be switched with each other, to obtain the base graph matrix 80a shown in FIG. 8a.

For another example, the submatrix D includes $m_D$ rows in the matrix F, row permutation may not be performed between the $m_D$ rows, or row permutation may be performed between one or more of the $m_D$ rows; and the submatrix E still has a diagonal structure, and no row permutation or column permutation is performed on the submatrix E.

For example, row 12 and row 14 in the matrix F are switched with each other, the submatrix D includes $m_D$ rows in the submatrix F, and the submatrix E still has a diagonal structure, to obtain the base graph 80a. The matrix F is a quasi-orthogonal matrix before the row permutation, and the matrix F is still a quasi-orthogonal matrix after the permutation.

For example, in the base graph 80a, the matrix F is a matrix including row 5 to row 45 and column 0 to column 26, and column 0 and column 1 are columns of built-in puncture bits. In a matrix block including row 5 to row 45 and column 2 to column 26, row 5 and row 6 are mutually orthogonal, row 29 and row 30 are mutually orthogonal, and so on. It may be understood that if the base graph or the base matrix includes the submatrix D, when columns in the core matrix are switched with each other, corresponding columns in the submatrix D also need to be switched with each other.

For example, if column 23 and column 25 in the core matrix are switched with each other, column 23 and column 25 in the submatrix D also need to be switched with each other correspondingly.

Only examples are provided herein, and the examples do not constitute a limitation.

Figure 12:
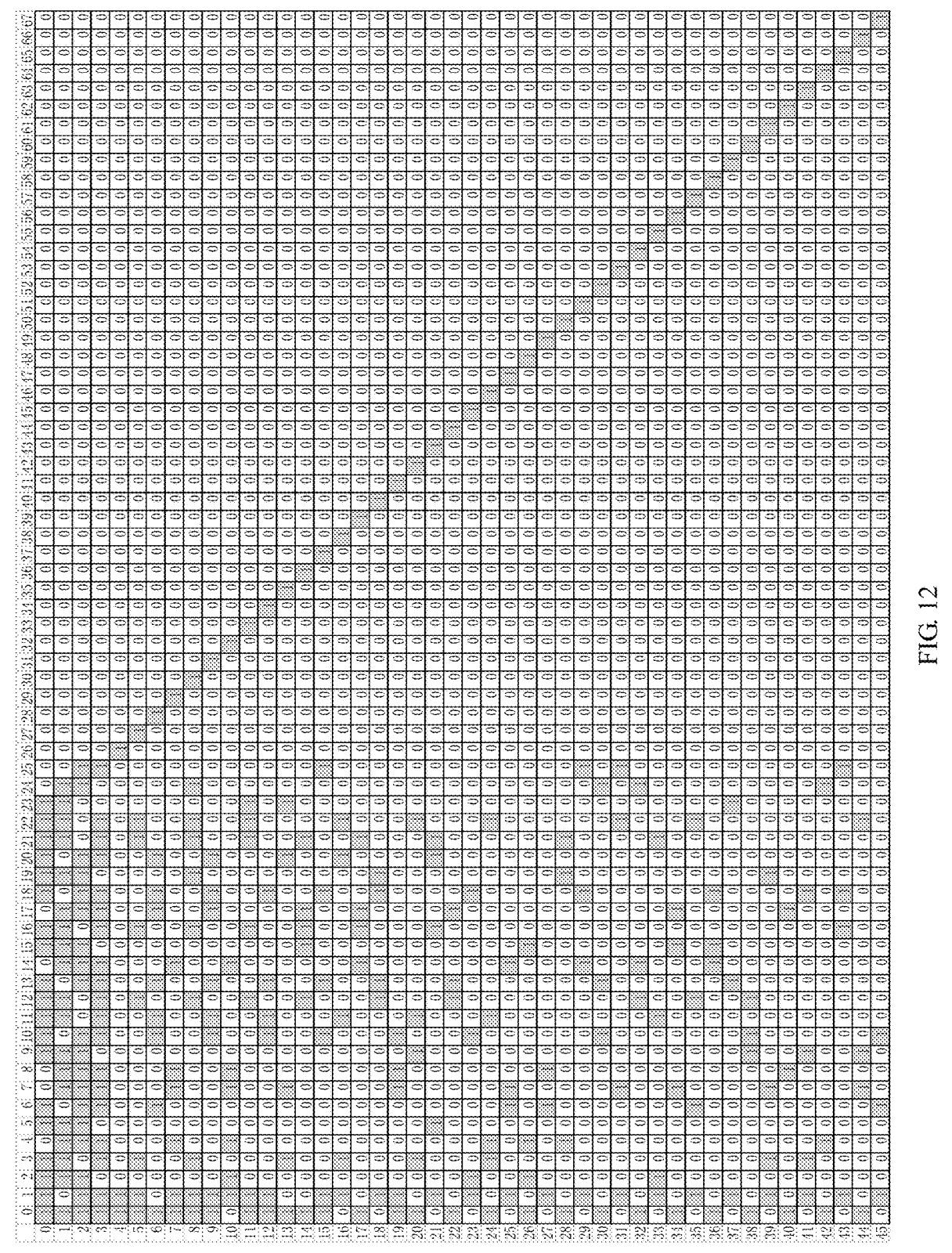

In the embodiments of the present application, the submatrix D has a quasi-orthogonal structure, and to be specific, two adjacent rows in each column other than columns of built-in puncture bits are orthogonal. For example, in submatrices D provided in the base graph 30a, the base graph 80a, a base graph 170a as shown in FIG. 11a, and the base graph as shown in FIG. 12 according to the embodiments of the present application, column 0 and column 1 are columns of built-in puncture bits, and two adjacent rows in each of other columns are orthogonal. It should be noted that the columns of built-in puncture bits may be other columns. This is not limited herein.

In another possible implementation, the matrix F with the quasi-orthogonal structure may also include at least two orthogonal rows, and there is a maximum of only one non-zero-element in each of column 0 to column 26 in two adjacent rows among the at least two orthogonal rows. For example, if $m_D$>30, a corresponding code rate supported by the LDPC code is less than ⅖, and a submatrix including the last 11 rows in the matrix F, that is, row 30 to row 40 in the matrix F, and column 0 to column 26 may be orthogonal. To be specific, in the matrix F, there is a maximum of only one non-zero-element in a column other than columns of built-in puncture bits in two adjacent rows among row 0 to row 29, and there is a maximum of only one non-zero-element in each of column 0 to column 26 in two adjacent rows among the row 30 to row 40.

For another example, a submatrix including row 26 to row 40 and column 0 to column 26 in the matrix F may be orthogonal. To be specific, in the matrix F, there is a maximum of only one non-zero-element in a column other than columns of built-in puncture bits in two adjacent rows among row 0 to row 25, and there is a maximum of only one non-zero-element in each of column 0 to column 26 in two adjacent rows among row 26 to row 40. In the base graph 170a shown in FIG. 11a, the matrix F is a matrix including row 5 to row 45 and column 0 to column 26 in the base graph, the matrix F has a quasi-orthogonal structure, row 26 to row 40 in the matrix F are orthogonal, and there is a maximum of only one non-zero-element in each column in two adjacent rows among row 26 to row 40.

A core matrix in the base graph 170a is the same as the core matrix in the base graph 80a. For the submatrix D at each code rate, changes may be made to one or two non-zero-elements or one or two zero-elements in each row without affecting performance of the submatrix D.

For another example, if $m_D$>20, a submatrix including the last 21 rows in the matrix F, that is, row 25 to row 45 in the matrix F, and column 0 to column 26 may be orthogonal. To be specific, in the matrix F, there is a maximum of only one non-zero-element in a column other than columns of built-in puncture bits in two adjacent rows among row 0 to row 19, and there is a maximum of only one non-zero-element in each of column 0 to column 26 in two adjacent rows among row 20 to row 40. A core matrix in the base graph 170a shown in FIG. 11a is the same as the core matrix in the base graph 80a. Row 5 to row 45 meet a quasi-orthogonal structure, or row 5 to row 25 meet a quasi-orthogonal structure, and row 25 to row 45 meet a quasi-orthogonal structure.

A core matrix in a base graph shown in FIG. 12 is the same as the core matrix in the base graph 80a, and row 5 to row 45 in the core matrix has a quasi-orthogonal structure.

Figure 3C-1:
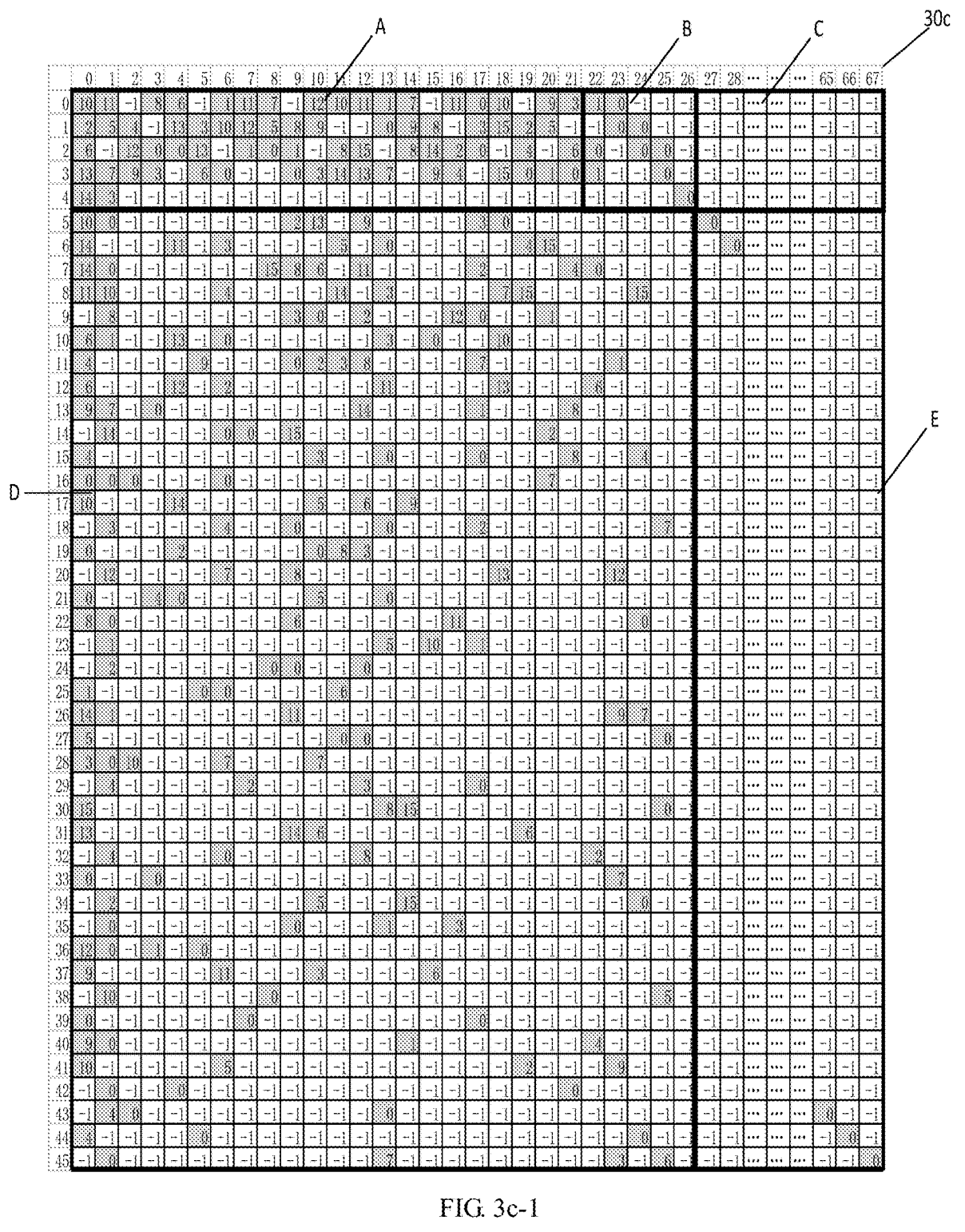
Figure 3C-2:
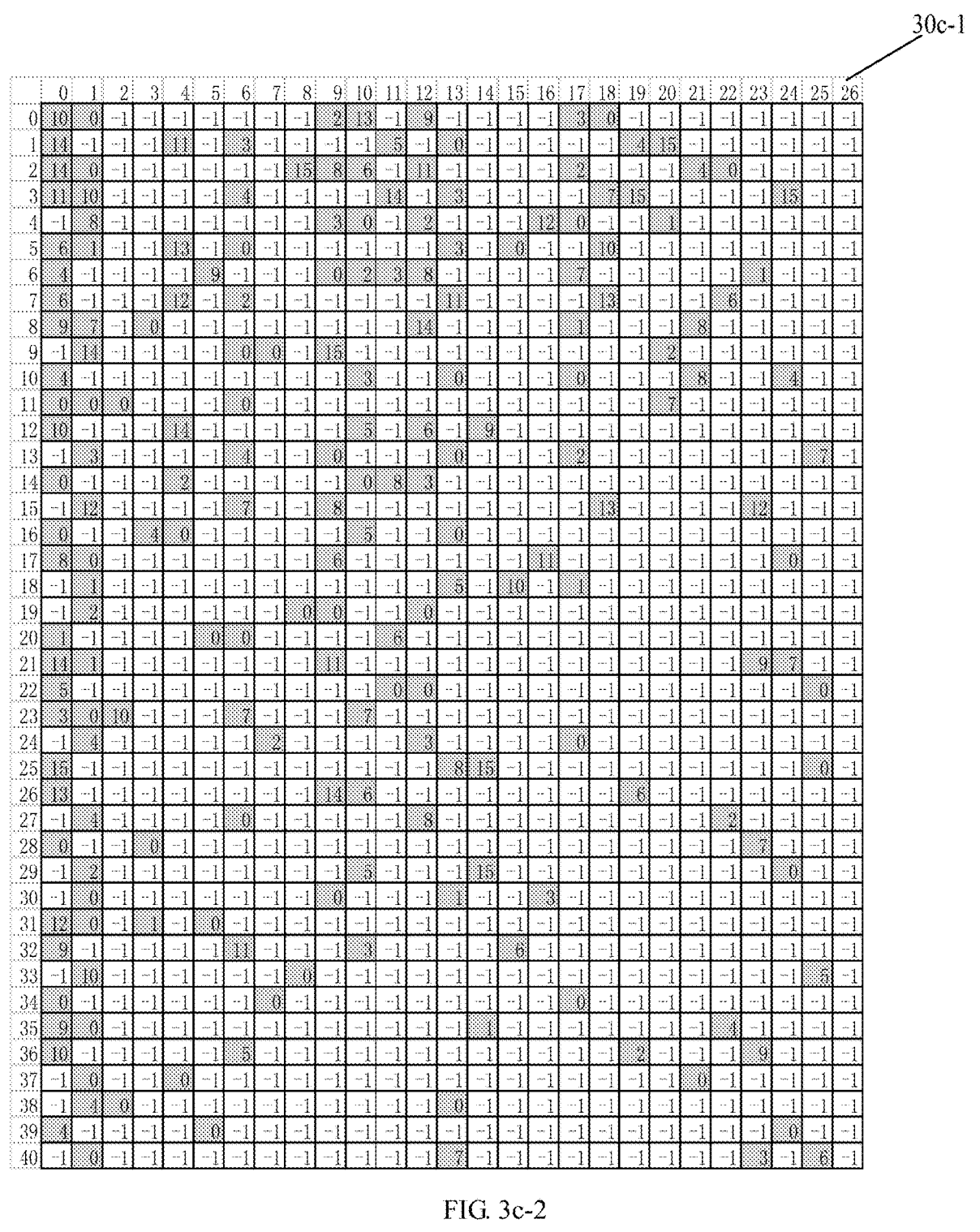
Figure 3C-3:
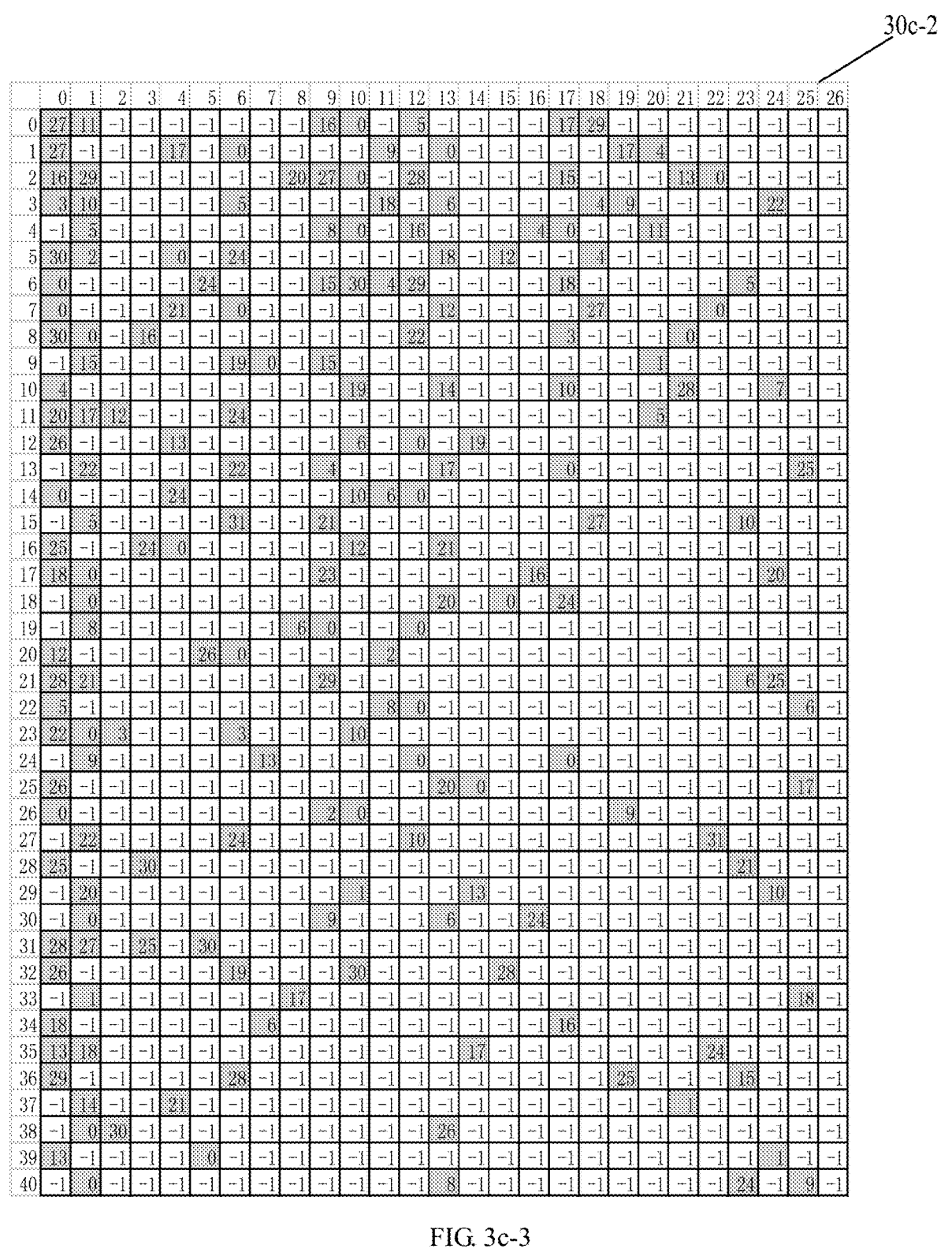
Figure 3C-4:
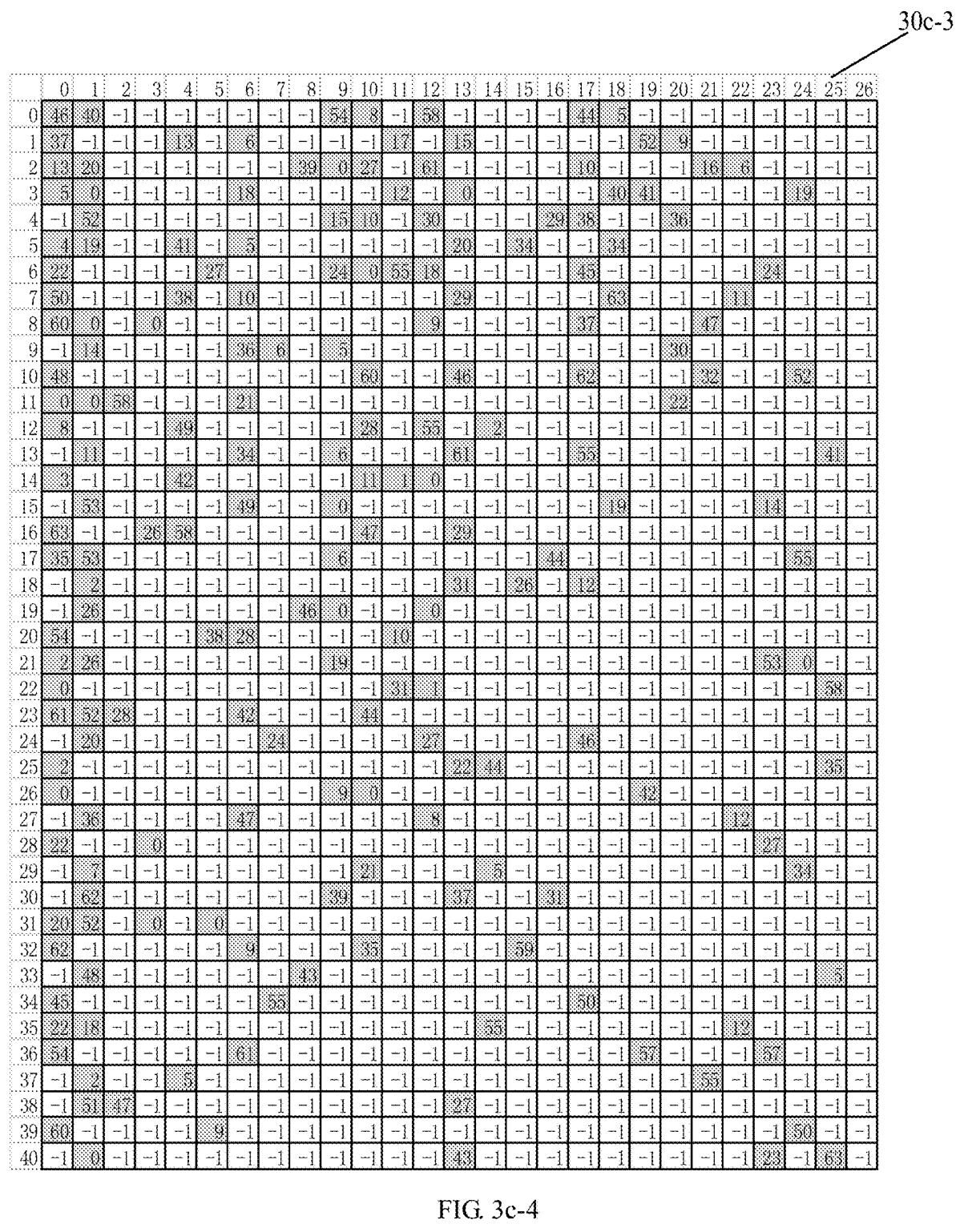
Figure 3C-5:
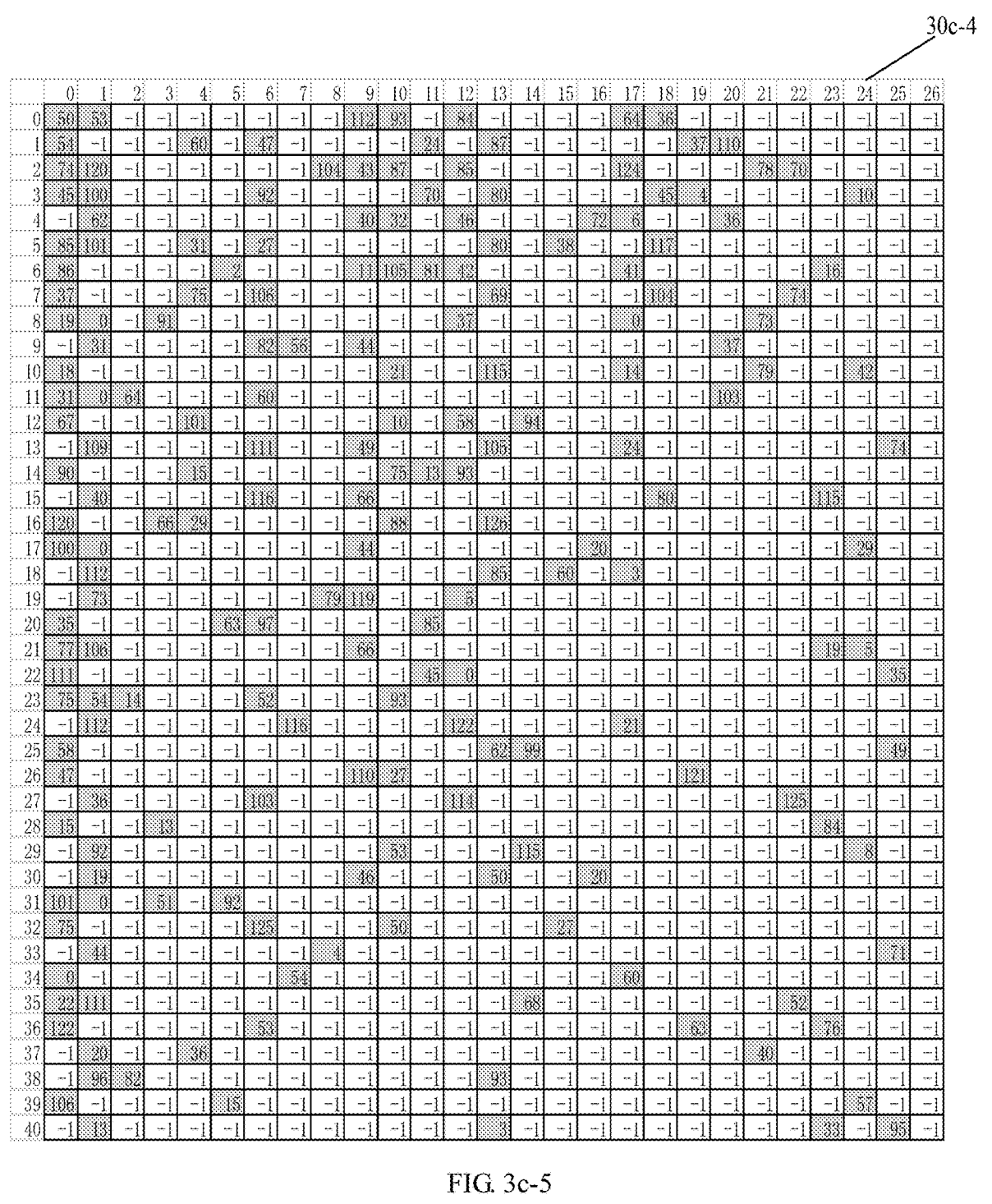
Figure 3C-6:
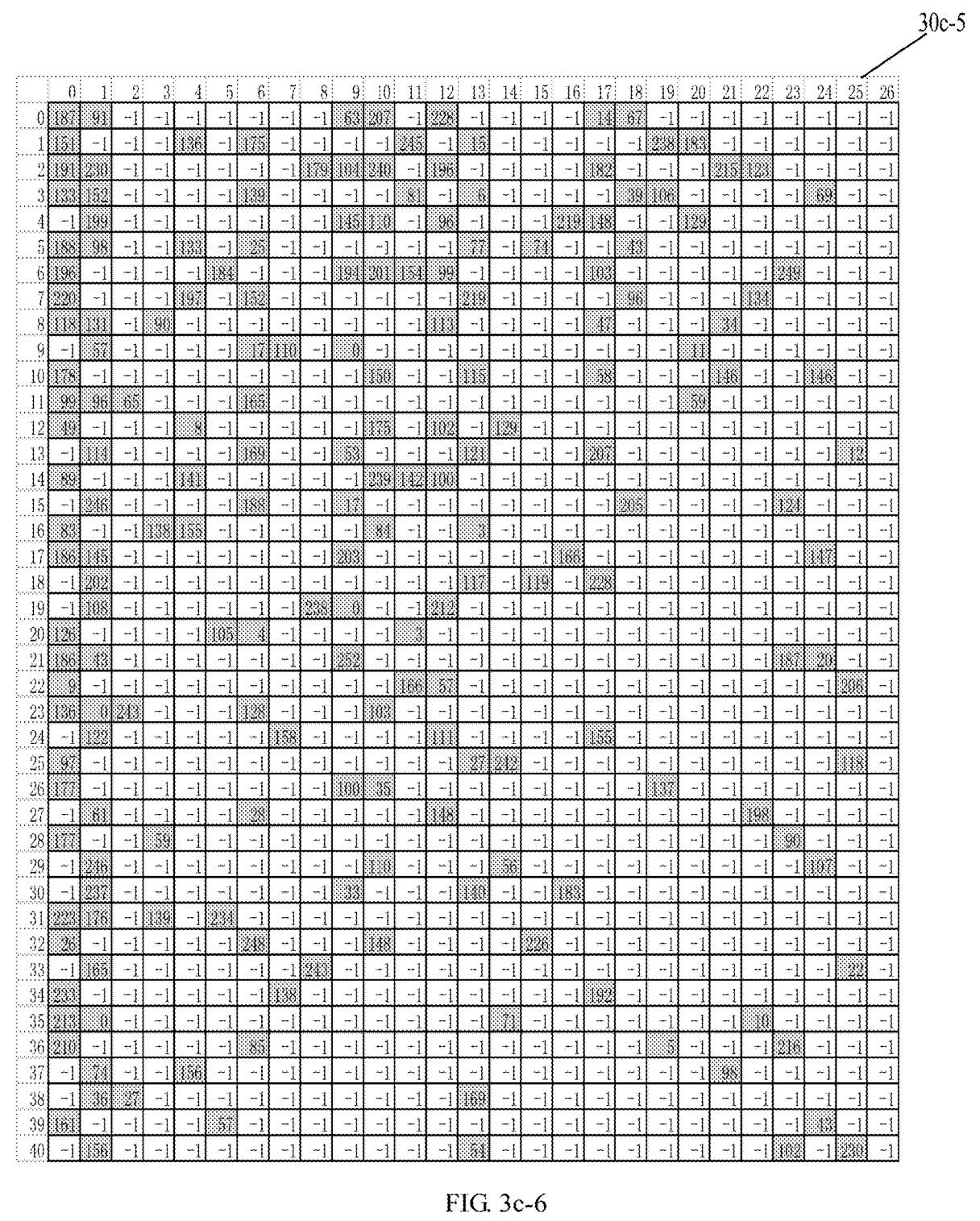
Figure 3C-7:
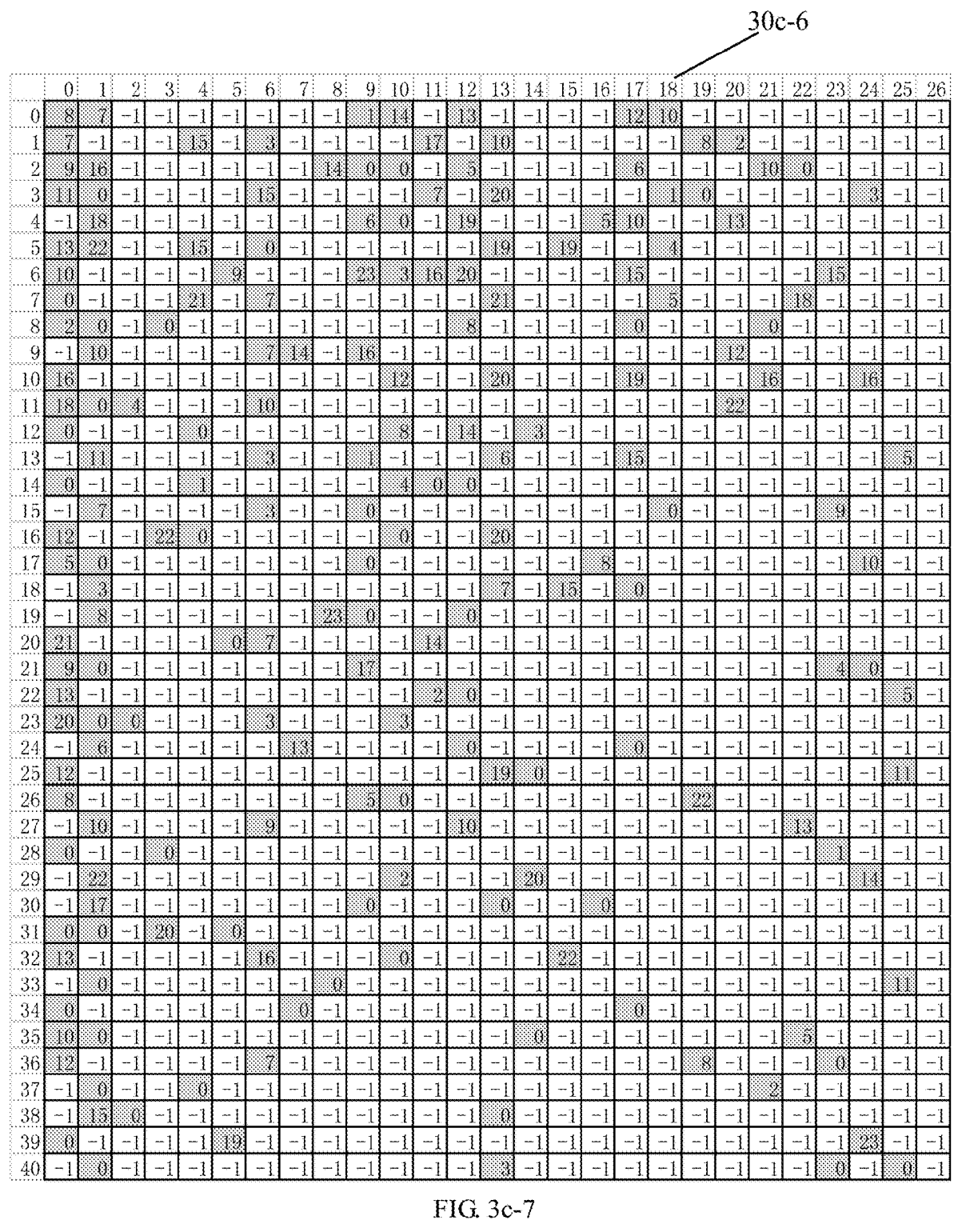
Figure 3C-8:
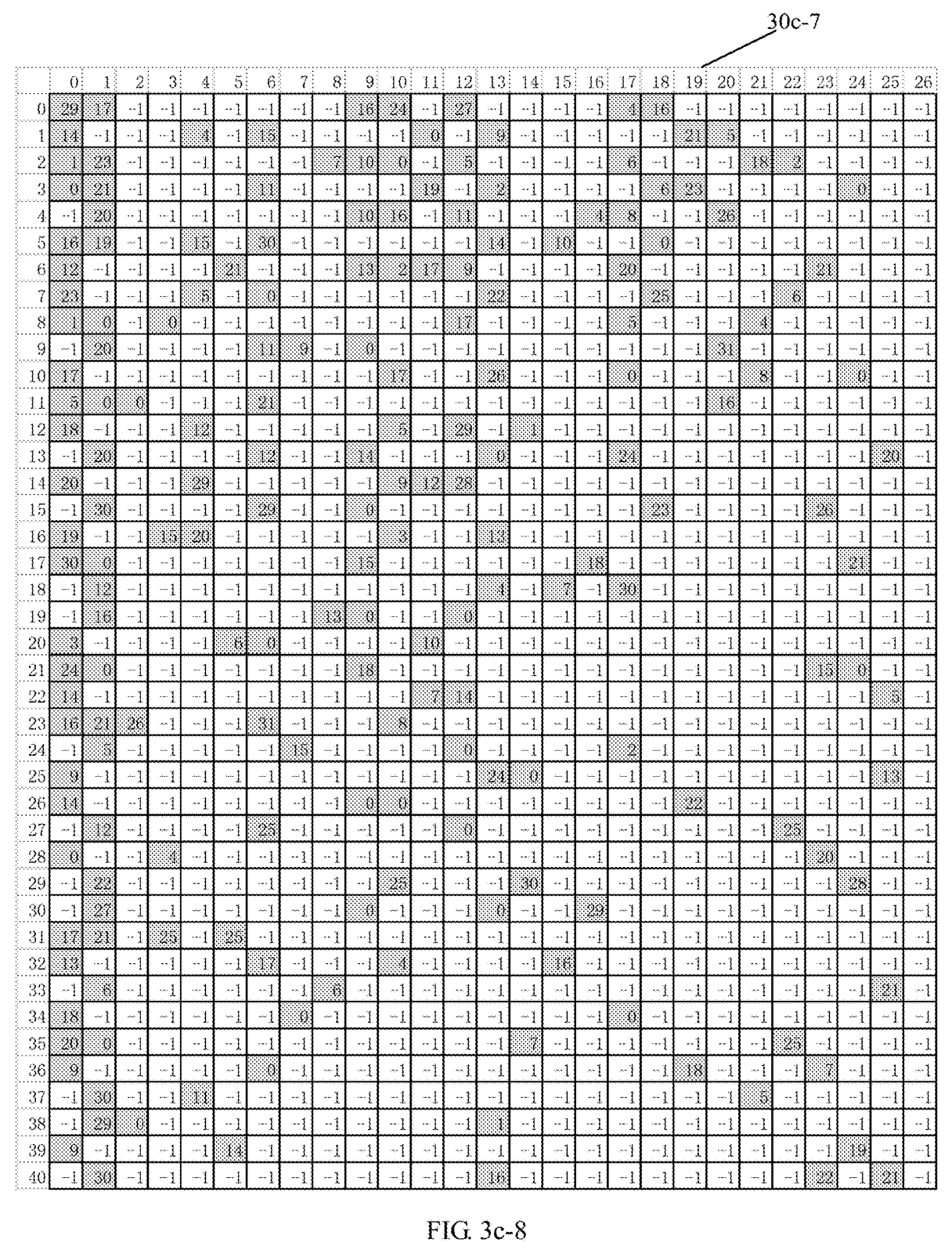
Figure 3C-9:
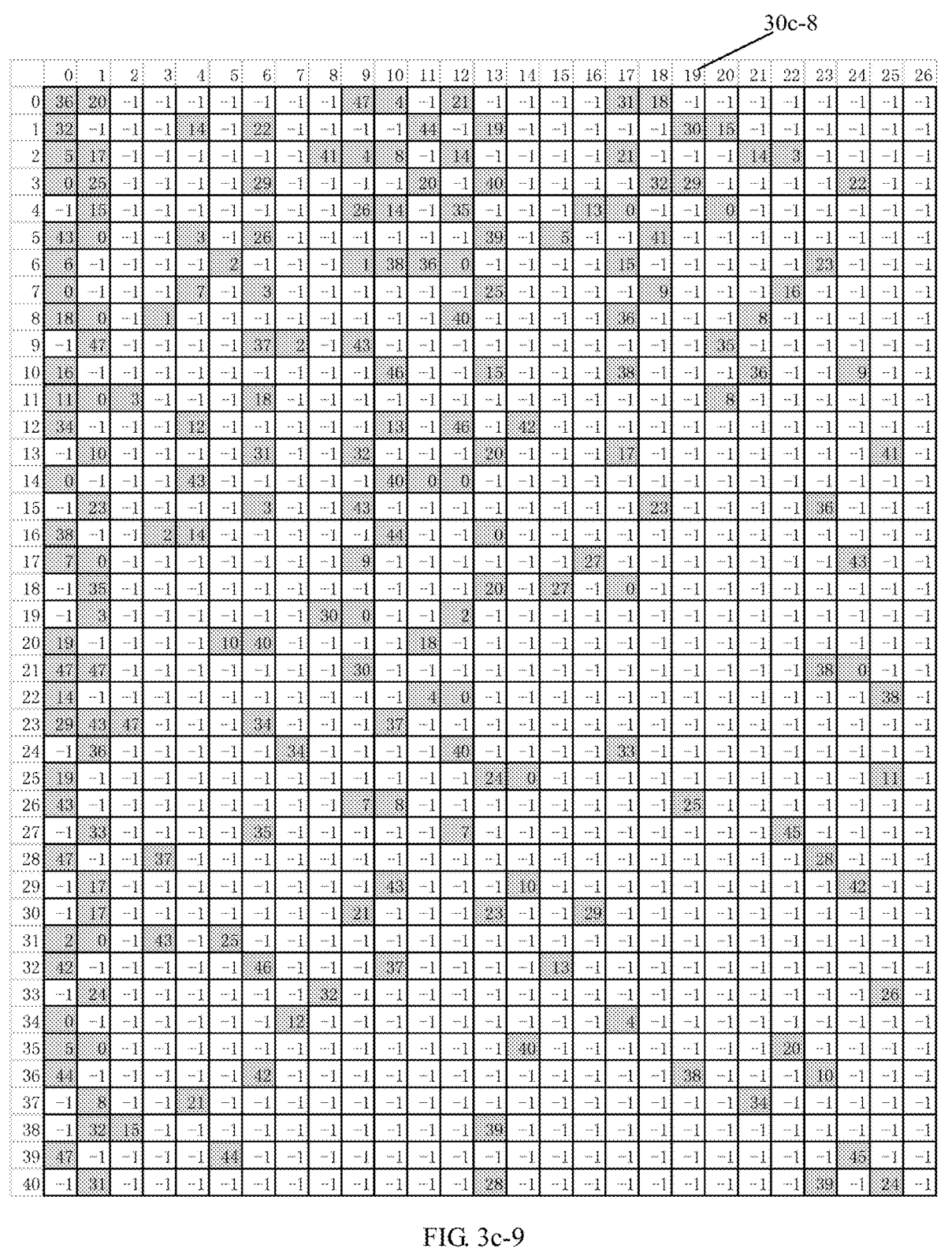
Figure 3C-10:
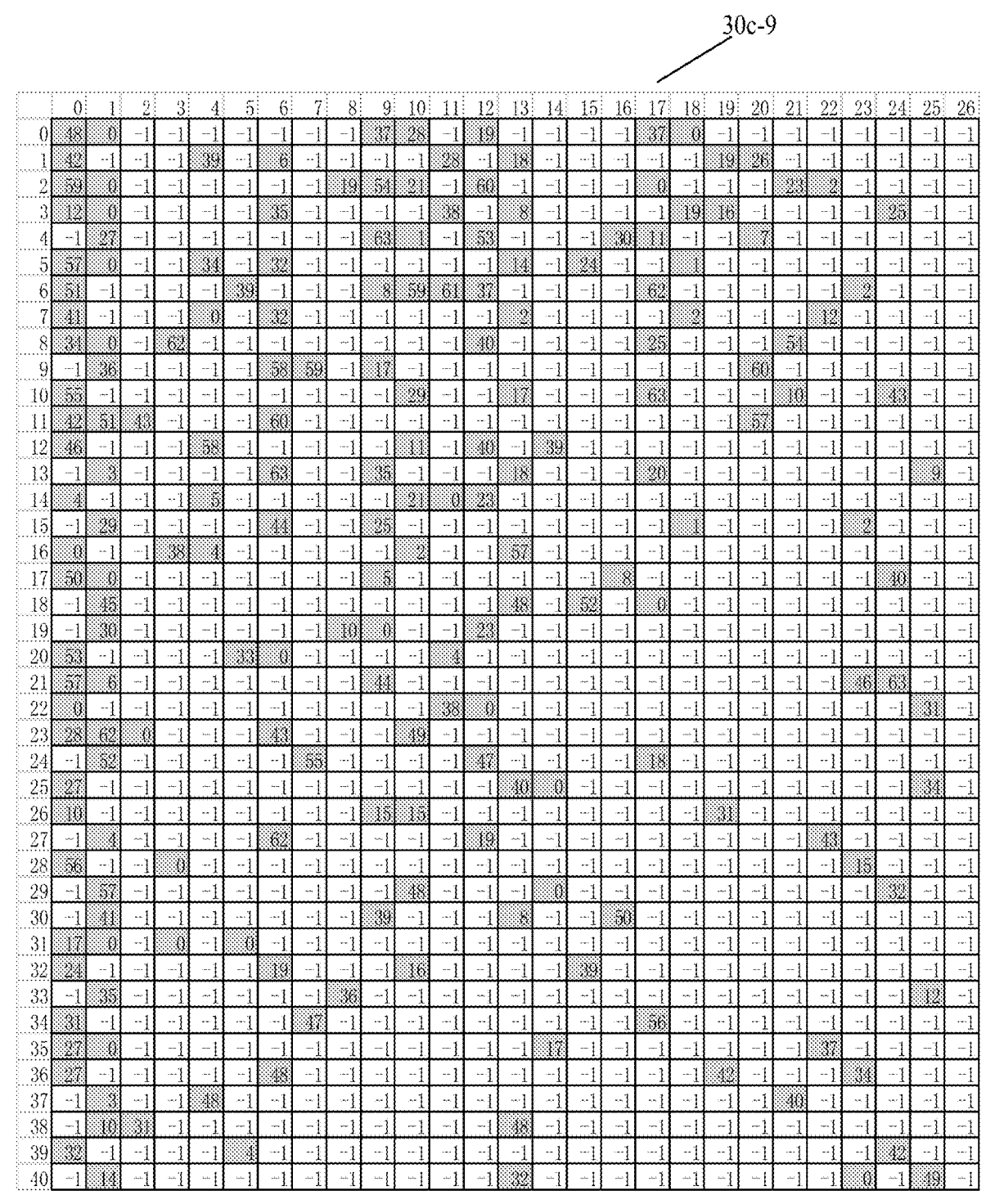
Figure 3C-11:
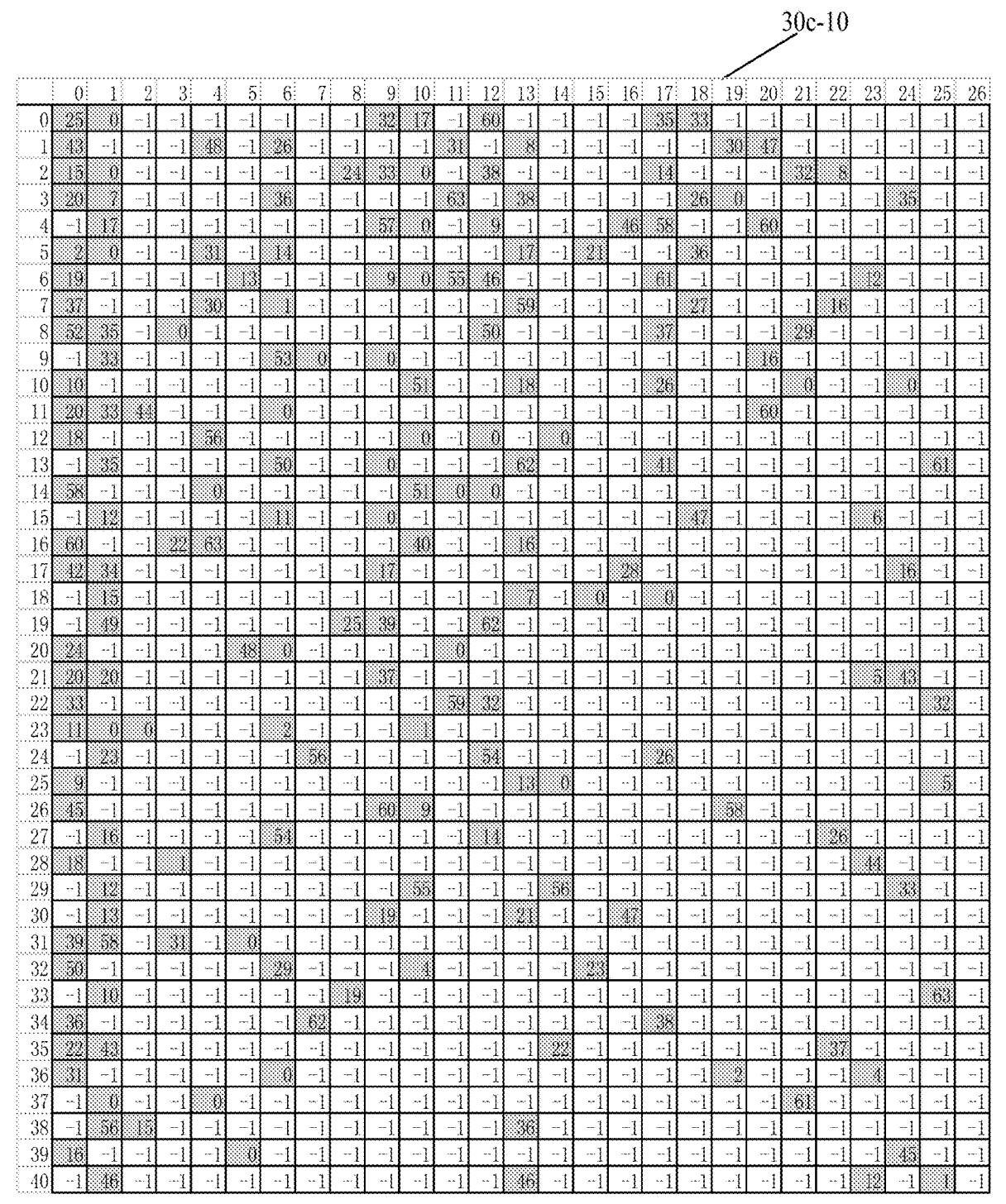

A base matrix 30c shown in FIG. 3c-1 is a base matrix example of the base graph 30a shown in FIG. 3a. A non-zero-element in row i and column j in the base graph 30a has a same position in the base matrix 30c, and a value of the non-zero-element is a shift value $P_{i,j}$.

The submatrix D includes $m_D$ rows in a shift matrix of the matrix F. For the base matrix 30c shown in FIG. 3c-1, $m_D$=41, and $m_D$ may be selected based on different code rates. A shift matrix corresponding to the submatrix D is the shift matrix of the matrix F. Herein the shift matrix of the matrix F is obtained by replacing a non-zero-element in row i and column j in the matrix F with a shift value $P_{i,j}$, and a zero-element is represented by −1 or null in the shift matrix. It should be noted that only examples are provided herein, the base graph may be 80a, 180a, or the like, and base graphs are not described one by one herein.

In a possible implementation, the shift matrix of the matrix F may include rows or columns in any one of matrices 30c-1 to 30c-10 shown in FIG. 3c-2 to FIG. 3c-11. For example, if a lifting factor Z is one of {16, 18, 20, 22, 24, 26, 28, 30}, the shift matrix of the matrix F may be the matrix 30c-1 shown in FIG. 3c-2 or a matrix obtained by performing row/column permutation on the matrix 30c-1; or if a lifting factor Z is one of {32, 36, 40, 44, 48, 52, 56, 60}, the shift matrix of the matrix F may be the matrix 30c-2 shown in FIG. 3c-3 or a matrix obtained by performing row/column permutation on the matrix 30c-2; or if a lifting factor Z is one of {60, 64, 72, 80, 88, 96, 104, 112, 120}, the shift matrix of the matrix F may be the matrix 30c-3 shown in FIG. 3c-4 or a matrix obtained by performing row/column permutation on the matrix 30c-3; or if a lifting factor Z is one of {128, 144, 160, 176, 192, 208, 224, 240}, the shift matrix of the matrix F may be the matrix 30c-4 shown in FIG. 3c-5 or a matrix obtained by performing row/column permutation on the matrix 30c-4; or if a lifting factor Z is one of {256, 288, 320, 352, 384}, the shift matrix of the matrix F may be the matrix 30c-5 shown in FIG. 3c-6 or a matrix obtained by performing row/column permutation on the matrix 30c-5.

A submatrix D in the base matrix 30c is replaced by $m_D$ rows in each shift matrix of the matrix F, to obtain base matrices that are of different code rates and correspond to the base graph 30a. If $m_D$=41, a matrix including row 5 to row 45 and column 0 to column 26 in the base matrix 30c is replaced by each shift matrix of the matrix F, to obtain each base matrix of 46 rows and 68 columns that corresponds to the base graph 30a. In this case, a code rate is ⅓.

In another possible implementation, a lifting factor set may be {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}, and one of the following may be selected:

if a lifting factor Z is one of {24, 26, 28, 30}, the shift matrix of the matrix F may be the matrix 30c-6 shown in FIG. 3c-7 or a matrix obtained by performing row/column permutation on the matrix 30c-6; or if a lifting factor Z is one of {32, 36, 40, 44}, the shift matrix of the matrix F may be the matrix 30c-7 shown in FIG. 3c-8 or a matrix obtained by performing row/column permutation on the matrix 30c-7; or if a lifting factor Z is one of {48, 52, 56, 60}, the shift matrix of the matrix F may be the matrix 30c-8 shown in FIG. 3c-9 or a matrix obtained by performing row/column permutation on the matrix 30c-8; or if a lifting factor Z is one of {60, 64, 72, 80, 88, 96, 104, 112, 120}, the shift matrix of the matrix F may be the matrix 30c-3 shown in FIG. 3c-4 or a matrix obtained by performing row/column permutation on the matrix 30c-3; or if a lifting factor Z is one of {128, 144, 160, 176, 192, 208, 224, 240}, the shift matrix of the matrix F may be the matrix 30c-4 shown in FIG. 3c-5 or a matrix obtained by performing row/column permutation on the matrix 30c-4; or if a lifting factor Z is one of {256, 288, 320, 352, 384}, the shift matrix of the matrix F may be the matrix 30c-5 shown in FIG. 3c-6 or a matrix obtained by performing row/column permutation on the matrix 30c-5.

Based on the foregoing implementations, in another possible implementation, there are more choices for the shift matrix of the matrix F to further improve performance. For example, the shift matrix of the matrix F may be the matrix 30c-9 shown in FIG. 3c-10 or a matrix obtained by performing row/column permutation on the matrix 30c-9, or the matrix 30c-10 shown in FIG. 3c-11 or a matrix obtained by performing row/column permutation on the matrix 30c-10. For example, a lifting factor may be designed as follows:

if the lifting factor Z is one of {24, 26, 28, 30}, the shift matrix of the matrix F may be the matrix 30c-6 shown in FIG. 3c-7 or a matrix obtained by performing row/column permutation on the matrix 30c-6; or if the lifting factor Z is one of {32, 36, 40, 44}, the shift matrix of the matrix F may be the matrix 30c-7 shown in FIG. 3c-8 or a matrix obtained by performing row/column permutation on the matrix; or if the lifting factor Z is one of {48, 52, 56, 60}, the shift matrix of the matrix F may be the matrix 30c-8 shown in FIG. 3c-9 or a matrix obtained by performing row/column permutation on the matrix 30c-8; or if the lifting factor Z is one of {64, 72, 80, 88}, the shift matrix of the matrix F may be the matrix 30c-9 shown in FIG. 3c-10 or a matrix obtained by performing row/column permutation on the matrix 30c-9, or the matrix 30c-10 shown in FIG. 3c-11 or a matrix obtained by performing row/column permutation on the matrix 30c-10; or if the lifting factor Z is one of {96, 104, 112, 120}, the shift matrix of the matrix F may be the matrix 30c-3 shown in FIG. 3c-4 or a matrix obtained by performing row/column permutation on the matrix 30c-3; or if the lifting factor Z is one of {128, 144, 160, 176, 192, 208, 224, 240}, the shift matrix of the matrix F may be the matrix 30c-4 shown in FIG. 3c-5 or a matrix obtained by performing row/column permutation on the matrix 30c-4; or if the lifting factor Z is one of {256, 288, 320, 352, 384}, the shift matrix of the matrix F may be the matrix 30c-5 shown in FIG. 3c-6 or a matrix obtained by performing row/column permutation on the matrix 30c-5.

Figure 6:
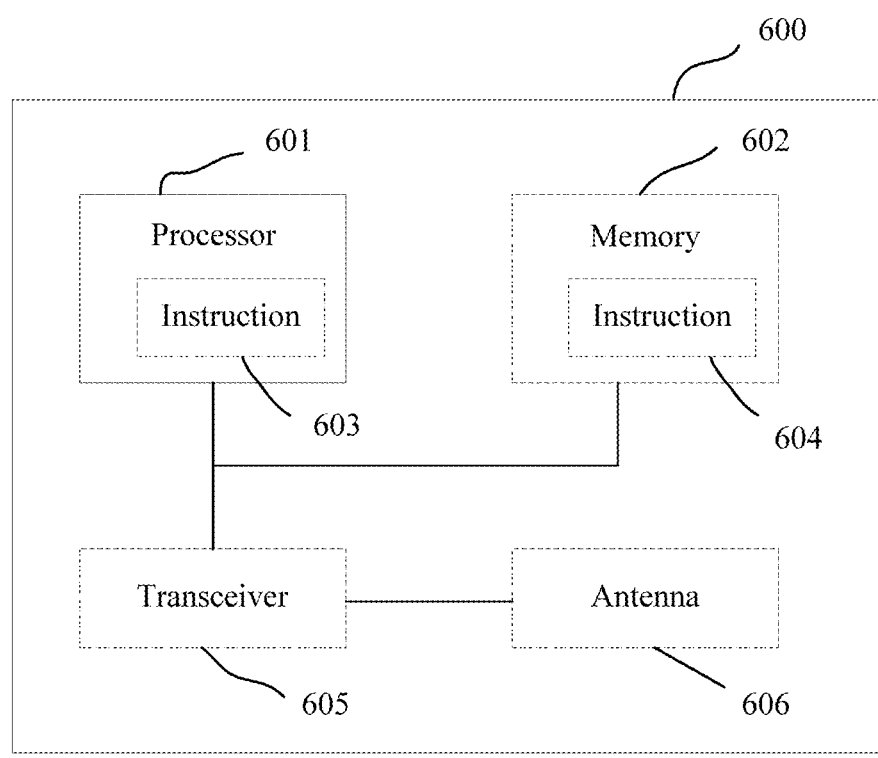
Figure 7:
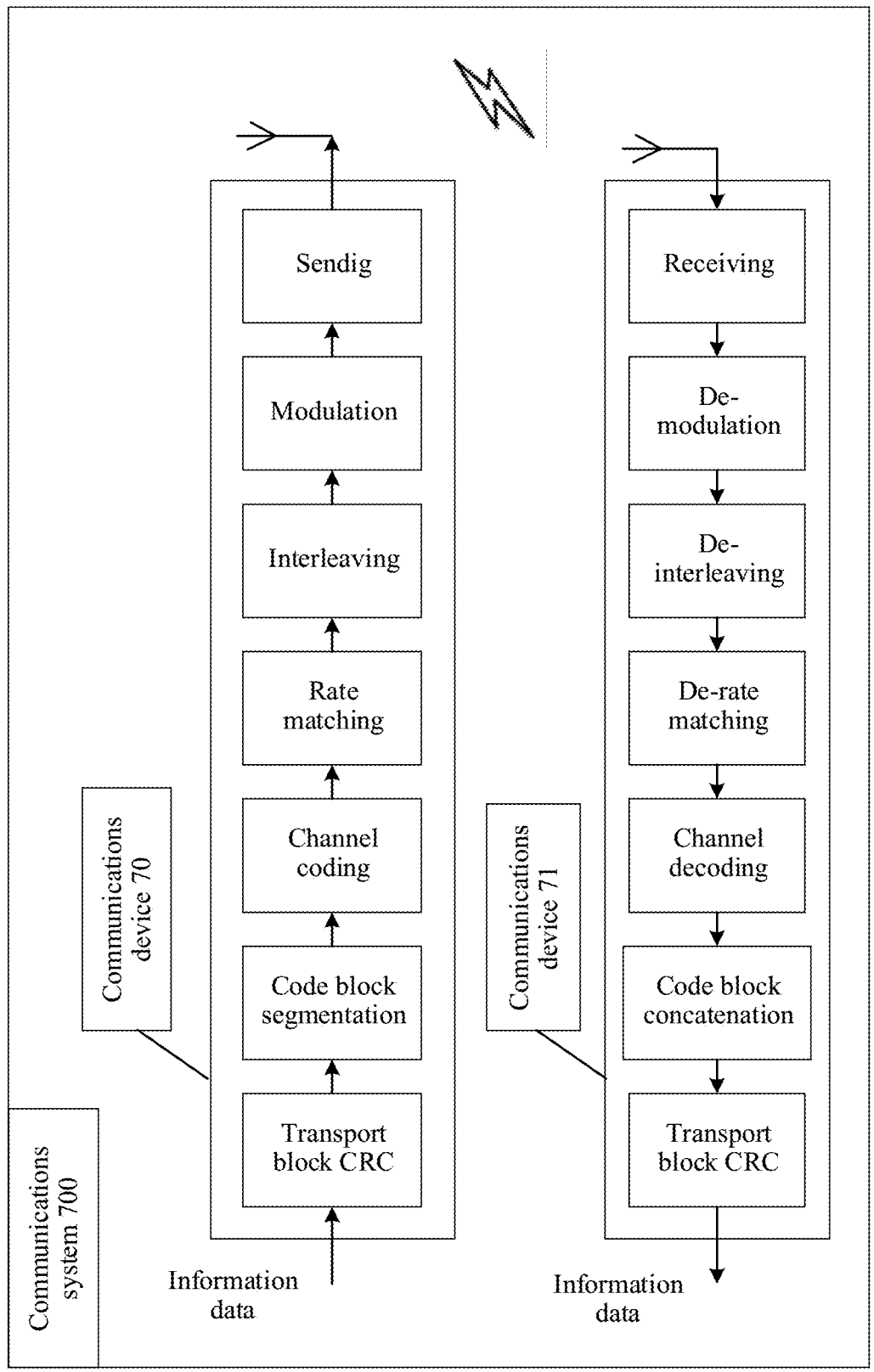
Figure 8A:
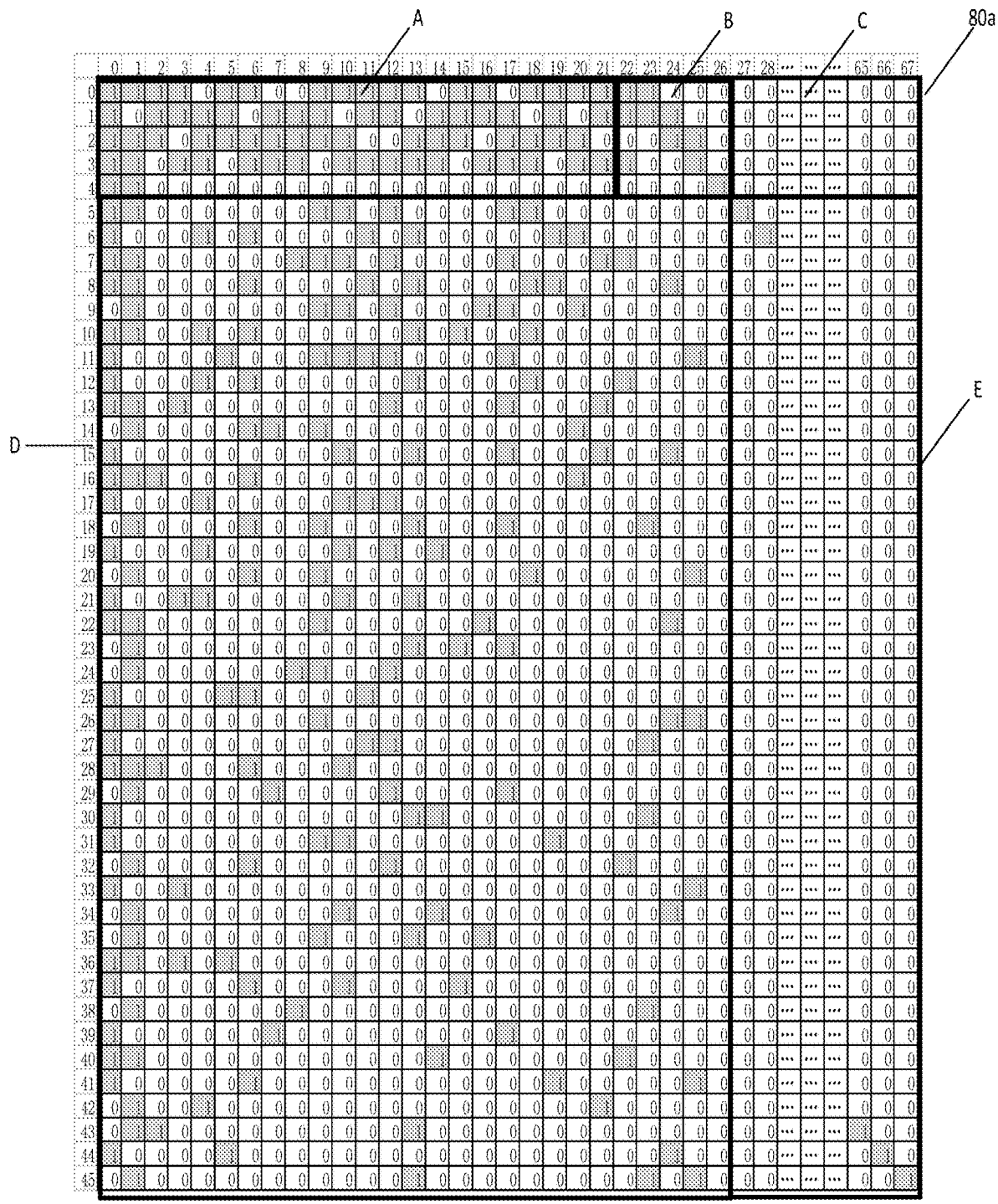
FIG. 8a is a schematic diagram of a base graph of an LDPC code according to another embodiment of the present application.
Figure 8B-1:
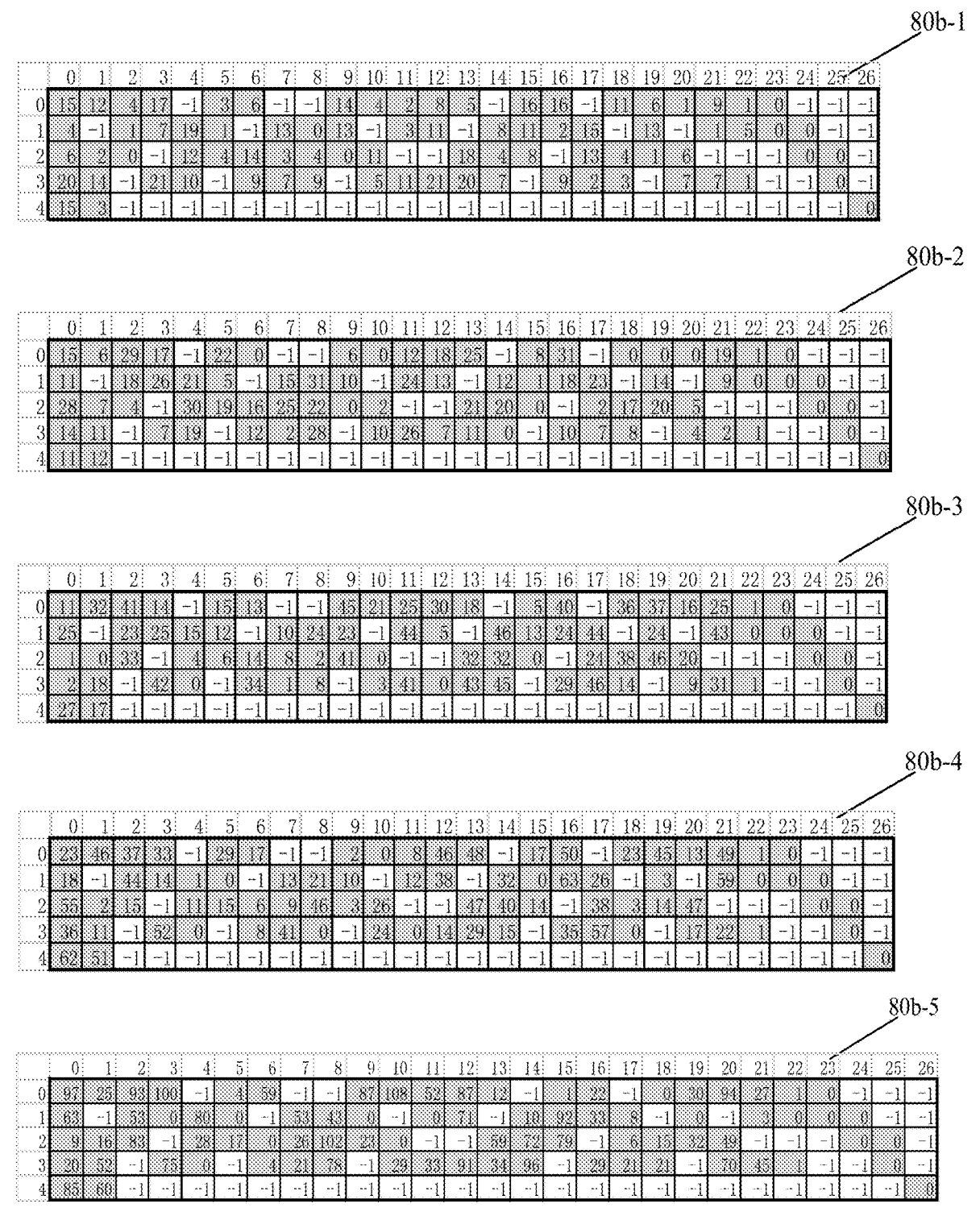
Figure 8B-2:
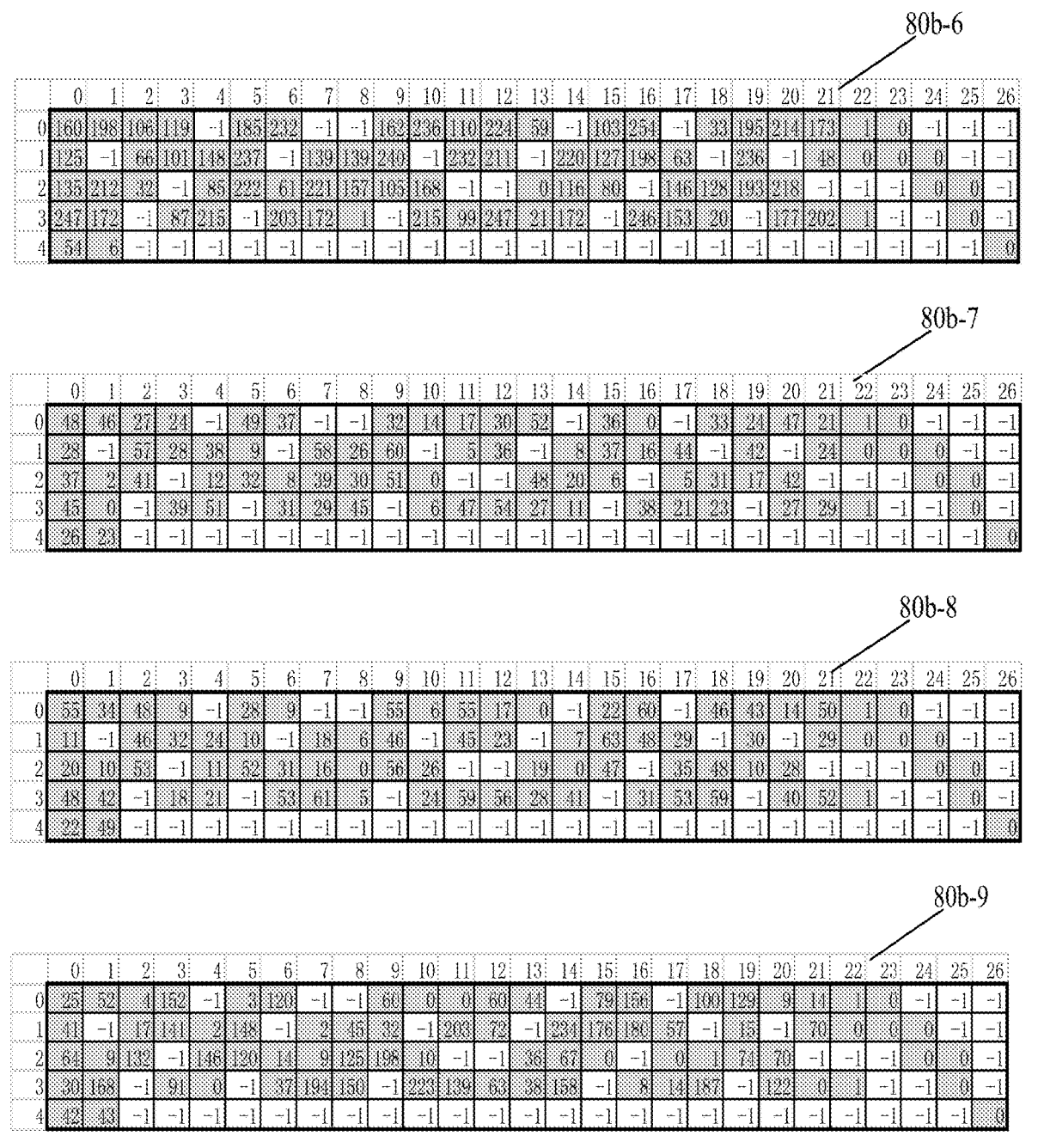
Figure 8C-1:
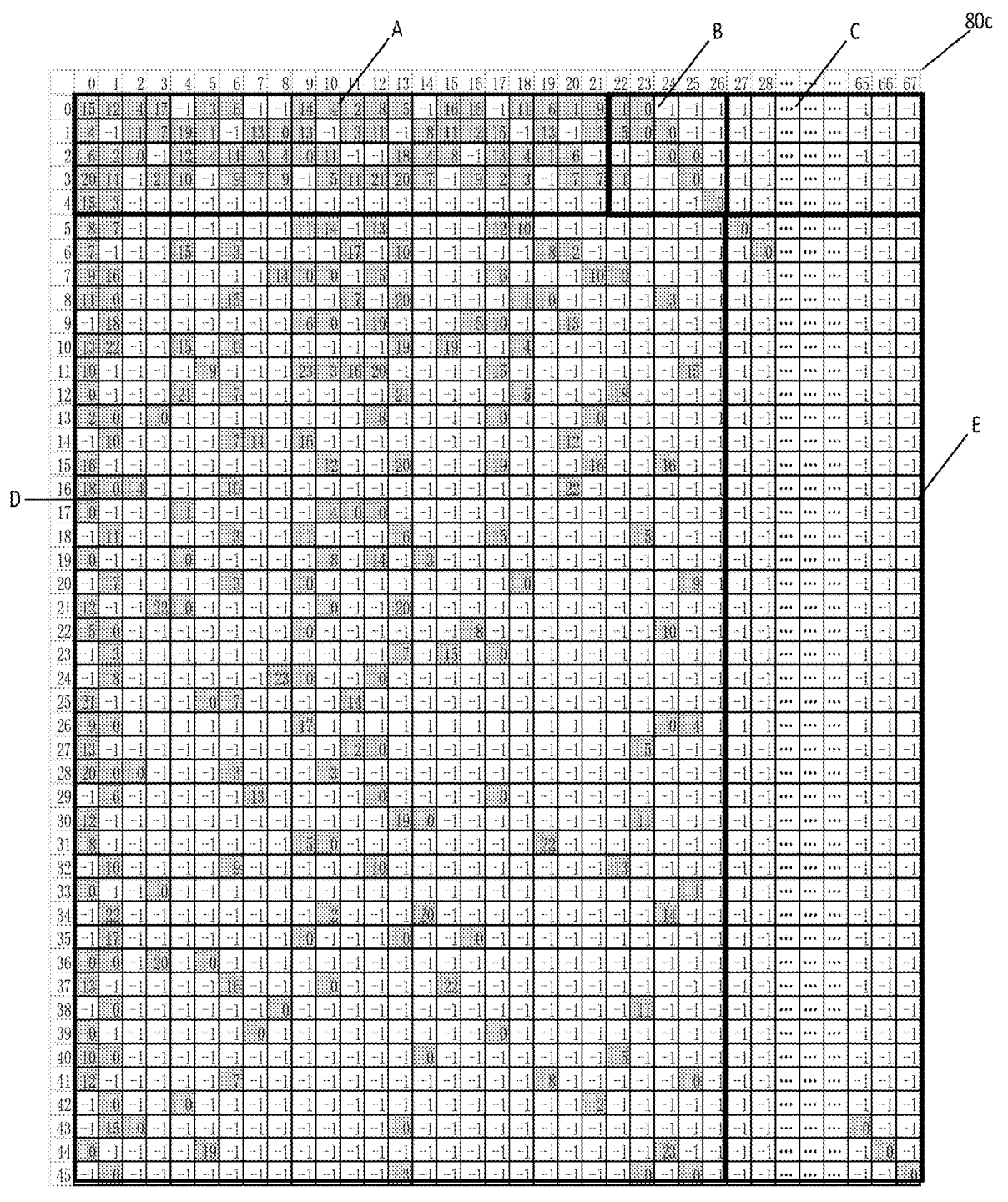
Figure 8C-2:
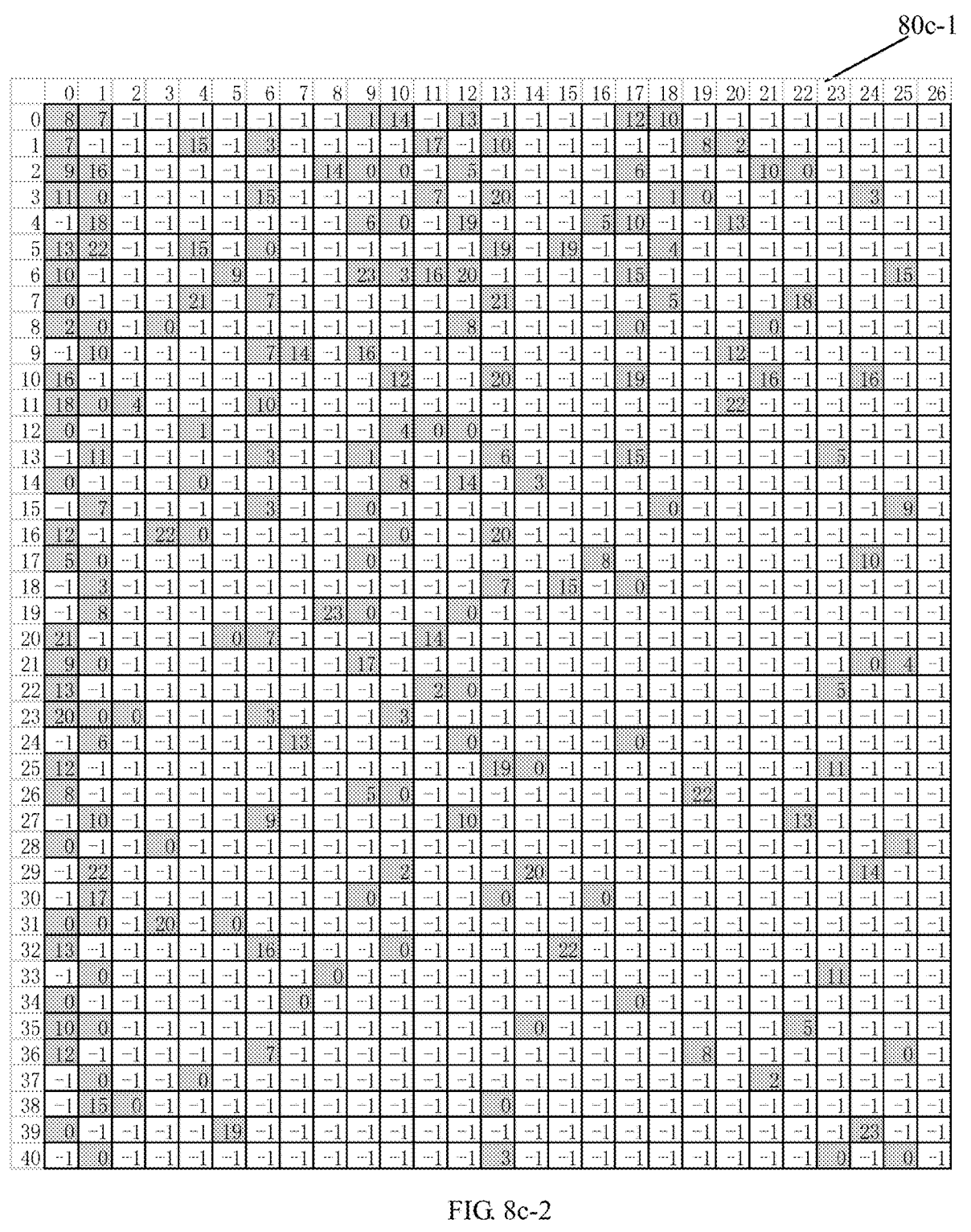
Figure 8C-3:
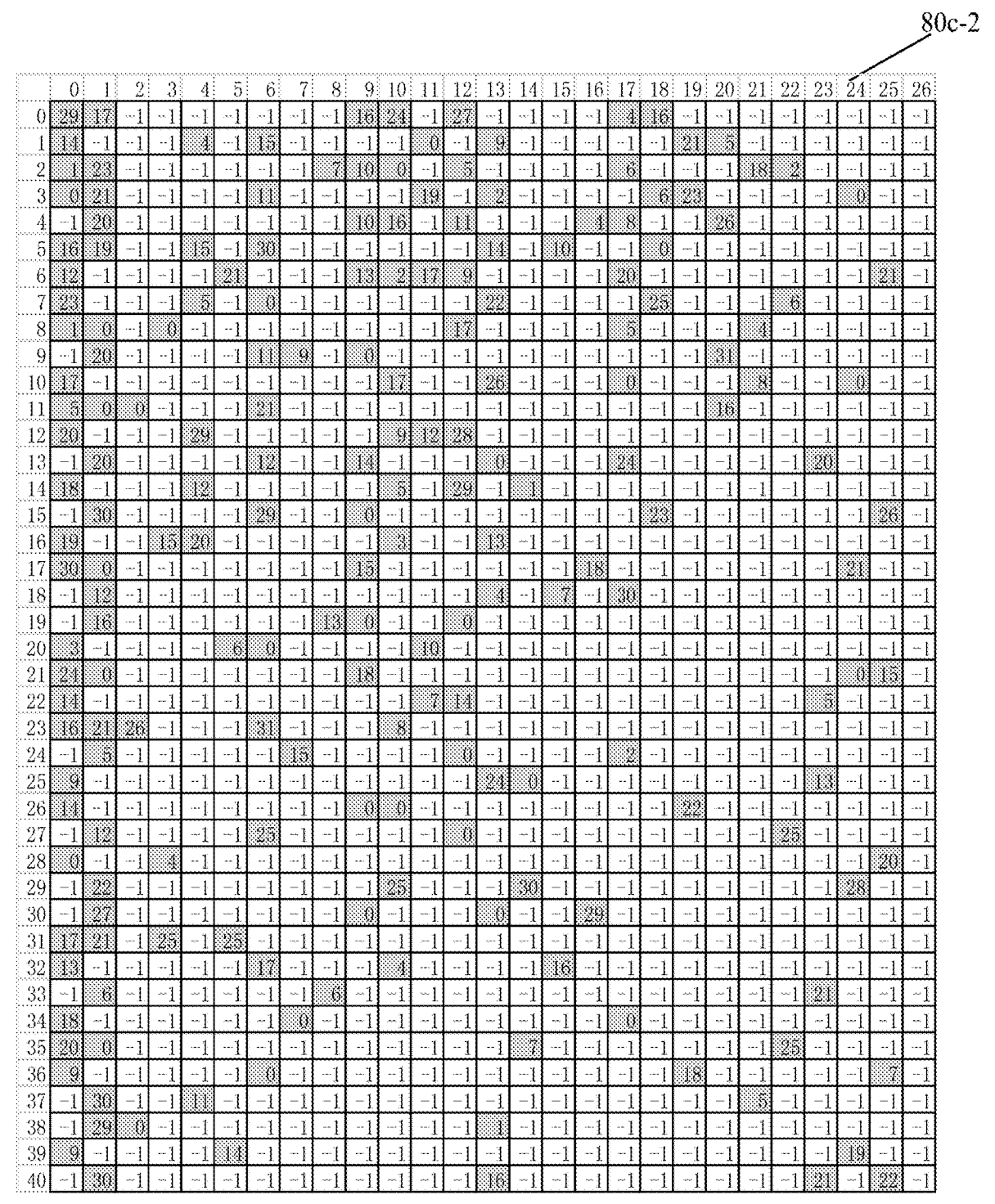
Figure 8C-4:
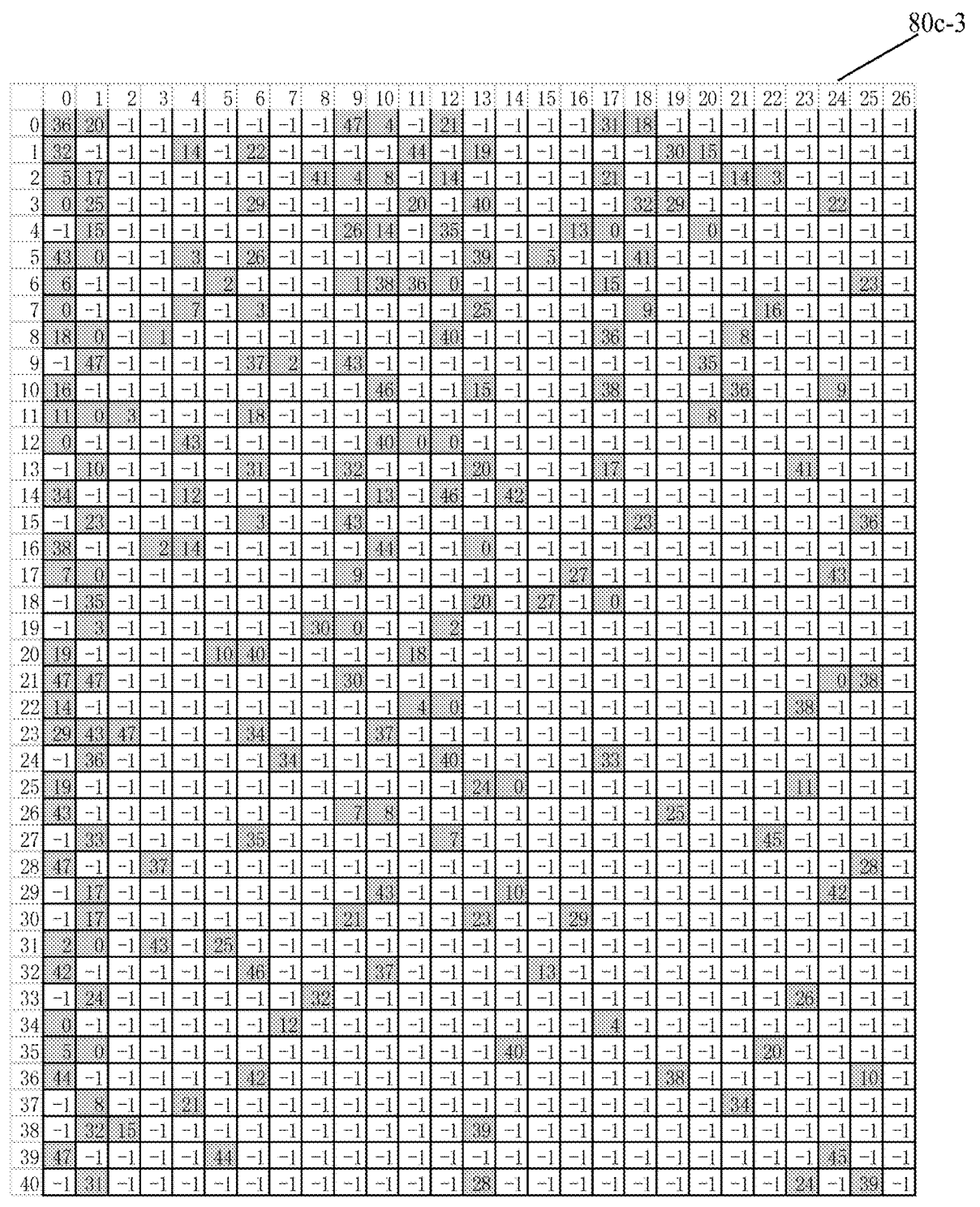
Figure 8C-5:
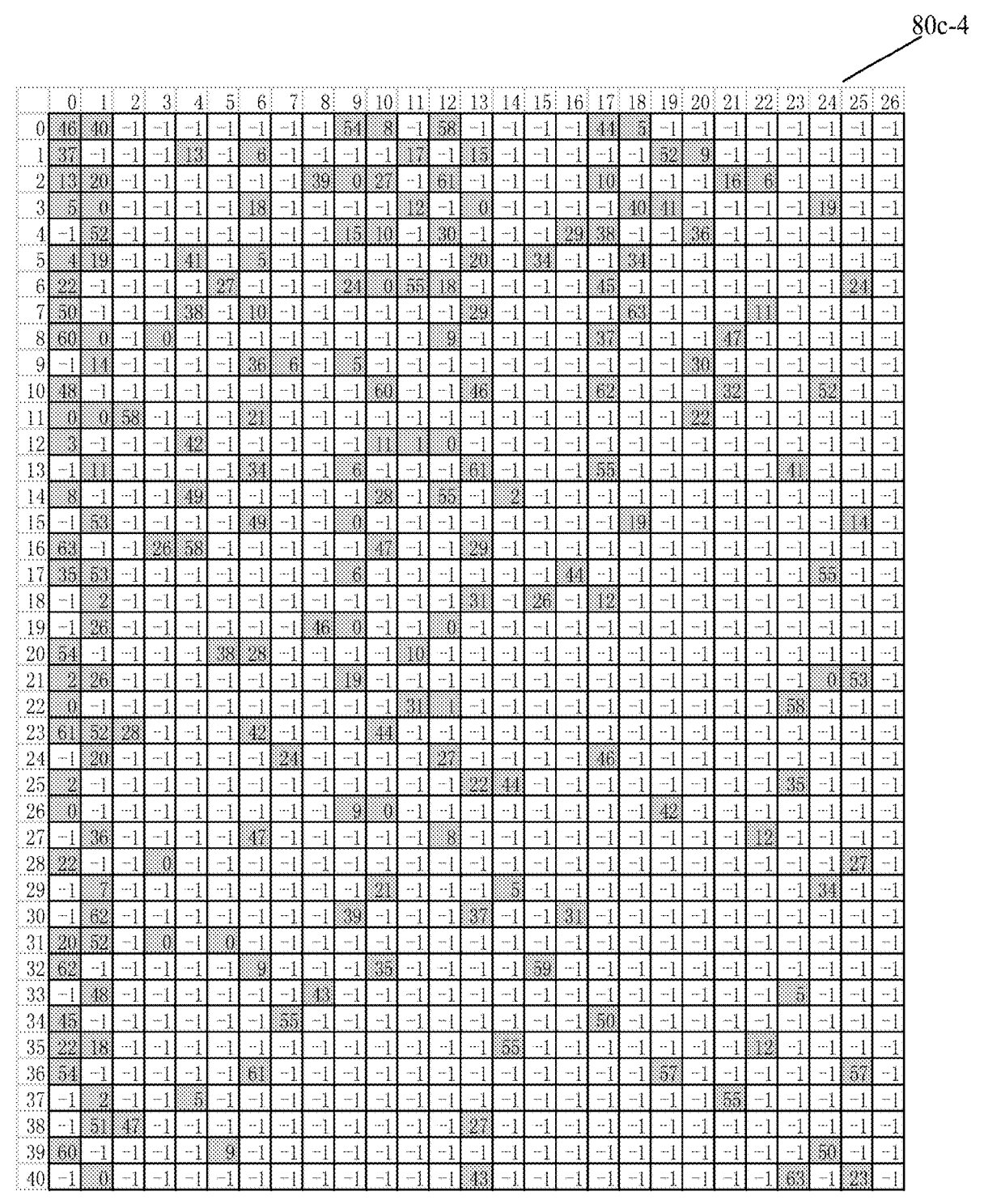
Figure 8C-6:
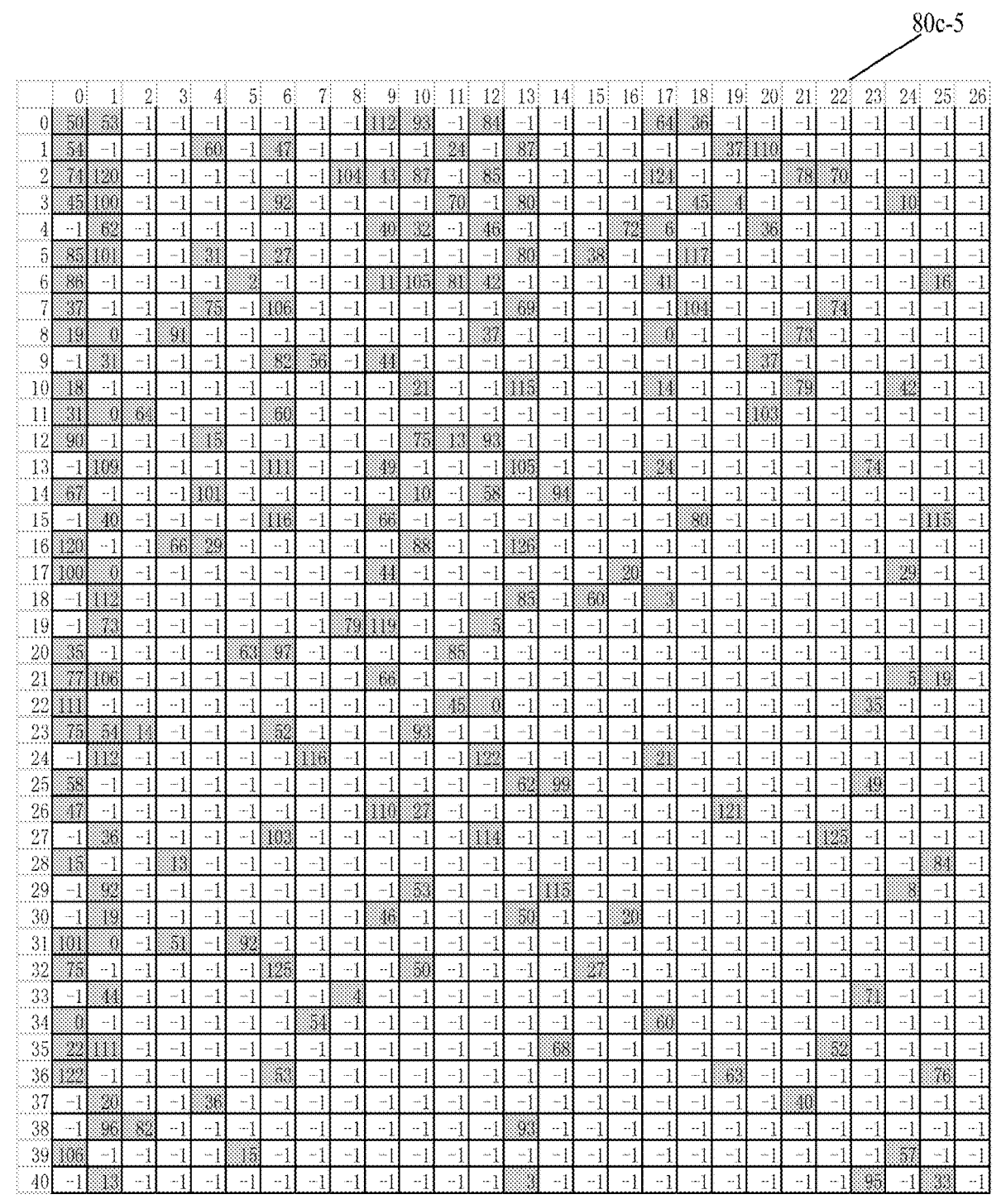
Figure 8C-7:
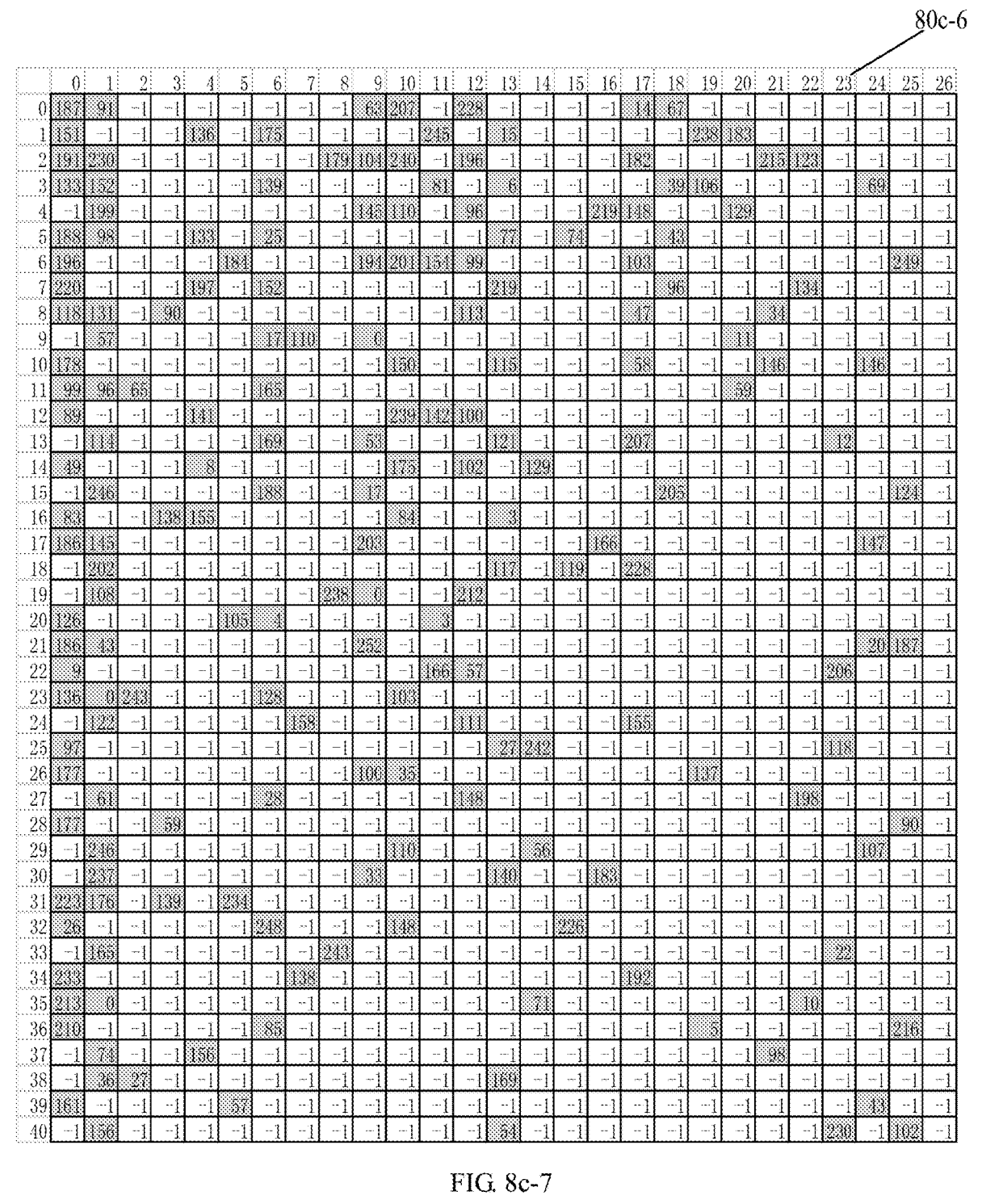
Figure 8C-8:
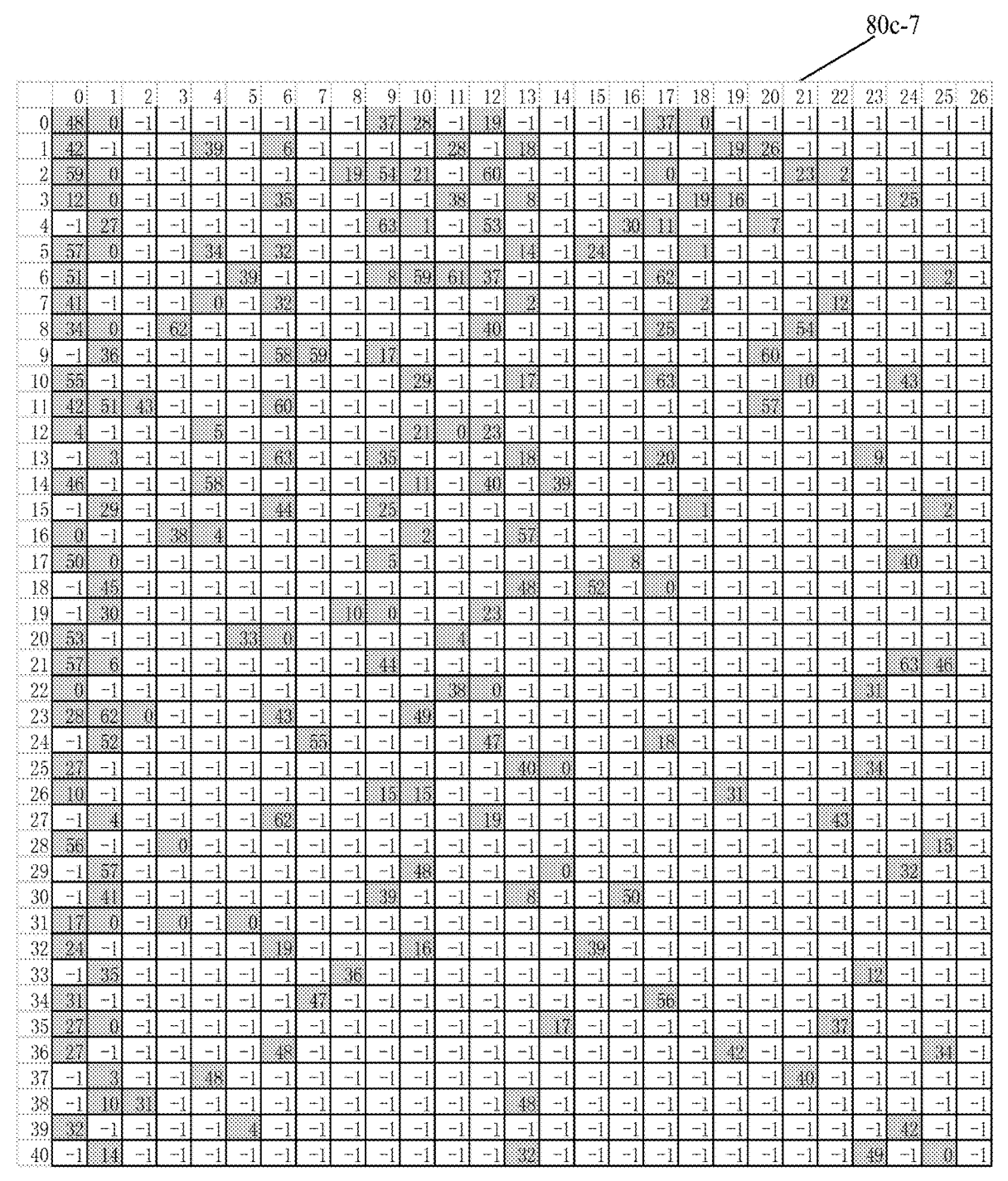
Figure 8C-9:
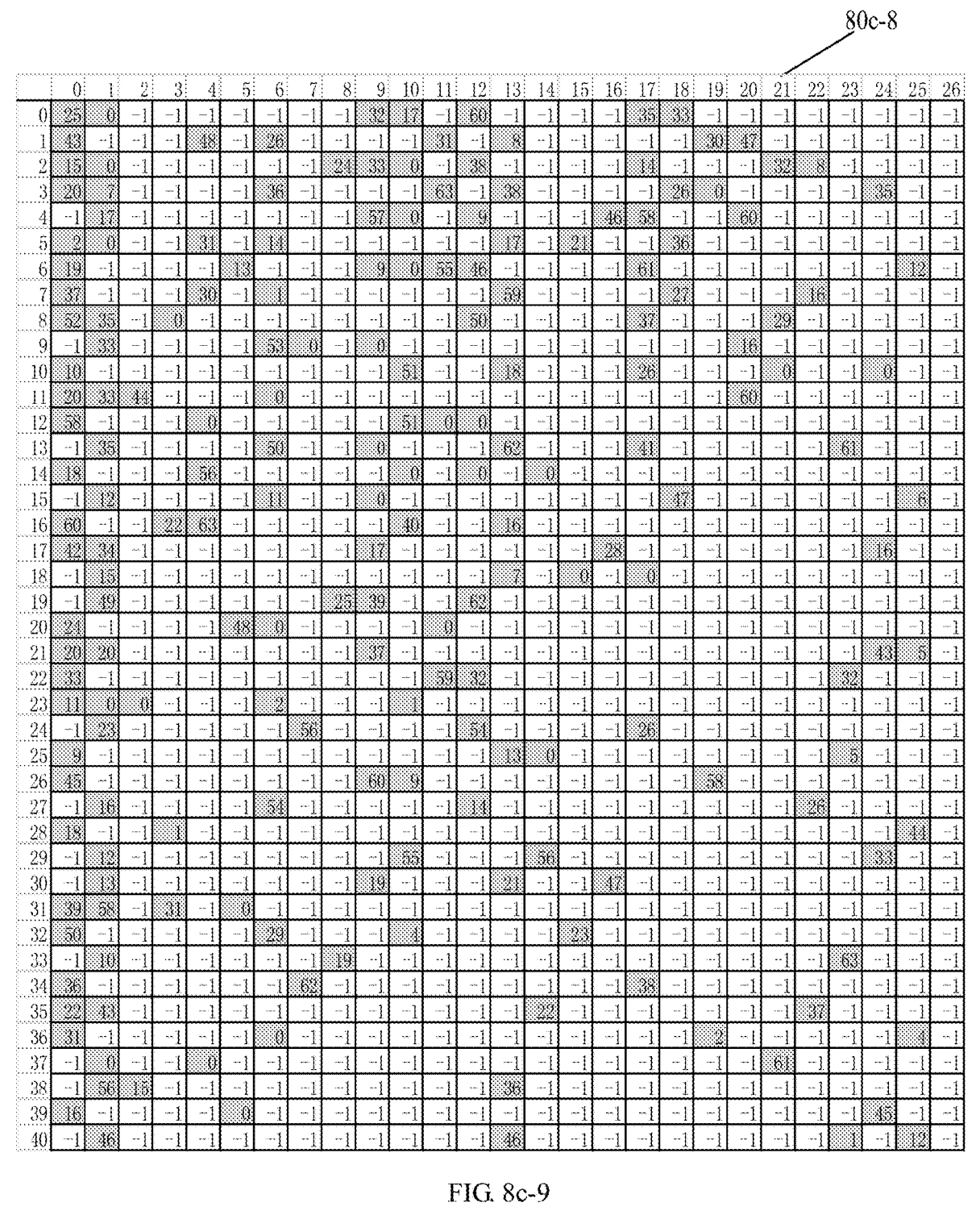
Figure 8C-10:
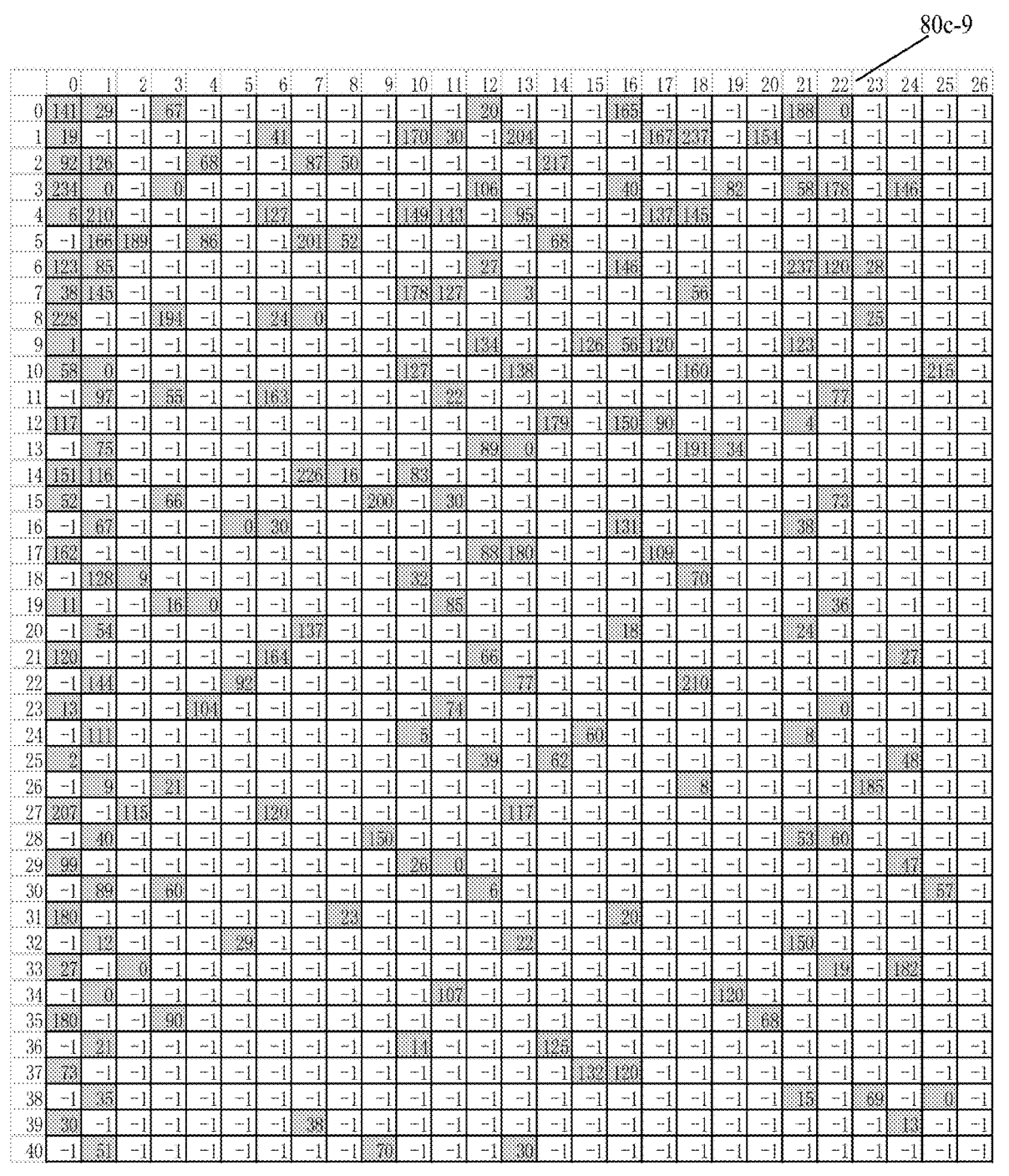

In another possible implementation, the shift matrix of the matrix F may include rows or columns in any one of matrices 80c-1 to 80c-9 shown in FIG. 8c-2 to FIG. 8c-10. For example, a lifting factor set may be {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}, and one of the following may be selected:

if a lifting factor Z is one of {24, 26, 28, 30}, the shift matrix of the matrix F may be the matrix 80c-1 shown in FIG. 8c-2 or a matrix obtained by performing row/column permutation on the matrix 80c-1; or if a lifting factor Z is one of {32, 36, 40, 44}, the shift matrix of the matrix F may be the matrix 80c-2 shown in FIG. 8c-3 or a matrix obtained by performing row/column permutation on the matrix 80c-2; or if a lifting factor Z is one of {48, 52, 56, 60}, the shift matrix of the matrix F may be the matrix 80c-3 shown in FIG. 8c-4 or a matrix obtained by performing row/column permutation on the matrix 80c-3; or if a lifting factor Z is one of {60, 64, 72, 80, 88, 96, 104, 112, 120}, the shift matrix of the matrix F may be the matrix 80c-4 shown in FIG. 8c-5 or a matrix obtained by performing row/column permutation on the matrix 80c-4; or if a lifting factor Z is one of {128, 144, 160, 176, 192, 208, 224, 240}, the shift matrix of the matrix F may be the matrix 80c-5 shown in FIG. 8c-6 or a matrix obtained by performing row/column permutation on the matrix 80c-5; or if a lifting factor Z is one of {256, 288, 320, 352, 384}, the shift matrix of the matrix F may be the matrix 80c-6 shown in FIG. 8c-7 or a matrix obtained by performing row/column permutation on the matrix 80c-6.

Based on the foregoing implementations, in another possible implementation, to further improve performance, lifting factors Z may be designed at a finer granularity, so that there are more choices for the shift matrix of the matrix F. For example, the shift matrix of the matrix F may be the matrix 80c-7 or a matrix obtained by performing row/column permutation on the matrix, or the matrix 80c-8 or a matrix obtained by performing row/column permutation on the matrix. For example, a lifting factor may be designed as follows:

if the lifting factor Z is one of {24, 26, 28, 30}, the shift matrix of the matrix F may be the matrix 80c-1 shown in FIG. 8c-2 or a matrix obtained by performing row/column permutation on the matrix 80c-1; or if the lifting factor Z is one of {32, 36, 40, 44}, the shift matrix of the matrix F may be the matrix 80c-2 shown in FIG. 8c-3 or a matrix obtained by performing row/column permutation on the matrix 80c-2; or if the lifting factor Z is one of {48, 52, 56, 60}, the shift matrix of the matrix F may be the matrix 80c-3 shown in FIG. 8c-4 or a matrix obtained by performing row/column permutation on the matrix 80c-3; or if the lifting factor Z is one of {64, 72, 80, 88}, the shift matrix of the matrix F may be the matrix 80c-7 shown in FIG. 8c-8 or a matrix obtained by performing row/column permutation on the matrix 80c-7, or the matrix 80c-8 shown in FIG. 8c-9 or a matrix obtained by performing row/column permutation on the matrix 80c-8; or if the lifting factor Z is one of {96, 104, 112, 120}, the shift matrix of the matrix F may be the matrix 80c-4 shown in FIG. 8c-5 or a matrix obtained by performing row/column permutation on the matrix 80c-4; or if the lifting factor Z is one of {128, 144, 160, 176, 192, 208, 224, 240}, the shift matrix of the matrix F may be the matrix 80c-5 shown in FIG. 8c-6 or a matrix obtained by performing row/column permutation on the matrix 80c-5; or if the lifting factor Z is one of {256, 288, 320, 352, 384}, the shift matrix of the matrix F may be the matrix 80c-6 shown in FIG. 8c-7 or a matrix obtained by performing row/column permutation on the matrix 80c-6.

In another possible implementation, if the lifting factor Z is any one of {15, 30, 60, 120, 240}, the shift matrix of the matrix F may be the matrix 80c-9 shown in FIG. 8c-10 or a matrix obtained by performing row/column permutation on the matrix 80c-9. Further, when Z is greater than or equal to 24, performance of the shift matrix of the matrix F is relatively high when the shift matrix is 80c-9.

Likewise, rows may be switched with each other, and columns may also be switched with each other in a base matrix. If at least one of row permutation or column permutation is performed on a base graph, same permutation is also performed on a corresponding base matrix.

It can be learned that, in the foregoing implementations, 80c-1 is a base matrix obtained by performing row permutation on base matrix 30c-6. 80c-2 is a base matrix obtained by performing row permutation on base matrix 30c-7. 80c-3 is a base matrix obtained by performing row permutation on base matrix 30c-8. 80c-4 is a base matrix obtained by performing row permutation on base matrix 30c-3. 80c-5 is a base matrix obtained by performing row permutation on base matrix 30c-4. 80c-6 is a base matrix obtained by performing row permutation on base matrix 30c-5. 80c-7 is a base matrix obtained by performing row permutation on base matrix 30c-9. 80c-8 is a base matrix obtained by performing row permutation on base matrix 30c-10.

A submatrix D in a base matrix 80c is replaced by $m_D$ rows in each shift matrix of the matrix F, to obtain base matrices that are of different code rates and correspond to the base graph 80a. If $m_D$=41, a matrix including row 5 to row 45 and column 0 to column 26 in the base matrix 80c is replaced by each shift matrix of the matrix F, to obtain each base matrix of 46 rows and 68 columns that corresponds to the base graph 80a. In this case, a code rate is ⅓.

It should be noted that because rows may be switched with each other and columns may be switched with each other in a base graph and a base matrix, in a possible implementation, the core matrix in the base graph 30a may be used as a core matrix in the base graph, that is, a part including a submatrix A and a submatrix B, and a submatrix D in the base graph may include $m_D$ rows in a matrix including row 5 to row 45 and column 0 to column 26 in the base graph 30a. Correspondingly, a core matrix in the base matrix may be one of 30b-3, 30b-4, 30b-5, 30b-6, 30b-7, 30b-8, 30b-9, or 30b-10, and a corresponding submatrix D may include $m_D$ rows in any one of the following matrices: 30c-3, 30c-4, 30c-5, 30c-6, 30c-7, 30c-8, 30c-9, or 30c-10. The core matrix and the corresponding submatrix D may be selected based on a lifting factor.

In another possible implementation, the core matrix in the base graph 80a may be used as a core matrix in a base graph, that is, a part including a submatrix A and a submatrix B, and a submatrix D in the base graph may include $m_D$ rows in a matrix including row 5 to row 45 and column 0 to column 26 in the base graph 80a. Correspondingly, a core matrix in a base matrix may be one of 80b-1, 80b-2, 80b-3, 80b-4, 80b-5, 80b-6, 80-7, 80b-8, or 80b-9, and a corresponding submatrix D may include $m_D$ rows in any one of the following matrices: 80c-1, 80c-2, 80c-3, 80c-4, 80c-5, 80c-6, 80c-7, 80c-8, or 80c-9. The core matrix and the corresponding submatrix D may be selected based on a lifting factor.

In another possible implementation, the core matrix in the base graph 80a may be used as a core matrix in a base graph, that is, a part including a submatrix A and a submatrix B, and a submatrix D in the base graph may include $m_D$ rows in a matrix including row 5 to row 45 and column 0 to column 26 in the base graph 170a, as shown in the base graph 170a. Correspondingly, a base matrix may include $m_D$ rows in row 5 to row 45 and row 0 to row 4 in a base matrix 170b shown in FIG. 11b.

In another possible implementation, the core matrix in the base graph 80a may be used as a core matrix in a base graph, and a submatrix D in the base graph may include $m_D$ rows in a matrix including row 5 to row 45 and column 0 to column 26 in the base graph shown in FIG. 12.

It may be understood that in this application, the quasi-orthogonal structure is not limited only to two adjacent rows, a matrix that meets the quasi-orthogonal structure may be designed to include a plurality of groups, each group includes at least two rows, for example, three rows or four rows, and rows included in each group are quasi-orthogonal.

In performance curve diagrams shown in FIG. 4 and FIG. 5, LDPC 1 indicates that the LDPC code is obtained by encoding based on base matrices corresponding to the base graph 30a, and LDPC 2 indicates a common LDPC code for comparison. A horizontal coordinate indicates a length of an information bit sequence, and a unit of the length is bit. A vertical coordinate is a symbol signal-to-noise ratio (Es/N0). Performance curves indicate performance of a symbol signal-to-noise ratio for LDPC 1 and LDPC 2 in cases of different information bit sequence lengths when BLERs are respectively 0.01 and 0.0001. A code rate R is ⅚ in FIG. 4, and a code rate R is ⅓ in FIG. 5. It can be learned that at a same BLER, a symbol signal-to-noise ratio of LDPC 1 is less than that of LDPC 2 in cases of different information bit sequence lengths, that is, performance of LDPC 1 is better than that of LDPC 2.

In an encoding method provided in an embodiment of the present application, an encoder encodes an input sequence by using an LDPC matrix. A base graph of the LDPC matrix may be any base graph in the foregoing examples, and a base matrix $H_B$ of the LDPC matrix may be any base matrix in the foregoing examples. The input sequence of the encoder may be an information bit sequence, or may be an information bit sequence obtained after at least one of the following processing: CRC attachment or filler bits insertion.

The encoding method further includes: determining a lifting factor Z. A value of the lifting factor Z may be determined based on a length K of the input sequence. Sometimes the information bit sequence is also referred to as a code block, and may be obtained by performing code block division on a transport block. If a length of the information bit sequence is Kc, a minimum value that meets 22*Z≥Kc may be determined from a plurality of lifting factors defined in the system. For example, if Kc=3800, and the lifting factors defined in the system include 16, 18, 20, 22, 24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, and 384, it may be determined that Z is 176. It should be noted that only examples are provided herein, and the examples do not constitute a limitation.

In a possible design, filling may be performed on the information bit sequence to obtain the input sequence, so that the length of the input sequence is $K=K_b*Z$, that is, $Z=K/K_b$. For example, values of filler bits may be null, 0, or other values agreed in the system. After the encoding, these filler bits can be identified and are not sent, which does not constitute a limitation in the present application.

That the encoder encoding the input sequence by using the LDPC matrix H may be encoding the input sequence by using the LDPC matrix corresponding to the lifting factor Z.

In a possible implementation, the input sequence is $c=\{c_0, c_1, c_2, \ldots, c_{K-1}\}$, a length of the input sequence c is K, and an output sequence obtained after the encoder encodes the input sequence c is $d=\{d_0, d_1, d_2, \ldots, d_{N-1}\}$. K is an integer greater than 0, and K may be an integer multiple of the lifting factor Z.

The output sequence d includes $K_0$ bits in the input sequence c and parity bits in a parity sequence w, $K_0$ is an integer greater than 0 and less than or equal to K, a length of the parity sequence w is $N-K_0$, and $w=\{w_0, w_1, w_2, \ldots, w_{N-K_0-1}\}$.

The parity sequence w and the input sequence c meet Formula (1):

$$H \times \begin{bmatrix} c^T \\ w^T \end{bmatrix} = 0^T \qquad (1)$$

where $c^T=[c_0, c_1, c_2, \ldots, c_{K-1}]^T$, $c^T$ T is a transposed vector of a vector including bits in the input sequence, $w^T=[w_0, w_1, w_2, \ldots, w_{N-K_0-1}]^T$, $w^T$ is a transposed vector of a vector including bits in the parity sequence, $0^T$ is a column vector, and values of all elements of $0^T$ are 0.

H is an LDPC matrix obtained according to any base graph described in the foregoing embodiments, and a base graph of H has m rows and n columns, and may be any base graph described in the foregoing embodiments, for example, 30a, 80a, 170a, and the base graph shown in FIG. 12.

In a design, the base graph of H includes p columns of built-in puncture bits, p is an integer greater than or equal to 0, information bits corresponding to the p columns of built-in puncture bits are not output, and the output sequence does not include the information bits corresponding to the p columns of built-in puncture bits. In this case, $K_0=K-p\times Z$. For example, if p=2, $K_0=K-2\times Z$, and the length of the parity sequence w is $N+2\times Z-K$. If the p columns of built-in puncture bits participate in encoding, $K_0=K$, and the length of the parity sequence w is N−K.

Correspondingly, H may have M rows and ($N+p\times Z$) columns or M rows and N columns, the base graph of H has M/Z rows and ($N+p\times Z$)/Z columns.

The base graph of the LDPC matrix H may be represented by $[H_{BG}\ H_{BG,EXT}]$, $$H_{BG,EXT} = \begin{bmatrix} 0_{m_c \times n_c} \\ I_{n_c \times n_c} \end{bmatrix},$$

$0_{m_c \times n_c}$ represents an all-zero matrix of size $m_c \times n_c$, and $I_{n_c \times n_c}$ represents an identity matrix of size $n_c \times n_c$.

In a possible design, if $0_{m_c \times n_c}$ is the submatrix C in the base graph in the foregoing embodiments, and $I_{n_c \times n_c}$ is the submatrix E in the foregoing embodiments, $$H_{BG} = \begin{bmatrix} [A\ B] \\ D \end{bmatrix},$$

where A, B, and D are respectively the submatrix A, the submatrix B, and the submatrix D in the base graph in the foregoing embodiments, $m_c=5$, $0 \le n_c \le 41$, a row count of $H_{BG}$ is less than or equal to 46 and greater than or equal to 5, and a column count of $H_{BG}$ is equal to 27.

In another possible design, because column 26 is a weight-1 matrix column, and a non-zero-element in column 26 is located in row 5, $0_{m_c \times n_c}$ may also include the first four rows in column 26 in the base graph in the foregoing embodiments and the first four rows in the submatrix C in the foregoing embodiments. $I_{n_c \times n_c}$ may also include the submatrix E in the base graph in the foregoing embodiments, row 5 to row 46 in column 26, and a last row in the submatrix C, where $m_c=4$, $0 \le n_c \le 42$. $H_{BG}$ is a matrix obtained after a last column is removed from a part including the submatrix A, the submatrix B, and the submatrix D in the base graph in the foregoing embodiments. A row count of $H_{BG}$ is less than or equal to 46 and greater than or equal to 5, and a column count of $H_{BG}$ is equal to 26. Optionally, if a code rate needs to be further increased, $H_{BG}$ may have four rows: row 0 to row 3.

Correspondingly, the LDPC matrix H may be represented by $H=[H_1\ H_2]$.

$H_1$ may be obtained after each zero-element in $H_{BG}$ is replaced by a Z*Z all-zero matrix and each non-zero-element is replaced by a Z*Z circular permutation matrix $h_{i,j}$. The circular permutation matrix $h_{i,j}$ is obtained by circularly shifting the identity matrix of size Z*Z to the right $P_{i,j}$ times, and sometimes is represented by $I(P_{i,j})$, where i is a row index, and j is a column index. In a possible design, $P_{i,j}=\mathrm{mod}(V_{i,j}, Z)$, and $V_{i,j}$ is a non-zero-element in row i and column j in a base matrix corresponding to a lifting factor set index corresponding to Z.

$H_2$ may be obtained after each zero-element in $H_{BG,EXT}$ is replaced by a Z*Z all-zero matrix and each non-zero-element is replaced by a Z*Z identity matrix.

The encoder may perform encoding and outputting in a plurality of manners. Any one of the base graph shown in FIG. 12, the base graph 80a, or the base graph 170a described in the foregoing embodiment is used as an example for description below. The base graph has a maximum of 46 rows and a maximum of 68 columns and includes two columns of built-in puncture bits. For ease of description, a base graph that has the most rows and the most columns is sometimes referred to as a complete base graph in the present application.

Manner 1:

Encoding is performed based on the complete base graph, so that as many parity bits as possible can be obtained. In this case, m=46, and n=68, which correspond to row 0 to row 45 and column 0 to column 67 in any one of the foregoing base graphs.

Correspondingly, M=46*Z for the LDPC matrix H. If the output sequence includes the information bits corresponding to the columns of built-in puncture bits, N=68*Z; or if the output sequence does not include the 2*Z information bits corresponding to the columns of built-in puncture bits, N=66*Z.

During subsequent processing, one or more information bits and one or more parity bits that need to be sent may be determined from the output sequence generated by the encoder.

Manner 2:

Encoding is performed based on some rows and some columns in the complete base graph. A row and a column may be selected, based on a code rate that needs to be sent, or a quantity of information bits and a quantity of parity bits, or the like, from the complete base graph for encoding.

For example, the code rate is 5/6, m=5, and n=27, that is, encoding is performed based on row 0 to row 4 and column 0 to column 26 in any one of the foregoing base graphs.

Correspondingly, M=5*Z for the LDPC matrix H. If the output sequence includes the information bits corresponding to the columns of built-in puncture bits, N=27*Z; or if the output sequence does not include the information bits corresponding to the columns of built-in puncture bits, N=25*Z.

For another example, the code rate is 1/3, m=46, and n=68.

It can be learned that in this manner, size of the base graph of H meet $5 \le m \le 46$ and $27 \le n \le 68$, and correspondingly, for the LDPC matrix H, $5 \times Z \le M \le 46 \times Z$ and $27 \times Z \le N \le 68 \times Z$.

In a possible design, the $26^{th}$ column in any base graph described above is a weight-1 matrix column, and puncturing may be performed on the weight-1 matrix column in the core matrix, so that the core matrix is decreased by one row and one column accordingly, and m=4 and n=26, that is, encoding is performed based on row 0 to row 3 and column 0 to column 25 in any base graph described above. A higher code rate can be obtained in this manner. Therefore, size of the base graph meet $4 \le m \le 46$ and $26 \le n \le 68$, and correspondingly, for the LDPC matrix H, $4 \times Z \le M \le 46 \times Z$ and $26 \times Z \le N \le 68 \times Z$.

In the foregoing implementations, the base matrix $H_B$ of the LDPC matrix H may be any base matrix described in the foregoing embodiments or a base matrix obtained by performing row permutation, or column permutation, or row permutation and column permutation on any base matrix described above. A base graph of the base matrix $H_B$ includes at least a submatrix A and a submatrix B, and may further include a submatrix C, a submatrix D, and a submatrix E. For the submatrices, refer to the descriptions in the foregoing embodiments, and details are not described herein again. Certainly, the base matrix $H_B$ may be another base matrix whose base graph complies with the base graph shown in the foregoing embodiments, and the base matrix $H_B$ is not limited thereto in the present application.

In a possible implementation, a base matrix $H_B$ of an LDPC code may be stored in a memory, and the encoder obtains an LDPC matrix corresponding to a lifting factor Z, so as to encode the input sequence.

In another possible implementation, because there are a plurality of base matrices $H_B$ of an LDPC code, and relatively large storage space is occupied if the base matrices $H_B$ are stored based on a matrix structure, a base graph of the LDPC code may be stored in a memory, shift values of non-zero-elements in each base matrix may be stored by row or by column, and then an LDPC matrix may be obtained based on the base graph and a shift value in a base matrix corresponding to a lifting factor Z.

The base graph may indicate a position of the non-zero-element in each base matrix. In another possible implementation, storing a base graph may be storing a position of a non-zero-element in the base graph. The position of the non-zero-element may be indicated by a row and a column in which the non-zero-element is located, for example, a position of a column in which a non-zero-element in each row is located, or a position of a row in which a non-zero-element in each column is located. In another possible implementation, storing a base graph may be storing a position of a zero-element in the base graph. Likewise, the position of the zero-element may also be indicated by a row and a column in which the zero-element is located, for example, a position of a column in which a zero-element in each row is located, or a position of a row in which a zero-element in each column is located, and a corresponding position of a non-zero-element may be obtained by excluding the position of the zero-element. It should be noted that only examples are provided herein, and the examples do not constitute a limitation in the present application.

In a design, parameters related to a base graph or a base matrix may be expressed in a table. For example, related parameters or tables may be stored in one or more memories. Related parameters such as a row index of a base graph or a base matrix, or a column in which a non-zero-element is located are read from the memory, so as to obtain the base graph or the base matrix. Optionally, a weight of each row and a shift value of a non-zero-element in each row may be further stored.

Base graph 170a in FIG. 11a is used as an example for description below. For another base graph or base matrix provided in this application, refer to similar designs.

For example, the core matrix in the base graph 80a, the base graph 170a, or the base graph shown in FIG. 12 may be expressed in Table 3.

TABLE 3

| Row index | Row weight | Column index of non-zero-elements in row |
|---|---|---|
| 0 | 19 | 0, 1, 2, 3, 5, 6, 9, 10, 11, 12, 13, 15, 16, 18, 19, 20, 21, 22, 23 |

TABLE 3-continued

| Row index | Row weight | Column index of non-zero-elements in row |
|---|---|---|
| 1 | 19 | 0, 2, 3, 4, 5, 7, 8, 9, 11, 12, 14, 15, 16, 17, 19, 21, 22, 23, 24 |
| 2 | 19 | 0, 1, 2, 4, 5, 6, 7, 8, 9, 10, 13, 14, 15, 17, 18, 19, 20, 24, 25 |
| 3 | 19 | 0, 1, 3, 4, 6, 7, 8, 10, 11, 12, 13, 14, 16, 17, 18, 20, 21, 22, 25 |
| 4 | 3 | 0, 1, 26 |

For example, a base graph of an LDPC matrix may include a core part shown in Table 3. Another part of the base graph of the LDPC matrix may be shown in the base graph 80a, the base graph 170a, or the base graph shown in FIG. 12, or another structure described in this application, or another matrix structure, and this is not limited in this application.

The base graph 170a is used as another example. Parameters related to the first 24 rows in the base graph may be shown in Table 4. Parameters related to other rows are similar and are not listed in Table 4 due to space limitation.

TABLE 4

| Row index | Row weight | Column index of non-zero-elements in row |
|---|---|---|
| 0 | 19 | 0, 1, 2, 3, 5, 6, 9, 10, 11, 12, 13, 15, 16, 18, 19, 20, 21, 22, 23 |
| 1 | 19 | 0, 2, 3, 4, 5, 7, 8, 9, 11, 12, 14, 15, 16, 17, 19, 21, 22, 23, 24 |
| 2 | 19 | 0, 1, 2, 4, 5, 6, 7, 8, 9, 10, 13, 14, 15, 17, 18, 19, 20, 24, 25 |
| 3 | 19 | 0, 1, 3, 4, 6, 7, 8, 10, 11, 12, 13, 14, 16, 17, 18, 20, 21, 22, 25 |
| 4 | 3 | 0, 1, 26 |
| 5 | 8 | 0, 1, 3, 12, 16, 21, 22, 27 |
| 6 | 9 | 0, 6, 10, 11, 13, 17, 18, 20, 28 |
| 7 | 7 | 0, 1, 4, 7, 8, 14, 29 |
| 8 | 10 | 0, 1, 3, 12, 16, 19, 21, 22, 24, 30 |
| 9 | 9 | 0, 1, 10, 11, 13, 17, 18, 20, 31 |
| 10 | 7 | 1, 2, 4, 7, 8, 14, 32 |
| 11 | 8 | 0, 1, 12, 16, 21, 22, 23, 33 |
| 12 | 7 | 0, 1, 10, 11, 13, 18, 34 |
| 13 | 6 | 0, 3, 7, 20, 23, 35 |
| 14 | 7 | 0, 12, 15, 16, 17, 21, 36 |
| 15 | 7 | 0, 1, 10, 13, 18, 25, 37 |
| 16 | 6 | 1, 3, 11, 20, 22, 38 |
| 17 | 6 | 0, 14, 16, 17, 21, 39 |
| 18 | 6 | 1, 12, 13, 18, 19, 40 |
| 19 | 6 | 0, 1, 7, 8, 10, 41 |
| 20 | 6 | 0, 3, 9, 11, 22, 42 |
| 21 | 6 | 1, 5, 16, 20, 21, 43 |
| 22 | 5 | 0, 12, 13, 17, 44 |
| 23 | 5 | 1, 2, 10, 18, 45 |
| ... | ... | ... |

It should be noted that only examples are provided herein, and the examples do not constitute a limitation. Related parameters of another base graph or base matrix provided in this application may also be expressed in a similar table. It may be understood that the base graph 170a, Table 3, and Table 4 are intended to help understand design of the base graph and the base matrix. A representation form is not limited only to the base graph 170a or a representation form in Table 3 or Table 4. Another possible variation may be included.

In an implementation, a column index, a column weight, and a row in which a non-zero-element is located or a row in which a zero-element is located, for example, a form in Table 5 may be used.

TABLE 5

| Column index | Column weight | Row index of non-zero-elements in column |
|---|---|---|
| 0 | 5 | 0, 1, 2, 3, 4 |
| 1 | 4 | 0, 2, 3, 4, |
| 2 | 3 | 0, 1, 2 |
| 3 | 3 | 0, 1, 3 |
| 4 | 3 | 1, 2, 3 |
| 5 | 3 | 0, 1, 2 |
| 6 | 3 | 0, 2, 3 |
| 7 | 3 | 1, 2, 3 |
| 8 | 3 | 1, 2, 3 |
| 9 | 3 | 0, 1, 2 |
| 10 | 3 | 0, 2, 3 |
| 11 | 3 | 0, 1, 3 |
| 12 | 3 | 0, 1, 3 |
| 13 | 3 | 0, 2, 3 |
| 14 | 3 | 1, 2, 3 |
| 15 | 3 | 0, 1, 2 |
| 16 | 3 | 0, 1, 3 |
| 17 | 3 | 1, 2, 3 |
| 18 | 3 | 0, 2, 3 |
| 19 | 3 | 0, 1, 2 |
| 20 | 3 | 0, 2, 3 |
| 21 | 3 | 0, 1, 3 |
| 22 | 3 | 0, 1, 3 |
| 23 | 2 | 0, 1 |
| 24 | 2 | 1, 2 |
| 25 | 2 | 2, 3 |
| 26 | 1 | 4 |

In an implementation, the parameter "row weight" or "column weight" in Table 3, Table 4, or Table 5 may be omitted. A quantity of non-zero-elements in a row or a column may be learned from a column or a row in which a non-zero-element is located in the row or the column. Therefore, a row weight or a column weight is also learned.

In an implementation, parameter values in "column in which a non-zero-element is located" in Table 3 or Table 4 or parameter values in "row in which a non-zero-element is located" in Table 5 may not be sorted in ascending order provided that a column in which a non-zero-element is located or a row in which a non-zero-element is located can be retrieved in the parameter values.

In an implementation, Table 3 or Table 4 may further include a column of "shift value of a non-zero-element", and parameter values in the column of "shift value of a non-zero-element" are in a one-to-one correspondence with parameter values in "column in which a non-zero-element is located". Table 5 may further include a column of "shift value of a non-zero-element", and parameter values in the column of "shift value of a non-zero-element" are in a one-to-one correspondence with parameter values in "row in which a non-zero-element is located".

In a design, to save storage space, a position of a non-zero-element in a part with a relatively fixed structure in a base graph may be calculated based on a row index or a column index without the position being stored. For example, a submatrix E is a diagonal matrix, and includes a non-zero-element only on a diagonal. A position of a column in which a non-zero-element is located in the submatrix E may be calculated based on a row index, or a position of a row in which a non-zero-element is located may be calculated based on a column index. In an example of any one of the base graph 80a, the base graph 170a, or the base graph in FIG. 12, an index of a column in which a non-zero-element is located in row $m_e$ is $m_e+K_b$, where $m_e \geq 4$, and $K_b=22$. For example, a column in which a non-zero-element in row 7 is located is column 29. For another example, a bi-diagonal structure B' in a submatrix B is located in row 0 to row 3 and column 23 to column 25 in any one of the base graph 80a, the base graph 170a, or the base graph shown in FIG. 12. A column index of a column in which a non-zero-element in the bi-diagonal structure B' is located may be calculated based on a row index, or a row index of a row in which a non-zero-element is located may be calculated based on a column index. Positions of non-zero-elements in row $m_B$ include column $m_B+K_b$ and column $m_B+K_b+1$, where $0<m_B<3$. A position of a non-zero-element in row $m_B$ is column $m_B+K_b$, where $m_B=0$ or $m_B=3$. For another example, for a weight-1 matrix column in a submatrix B, that is, column 26 in any one of the base graph 80a, the base graph 170a, or the base graph in FIG. 12, a position of a non-zero-element in row $m_B$ is column $m_B+K_b$, where $m_B=4$.

Table 6 shows parameters related to the rows in FIG. 12. Positions of columns in which non-zero-elements in column 0 to column 25 are located may be stored whereas positions of columns in which non-zero-elements in column 26 to column 68 are located are not stored, that is, columns in which non-zero-elements in weight-1 matrix columns in the submatrix E and the submatrix B are located are not stored. Table 6 may be used to represent $H_{BG}$ whose column index is 26.

TABLE 6

| Row index | Row weight | Column index in which a non-zero-element is located |
|---|---|---|
| 0 | 19 | 0, 1, 2, 3, 5, 6, 9, 10, 11, 12, 13, 15, 16, 18, 19, 20, 21, 22, 23 |
| 1 | 19 | 0, 2, 3, 4, 5, 7, 8, 9, 11, 12, 14, 15, 16, 17, 19, 21, 22, 23, 24 |
| 2 | 19 | 0, 1, 2, 4, 5, 6, 7, 8, 9, 10, 13, 14, 15, 17, 18, 19, 20, 24, 25 |
| 3 | 19 | 0, 1, 3, 4, 6, 7, 8, 10, 11, 12, 13, 14, 16, 17, 18, 20, 21, 22, 25 |
| 4 | 2 | 0, 1 |
| 5 | 7 | 0, 1, 3, 12, 16, 21, 22 |
| 6 | 8 | 0, 6, 10, 11, 13, 17, 18, 20 |
| 7 | 6 | 0, 1, 4, 7, 8, 14 |
| 8 | 9 | 0, 1, 3, 12, 16, 19, 21, 22, 24 |
| 9 | 8 | 0, 1, 10, 11, 13, 17, 18, 20 |
| 10 | 6 | 1, 2, 4, 7, 8, 14 |
| 11 | 7 | 0, 1, 12, 16, 21, 22, 23 |
| 12 | 6 | 0, 1, 10, 11, 13, 18 |
| 13 | 5 | 0, 3, 7, 20, 23 |
| 14 | 6 | 0, 12, 15, 16, 17, 21 |
| 15 | 6 | 0, 1, 10, 13, 18, 25 |
| 16 | 5 | 1, 3, 11, 20, 22 |
| 17 | 5 | 0, 14, 16, 17, 21 |
| 18 | 5 | 1, 12, 13, 18, 19 |
| 19 | 5 | 0, 1, 7, 8, 10 |
| 20 | 5 | 0, 3, 9, 11, 22 |
| 21 | 5 | 1, 5, 16, 20, 21 |
| 22 | 4 | 0, 12, 13, 17 |
| 23 | 4 | 1, 2, 10, 18 |
| 24 | 5 | 0, 3, 4, 11, 22 |
| 25 | 4 | 1, 6, 7, 14 |
| 26 | 4 | 0, 2, 4, 15 |
| 27 | 3 | 1, 6, 8 |
| 28 | 4 | 0, 4, 19, 21 |
| 29 | 4 | 1, 14, 18, 25 |
| 30 | 4 | 0, 10, 13, 24 |
| 31 | 4 | 1, 7, 22, 25 |
| 32 | 4 | 0, 12, 14, 24 |
| 33 | 4 | 1, 2, 11, 21 |
| 34 | 4 | 0, 7, 15, 17 |
| 35 | 4 | 1, 6, 12, 22 |
| 36 | 4 | 0, 14, 15, 18 |
| 37 | 3 | 1, 13, 23 |
| 38 | 4 | 0, 9, 10, 12 |
| 39 | 4 | 1, 3, 7, 19 |
| 40 | 3 | 0, 8, 17 |
| 41 | 4 | 1, 3, 9, 18 |

TABLE 6-continued

| Row index | Row weight | Column index in which a non-zero-element is located |
|---|---|---|
| 42 | 3 | 0, 4, 24 |
| 43 | 4 | 1, 16, 18, 25 |
| 44 | 4 | 0, 7, 9, 22 |
| 45 | 3 | 1, 6, 10 |

Table 7 shows parameters related to the rows in FIG. 12. Positions of columns in which non-zero-elements in column 0 to column 26 are located may be stored whereas positions of columns in which non-zero-elements in column 27 to column 68 are located are not stored, that is, columns in which non-zero-elements in the submatrix E are located are not stored. Table 7 may be used to represent $H_{BG}$ whose column index is 27.

TABLE 7

| Row index | Row weight | Column index in which a non-zero-element is located |
|---|---|---|
| 0 | 19 | 0, 1, 2, 3, 5, 6, 9, 10, 11, 12, 13, 15, 16, 18, 19, 20, 21, 22, 23 |
| 1 | 19 | 0, 2, 3, 4, 5, 7, 8, 9, 11, 12, 14, 15, 16, 17, 19, 21, 22, 23, 24 |
| 2 | 19 | 0, 1, 2, 4, 5, 6, 7, 8, 9, 10, 13, 14, 15, 17, 18, 19, 20, 24, 25 |
| 3 | 19 | 0, 1, 3, 4, 6, 7, 8, 10, 11, 12, 13, 14, 16, 17, 18, 20, 21, 22, 25 |
| 4 | 3 | 0, 1, 26 |
| 5 | 7 | 0, 1, 3, 12, 16, 21, 22 |
| 6 | 8 | 0, 6, 10, 11, 13, 17, 18, 20 |
| 7 | 6 | 0, 1, 4, 7, 8, 14 |
| 8 | 9 | 0, 1, 3, 12, 16, 19, 21, 22, 24 |
| 9 | 8 | 0, 1, 10, 11, 13, 17, 18, 20 |
| 10 | 6 | 1, 2, 4, 7, 8, 14 |
| 11 | 7 | 0, 1, 12, 16, 21, 22, 23 |
| 12 | 6 | 0, 1, 10, 11, 13, 18 |
| 13 | 5 | 0, 3, 7, 20, 23 |
| 14 | 6 | 0, 12, 15, 16, 17, 21 |
| 15 | 6 | 0, 1, 10, 13, 18, 25 |
| 16 | 5 | 1, 3, 11, 20, 22 |
| 17 | 5 | 0, 14, 16, 17, 21 |
| 18 | 5 | 1, 12, 13, 18, 19 |
| 19 | 5 | 0, 1, 7, 8, 10 |
| 20 | 5 | 0, 3, 9, 11, 22 |
| 21 | 5 | 1, 5, 16, 20, 21 |
| 22 | 4 | 0, 12, 13, 17 |
| 23 | 4 | 1, 2, 10, 18 |
| 24 | 5 | 0, 3, 4, 11, 22 |
| 25 | 4 | 1, 6, 7, 14 |
| 26 | 4 | 0, 2, 4, 15 |
| 27 | 3 | 1, 6, 8 |
| 28 | 4 | 0, 4, 19, 21 |
| 29 | 4 | 1, 14, 18, 25 |
| 30 | 4 | 0, 10, 13, 24 |
| 31 | 4 | 1, 7, 22, 25 |
| 32 | 4 | 0, 12, 14, 24 |
| 33 | 4 | 1, 2, 11, 21 |
| 34 | 4 | 0, 7, 15, 17 |
| 35 | 4 | 1, 6, 12, 22 |
| 36 | 4 | 0, 14, 15, 18 |
| 37 | 3 | 1, 13, 23 |
| 38 | 4 | 0, 9, 10, 12 |
| 39 | 4 | 1, 3, 7, 19 |
| 40 | 3 | 0, 8, 17 |
| 41 | 4 | 1, 3, 9, 18 |
| 42 | 3 | 0, 4, 24 |
| 43 | 4 | 1, 16, 18, 25 |
| 44 | 4 | 0, 7, 9, 22 |
| 45 | 3 | 1, 6, 10 |

In the foregoing designs, the column of "row weight" is optional. In a possible design, 1 and 0 in each row or each column in a base graph may be considered as binary numerals, and storing the binary numerals in decimal numerals or hexadecimal numerals can save storage space. Any one of the foregoing base graphs is used as an example. Positions of non-zero-elements in the first 26 columns or the first 27 columns may be stored in four hexadecimal numerals in each row. For example, if the first 26 columns in row 0 are 11110110 01111101 10111111 00, positions of non-zero-elements in row 0 may be denoted as 0xF6, 0x7D, 0xBF, and 0x00. To be specific, every eight columns form one hexadecimal numeral. 0 may be filled for the last two or three columns to obtain eight digits, so that a corresponding hexadecimal numeral is obtained. The same is true of another row, and details are not described herein again.

When the information bit sequence is to be encoded, the base matrix $H_B$ may be expanded based on the lifting factor Z to obtain the LDPC matrix H used for encoding. A circular permutation matrix $h_{i,j}$ of size Z*Z is determined for each non-zero-element $P_{i,j}$ in the base matrix $H_B$, where $h_{i,j}$ is a circular permutation matrix obtained by circularly shifting an identity matrix $P_{i,j}$ times. A non-zero-element $P_{i,j}$ is replaced by $h_{i,j}$ and a zero-element in the base matrix $H_B$ is replaced by an all-zero matrix of size Z*Z, so as to obtain the parity-check matrix H.

In a possible design, for the lifting factor Z, an element $P_{i,j}$ in row i and column j in the base matrix $H_B$ may meet a relationship shown in (2):

$$P_{i,j} = \begin{cases} -1 & V_{i,j} = -1 \\ \mod(V_{i,j}, Z) & V_{i,j} \geq 0 \end{cases} \quad (2)$$

where $V_{i,j}$ may be a shift value of an element in row i and column j in a base matrix of a set to which the lifting factor Z belongs, or a shift value of a non-zero-element in row i and column j in a base matrix corresponding to a maximum lifting factor in a set to which the lifting factor Z belongs.

A correspondence between a base matrix index and a set of lifting factors Z that is shown in Table 2 is used as an example. Z=13, and an element $P_{i,j}$ in row i and column j in a base matrix of Z meets (2).

$V_{i,j}$ is a shift value of a non-zero-element in row i and column j in a base matrix indicated by PCM 7. For Z=13, a modulo operation is performed by taking the shift value $V_{i,j}$ modulo Z, where Z=13, and $V_{i,j}$ is a shift value of the non-zero-element in the row i and the column j in the base matrix indicated by PCM 7.

It should be noted that only examples are provided herein, and the examples do not constitute a limitation in the present application.

The base graph 80a or the base graph 170a is used as an example. After a base matrix $H_B$ is determined, one or more parity bits corresponding to column 22 to column 25 in the base matrix may be first obtained by using the input sequence and row 0 to row 3 and column 0 to column 25 (i.e. $H_{core-dual}$). One or more parity bits corresponding to column 26 (that is, a weight-1 matrix column) may be obtained based on the input sequence and one or more parity bits corresponding to $H_{core-dual}$. The encoding may be performed based on the input sequence, the one or more parity bits corresponding to column 22 to column 26, and a submatrix D, to obtain one or more parity bits corresponding to a submatrix E. In this way, encoding is completed. For an encoding process of an LDPC code, refer to the descriptions in the foregoing implementations, and details are not described herein again.

In the communications system, the LDPC code may be obtained after encoding is performed in the foregoing method. After the LDPC code is obtained, a communications apparatus may further perform one or more of the following operations: performing rate matching on the LDPC code; performing, based on an interleaving scheme, interleaving on an LDPC code obtained after the rate matching; modulating, based on a modulation scheme, an LDPC code obtained after the interleaving, to obtain a bit sequence X; or sending the bit sequence X.

In a decoding method provided in another embodiment of the present application, a decoder decodes an input sequence by using an LDPC matrix. A base graph of the LDPC matrix may be any base graph in the foregoing examples, and a base matrix $H_B$ of the LDPC matrix may be any base matrix in the foregoing examples. The input sequence of the decoder may be a soft value sequence of an LDPC code.

The method further includes: determining a lifting factor Z. A communications device at a receive end may receive a signal including an LDPC code, obtain a soft value sequence of the LDPC code in the signal, and determine the corresponding lifting factor Z.

That the decoder decodes the input sequence by using the LDPC matrix H may be decoding the soft value sequence of the LDPC code by using an LDPC matrix H corresponding to the lifting factor Z.

Because decoding is an inverse process of encoding, for descriptions of the LDPC matrix H and the base graph of the LDPC matrix H, refer to the foregoing encoding embodiment. Decoding may be performed based on a complete base graph, or decoding may be performed based on some rows or some columns in a complete base graph.

The base matrix $H_B$ of the LDPC matrix H may be any base matrix described in the foregoing embodiments or a base matrix obtained by performing row permutation, or column permutation, or row permutation and column permutation on any base matrix described above. A base graph of the base matrix $H_B$ includes at least a submatrix A and a submatrix B, and may further include a submatrix C, a submatrix D, and a submatrix E. For the submatrices, refer to the descriptions in the foregoing embodiments, and details are not described herein again. Certainly, the base matrix $H_B$ may be another base matrix whose base graph complies with the base graph shown in the foregoing embodiments, and the base matrix $H_B$ is not limited thereto in the present application.

In a possible design, the base matrix $H_B$ of the LDPC code may be stored in a memory, the soft value sequence of the LDPC code may be decoded after the LDPC matrix corresponding to the lifting factor Z is obtained.

In another possible implementation, because there are a plurality of base matrices of an LDPC code, and relatively large storage space is occupied if the base matrices are stored based on a matrix structure, a base graph of the LDPC code may be stored in a memory, shift values of non-zero-elements in each base matrix may be stored by row or by column, and then an LDPC matrix may be obtained based on the base graph and a shift value in a base matrix corresponding to a lifting factor Z.

The base graph may be stored in various manners described in the foregoing encoding embodiment.

It should be noted that only examples are provided herein, and the examples do not constitute a limitation.

Decoding is an inverse process of encoding, and the base matrix $H_B$ used during the decoding has a same characteristic as the base matrix in the encoding method embodiment.

For lifting the base matrix $H_B$ to obtain the LDPC matrix H, also refer to the encoding method embodiment.

In the communications system, before the decoding method, a communications apparatus may further perform one or more of the following operations: receiving a signal including an LDPC code; or performing demodulation, de-interleaving, or de-rate matching on the signal to obtain a soft value sequence of the LDPC code.

In a possible implementation, one or more of the following may be stored:
(a) parameters used to obtain any base matrix $H_B$ described in the foregoing implementations, where the base matrix $H_B$ may be obtained based on the parameters. For example, the parameters may include one or more of the following: a row index, a row weight, a column index, or a column weight of a base graph and/or a base matrix, a position of a non-zero-element in a base graph and/or a base matrix, a shift value in a base matrix, a shift value of a non-zero-element and a corresponding position, a compensation value, a lifting factor, a lifting factor set, a base graph of a base matrix, or a code rate;
(b) any base matrix $H_B$ described in the foregoing implementations;
(c) a matrix lifted from the base matrix $H_B$;
(d) a base matrix obtained by performing row/column permutation on any base matrix $H_B$ described in the foregoing implementations, where row/column permutation is row permutation, or column permutation, or row permutation and column permutation in this application; or
(e) a matrix lifted from the base matrix obtained by performing the row/column permutation.

In a possible implementation, an input sequence may be encoded or decoded by using a low-density parity-check (LDPC) matrix in one or more of the following manners during encoding or decoding:

Obtain a base matrix $H_B$ based on the parameter described in the forgoing (a); and perform encoding or decoding based on the obtained base matrix $H_B$; or perform row/column permutation based on the obtained base matrix $H_B$, and perform encoding or decoding based on a base matrix obtained by performing the row/column permutation, where encoding or decoding is performed based on the base matrix herein, and optionally, encoding or decoding may be performed based on an lifted matrix of the base matrix;

perform encoding or decoding based on a base matrix stored in (b) or (d) (a stored base matrix $H_B$ or a stored base matrix obtained by performing row/column permutation on a base matrix $H_B$); or perform row/column permutation on the stored base matrix, and perform encoding or decoding based on a base matrix obtained by performing the row/column permutation, where encoding or decoding is performed based on the base matrix herein, and optionally, encoding or decoding may be performed based on an lifted matrix of the base matrix; or perform encoding or decoding based on (c) or (e).

The lifting in this application may be obtaining a lifted matrix after a matrix is transformed or processed, and a lifting manner is not limited in this application. In an implementation, the lifting may be performing compensation processing on a matrix. For example, each shift value greater than or equal to 0 in a base matrix is increased or decreased by a compensation value, to obtain a compensated matrix. In another implementation, the lifting may be lifting a row and a column in a matrix, to obtain a lifted matrix. In another implementation, the lifting may be converting a non-zero value in a matrix.

The storing in this application may be storing in one or more memories. The one or more memories may be separately disposed, or may be integrated into the encoder, the decoder, a processor, a chip, the communications apparatus, or a terminal. Some of the one or more memories may be separately disposed, and the others may be integrated into the decoder, a processor, a chip, the communications apparatus, or a terminal. A type of the memory may be any form of storage medium, and the type is not limited in this application.

FIG. 6 is a schematic structural diagram of a communications apparatus 600. The apparatus 600 is configured to implement the method described in the foregoing embodiments. The descriptions in the foregoing method embodiments are referred to for details. The communications apparatus 600 may be a chip, a base station, a terminal, or another network device.

The communications apparatus 600 includes one or more processors 601. The processor 601 may be a general-purpose processor, a dedicated processor, or the like. For example, the processor 601 may be a baseband processor or a central processing unit. The baseband processor may be configured to perform processing on a communication protocol and communication data. The central processing unit may be configured to control the communications apparatus (such as the base station, the terminal, or the chip), execute a software program, and process data of the software program.

In a possible design, the one or more processors 601 may implement functions of the foregoing encoder. In another possible design, the encoder may be a part of the processor 601, and the processor 601 may implement other functions in addition to functions of the encoder.

The communications apparatus 600 encodes an input sequence by using an LDPC matrix. A base graph of the LDPC matrix may be any base graph in the foregoing examples or a base graph obtained by performing row permutation, or column permutation, or row permutation and column permutation on any base graph described above. A base matrix $H_B$ of the LDPC matrix may be any base matrix in the foregoing embodiment or a base matrix obtained by performing row permutation, or column permutation, or row permutation and column permutation on any base matrix described above. The input sequence of the encoder may be an information bit sequence.

In a possible design, the one or more processors 601 may implement functions of the foregoing decoder. In another possible design, the decoder may be a part of the processor 601.

The communications apparatus 600 may further be configured to decode an input sequence by using an LDPC matrix. A base graph of the LDPC matrix may be any base graph in the foregoing examples or a base graph obtained by performing row permutation, or column permutation, or row permutation and column permutation on any base graph described above. A base matrix $H_B$ of the LDPC matrix may be any base matrix in the foregoing examples or a base matrix obtained by performing row permutation, or column permutation, or row permutation and column permutation on any base matrix described above. The input sequence of the decoder may be a soft value sequence.

Optionally, in a design, the processor 601 may also include an instruction 603. The instruction can be run on the processor, to cause the communications apparatus 600 to perform the method described in the foregoing embodiments.

In another possible design, the communications apparatus 600 may also include a circuit, and the circuit may implement functions of the encoder, the decoder, or the encoder and the decoder in the foregoing embodiments.

Optionally, the communications apparatus 600 may include one or more memories 602. The memory stores an instruction 604, and the instruction can be run on the processor, to cause the communications apparatus 600 to perform the method described in the foregoing method embodiment. Optionally, the memory may further store data. Optionally, the processor may also store an instruction and/or data. The processor and the memory may be separately disposed, or may be integrated together. Optionally, the one or more memories 602 may store a parameter related to a base matrix, for example, a shift value, a base graph, a matrix lifted from a base graph, rows in the base matrix, or a lifting factor. Optionally, the one or more memories 602 may store a base matrix or a matrix lifted from a base matrix.

Optionally, the communications apparatus 600 may further include a transceiver 605 and an antenna 606. The processor 601 may be referred to as a processing unit, and controls the communications apparatus (the terminal or the base station). The transceiver 605 may be referred to as a transceiver unit or a transceiver circuit, and is configured to implement a transceiving function of the communications apparatus by using the antenna 606.

Optionally, the communications apparatus 600 may further include a component configured to generate a transport block CRC, a component used for code block segmentation and CRC check, an interleaver used for interleaving, a modulator used for modulation processing, or the like. Functions of these components may be implemented by the one or more processors 601.

Optionally, the communications apparatus 600 may further include a demodulator used for demodulation, a de-interleaver used for de-interleaving, a component used for de-rate matching, or the like. Functions of these components may be implemented by the one or more processors 601.

FIG. 7 is a schematic diagram of a communications system 700. The communications system 700 includes a communications device 70 and a communications device 71. The communications device 70 and the communications device 71 receive information data from each other and send information data to each other. The communications device 70 and the communications device 71 may be, for example, the communications apparatus 600 shown in FIG. 6, or the communications device 70 and the communications device 71 each includes the communications apparatus 600 shown in FIG. 6. For example, the communications device 70 may be a terminal, and correspondingly, the communications device 71 may be a base station. For another example, the communications device 70 is a base station, and correspondingly, the communications device 71 may be a terminal.

Various illustrative logical blocks and steps that are listed in the embodiments of the present application may be implemented by using electronic hardware, computer software, or a combination thereof. Whether the functions are implemented by using hardware or software depends on particular applications and a design requirement of the entire system. Various methods may be used to implement the described functions for each particular application, but it should not be considered that the implementation goes beyond the scope of the embodiments of the present application.

The various illustrative logical units and circuits described in the embodiments of the present application may implement or operate the described functions by using a general-purpose processor, a digital signal processor, an application-specific integrated circuit (ASIC), a field programmable gate array (FPGA) or another programmable logical apparatus, a discrete gate or transistor logic, a discrete hardware component, or a design of any combination thereof. The general-purpose processor may be a microprocessor. Optionally, the general-purpose processor may be any conventional processor, controller, microcontroller, or state machine. The processor may be implemented by a combination of computing apparatuses, such as a digital signal processor and a microprocessor, a plurality of microprocessors, one or more microprocessors with a digital signal processor core, or any other similar configuration.

Steps of the methods or algorithms described in the embodiments of the present application may be directly embedded into hardware, an instruction executed by a processor, or a combination thereof. The memory may be a random access memory (RAM), a flash memory, a read-only memory (ROM), an erasable programmable read-only memory (EPROM) memory, an electrically erasable programmable read-only memory (EEPROM) memory, a register, a hard disk, a removable magnetic disk, a compact disc read-only memory (CD-ROM), or a storage medium of any other form in the art. For example, the memory may be connected to the processor, so that the processor can read information from the memory and write information to the memory. Optionally, the memory may be integrated into the processor. The processor and the memory may be disposed in an ASIC, and the ASIC may be disposed in the communications apparatus (such as the base station or the terminal). Optionally, the processor and the memory may be disposed in different components of the communications apparatus.

With descriptions of the foregoing implementations, it is understood that the present application may be implemented by hardware, firmware, or a combination thereof. When the present application is implemented by a software program, the present application may be all or partially implemented in a form of a computer program product. The computer program product includes one or more computer instructions. When the computer instructions are loaded and executed on the computer, the procedure or functions according to the embodiments of the present application are all or partially generated. When the present application is implemented by a software program, the foregoing functions may be stored in a computer readable medium or transmitted as one or more instructions or code in the computer readable medium. The computer may be a general-purpose computer, a dedicated computer, a computer network, or another programmable apparatus. The computer instruction may be stored in a computer readable storage medium, or may be transmitted from one computer readable storage medium to another. The computer readable medium includes a computer storage medium and a communications medium, where the communications medium includes any medium that enables a computer program to be transmitted from one place to another. The storage medium may be any available medium accessible to a computer. The following provides an example but does not impose a limitation: The computer readable medium may include a RAM, a ROM, an EEPROM, a CD-ROM, or another optical disc storage or disk storage medium, or another magnetic storage device, or any other medium that can carry or store expected program code in a form of an instruction or a data structure and can be accessed by a computer. In addition, any connection may be appropriately defined as a computer readable medium. For example, if software is transmitted from a website, a server, or another remote source by using a coaxial cable, an optical fiber/cable, a twisted pair, a digital subscriber line (DSL), or wireless technologies such as infrared ray, radio, and microwave, the coaxial cable, optical fiber/cable, twisted pair, DSL, or wireless technologies such as infrared ray, radio, and microwave are included in a definition of a medium to which they belong. For example, a disk or a disc used by the present application includes a compact disc (CD), a laser disc, an optical disc, a digital versatile disc (DVD), a floppy disk, and a Blu-ray disc, where the disk generally copies data by a magnetic means, and the disc copies data optically by a laser means. The foregoing combination should also be included in the protection scope of the computer readable medium.

In this application, "/" indicates and/or. For example, encoding/decoding indicates encoding, decoding, or encoding and decoding.

In summary, what is described above is merely embodiments of the technical solutions of the present application, but is not intended to limit the protection scope of the present application. Any modification, equivalent replacement, or improvement made without departing from the principle of the present application shall fall within the protection scope of the present application.

What is claimed is:

1. A device in a wireless communication network, comprising:
a processor, a memory and a transceiver;
wherein the processor, by executing program instructions stored in the memory, is configured to:
   obtain an input sequence, wherein the input sequence comprises K bits of information, and K is a positive integer;
   determine a lifting factor Z according to K;
   encode the input sequence using an encoding matrix H, to obtain an encoded sequence; and
   output the encoded sequence for transmission by the transceiver;
wherein the encoding matrix H is obtained from a low density parity check (LDPC) base graph by replacing each element of the LDPC base graph with a matrix of Z rows and Z columns;
wherein the LDPC base graph comprises m rows and n columns, $5 \leq m \leq 46$, and $27 \leq n \leq 68$, and each element in the LDPC base graph has a value of 0 or 1;
wherein an element in the LDPC base graph has a value of 1 when:
   i=0, j=0, 1, 2, 3, 5, 6, 9, 10, 11, 12, 13, 15, 16, 18, 19, 20, 21, 22, or 23;
   i=1, j=0, 2, 3, 4, 5, 7, 8, 9, 11, 12, 14, 15, 16, 17, 19, 21, 22, 23, or 24;
   i=2, j=0, 1, 2, 4, 5, 6, 7, 8, 9, 10, 13, 14, 15, 17, 18, 19, 20, 24, or 25;
   i=3, j=0, 1, 3, 4, 6, 7, 8, 10, 11, 12, 13, 14, 16, 17, 18, 20, 21, 22, or 25;
   i=4, j=0, 1, or 26;
wherein i is a row index of the LDPC base graph, $0 \leq i \leq m$, j is a column index of the LDPC base graph, $0 \leq j < n$.

2. The device according to claim 1, wherein the LDPC base graph comprises 46 rows and 68 columns, and wherein an element in the LDPC base graph has the value of 1 when:
   i=0, j=0, 1, 2, 3, 5, 6, 9, 10, 11, 12, 13, 15, 16, 18, 19, 20, 21, 22, or 23;
   i=1, j=0, 2, 3, 4, 5, 7, 8, 9, 11, 12, 14, 15, 16, 17, 19, 21, 22, 23, or 24;

i=2, j=0, 1, 2, 4, 5, 6, 7, 8, 9, 10, 13, 14, 15, 17, 18, 19, 20, 24, or 25;
i=3, j=0, 1, 3, 4, 6, 7, 8, 10, 11, 12, 13, 14, 16, 17, 18, 20, 21, 22, or 25;
i=4, j=0, 1, or 26;
i=5, j=0, 1, 3, 12, 16, 21, 22, or 27;
i=6, j=0, 6, 10, 11, 13, 17, 18, 20, or 28;
i=7, j=0, 1, 4, 7, 8, 14, or 29;
i=8, j=0, 1, 3, 12, 16, 19, 21, 22, 24, or 30;
i=9, j=0, 1, 10, 11, 13, 17, 18, 20, or 31;
i=10, j=1, 2, 4, 7, 8, 14, or 32;
i=11, j=0, 1, 12, 16, 21, 22, 23, or 33;
i=12, j=0, 1, 10, 11, 13, 18, or 34;
i=13, j=0, 3, 7, 20, 23, or 35;
i=14, j=0, 12, 15, 16, 17, 21, or 36;
i=15, j=0, 1, 10, 13, 18, 25, or 37;
i=16, j=1, 3, 11, 20, 22, or 38;
i=17, j=0, 14, 16, 17, 21, or 39;
i=18, j=1, 12, 13, 18, 19, or 40;
i=19, j=0, 1, 7, 8, 10, or 41;
i=20, j=0, 3, 9, 11, 22, or 42;
i=21, j=1, 5, 16, 20, 21, or 43;
i=22, j=0, 12, 13, 17, or 44;
i=23, j=1, 2, 10, 18, or 45;
i=24, j=0, 3, 4, 11, 22, or 46;
i=25, j=1, 6, 7, 14, or 47;
i=26, j=0, 2, 4, 15, or 48;
i=27, j=1, 6, 8, or 49;
i=28, j=0, 4, 19, 21, or 50;
i=29, j=1, 14, 18, 25, or 51;
i=30, j=0, 10, 13, 24, or 52;
i=31, j=1, 7, 22, 25, or 53;
i=32, j=0, 12, 14, 24, or 54;
i=33, j=1, 2, 11, 21, or 55;
i=34, j=0, 7, 15, 17, or 56;
i=35, j=1, 6, 12, 22, or 57;
i=36, j=0, 14, 15, 18, or 58;
i=37, j=1, 13, 23, or 59;
i=38, j=0, 9, 10, 12, or 60;
i=39, j=1, 3, 7, 19, or 61;
i=40, j=0, 8, 17, or 62;
i=41, j=1, 3, 9, 18, or 63;
i=42, j=0, 4, 24, or 64;
i=43, j=1, 16, 18, 25, or 65;
i=44, j=0, 7, 9, 22, or 66;
i=45, j=1, 6, 10, or 67;
wherein i is a row index of the LDPC base graph, $0 \le i < 46$, j is a column index of the LDPC base graph, $0 \le j < 68$.

3. The device according to claim 2, wherein in obtaining the encoding matrix H by replacing each element of the LDPC base graph with a matrix of Z rows and Z columns, the processor is configured to:
replace each element of value 0 in the LDPC base graph with an all zero matrix of Z rows×Z columns; and
replace a {row index i, column index j} element of value 1 in the LDPC base graph by a circular permutation matrix $I(P_{i,j})$ of Z rows×Z columns, wherein the circular permutation matrix $I(P_{i,j})$ is obtained by circularly shifting an identity matrix of Z rows×Z columns to the right $P_{i,j}$ times, wherein $P_{i,j}=\text{mod}(V_{i,j}, Z)$, $V_{i,j}$ is a shift value corresponding to a lifting factor set index of Z, $V_{i,j}$ is an integer, and $V_{i,j} \ge 0$.

4. The device according to claim 1, wherein K=22×Z.

5. The device according to claim 1, wherein the input sequence is $c=\{c_0, c_1, c_2, \ldots, c_{K-1}\}$, the encoded sequence is $d=\{d_0, d_1, d_2, \ldots, d_{N-1}\}$, wherein $c_i$ (i=0, 1, ... K−1) are information bits, $d_j$ (j=0, 1, ... N−1) are encoded bits, N is a positive integer, and N=66×Z.

6. The device according to claim 5, wherein the encoded sequence d comprises $K_0$ bits obtained from the input sequence c and N−$K_0$ parity bits in a parity sequence $w=\{w_0, w_1, w_2, \ldots, w_{N-K_0-1}\}$, $K_0$ is an integer greater than 0 and less than or equal to K, wherein the parity sequence w and the input sequence c meet:

$$H \times \begin{bmatrix} c^T \\ w^T \end{bmatrix} = 0^T,$$

wherein $c^T=[c_0, c_1, c_2, \ldots, c_{K-1}]^T$ is a transposed vector including bits in the input sequence, $w^T=[w_0, w_1, w_2, \ldots, w_{N-L_0-1}]^T$ is a transposed vector including bits in the parity sequence, $0^T$ is a column vector, and values of all elements of $0^T$ are zero.

7. The device according to claim 6, wherein $K_0$=K−2×Z.

8. An apparatus in a communication device, comprising:
a processor and a memory storing program instructions;
wherein the processor, by executing the program instructions, is configured to:
obtain an input sequence, wherein the input sequence comprises K bits of information, and K is a positive integer;
determine a lifting factor Z according to K;
encode the input sequence using an encoding matrix H, to obtain an encoded sequence; and
output the encoded sequence;
wherein the encoding matrix H is obtained from a low density parity check (LDPC) base graph by replacing each element of the LDPC base graph with a matrix of Z rows and Z columns;
wherein the LDPC base graph comprises m rows and n columns, $5 \le m \le 46$, and $27 \le n \le 68$, and each element in the LDPC base graph has a value of 0 or 1;
wherein an element in the LDPC base graph has a value of 1 when:
i=0, j=0, 1, 2, 3, 5, 6, 9, 10, 11, 12, 13, 15, 16, 18, 19, 20, 21, 22, or 23;
i=1, j=0, 2, 3, 4, 5, 7, 8, 9, 11, 12, 14, 15, 16, 17, 19, 21, 22, 23, or 24;
i=2, j=0, 1, 2, 4, 5, 6, 7, 8, 9, 10, 13, 14, 15, 17, 18, 19, 20, 24, or 25;
i=3, j=0, 1, 3, 4, 6, 7, 8, 10, 11, 12, 13, 14, 16, 17, 18, 20, 21, 22, or 25;
i=4, j=0, 1, or 26;
wherein i is a row index of the LDPC base graph, $0 \le i < m$, j is a column index of the LDPC base graph, $0 \le j < n$.

9. The apparatus according to claim 8, wherein the LDPC base graph comprises 46 rows and 68 columns, and wherein an element in the LDPC base graph has the value of 1 when:
i=0, j=0, 1, 2, 3, 5, 6, 9, 10, 11, 12, 13, 15, 16, 18, 19, 20, 21, 22, or 23;
i=1, j=0, 2, 3, 4, 5, 7, 8, 9, 11, 12, 14, 15, 16, 17, 19, 21, 22, 23, or 24;
i=2, j=0, 1, 2, 4, 5, 6, 7, 8, 9, 10, 13, 14, 15, 17, 18, 19, 20, 24, or 25;
i=3, j=0, 1, 3, 4, 6, 7, 8, 10, 11, 12, 13, 14, 16, 17, 18, 20, 21, 22, or 25;
i=4, j=0, 1, or 26;
i=5, j=0, 1, 3, 12, 16, 21, 22, or 27;
i=6, j=0, 6, 10, 11, 13, 17, 18, 20, or 28;
i=7, j=0, 1, 4, 7, 8, 14, or 29;

i=8, j=0, 1, 3, 12, 16, 19, 21, 22, 24, or 30;
i=9, j=0, 1, 10, 11, 13, 17, 18, 20, or 31;
i=10, j=1, 2, 4, 7, 8, 14, or 32;
i=11, j=0, 1, 12, 16, 21, 22, 23, or 33;
i=12, j=0, 1, 10, 11, 13, 18, or 34;
i=13, j=0, 3, 7, 20, 23, or 35;
i=14, j=0, 12, 15, 16, 17, 21, or 36;
i=15, j=0, 1, 10, 13, 18, 25, or 37;
i=16, j=1, 3, 11, 20, 22, or 38;
i=17, j=0, 14, 16, 17, 21, or 39;
i=18, j=1, 12, 13, 18, 19, or 40;
i=19, j=0, 1, 7, 8, 10, or 41;
i=20, j=0, 3, 9, 11, 22, or 42;
i=21, j=1, 5, 16, 20, 21, or 43;
i=22, j=0, 12, 13, 17, or 44;
i=23, j=1, 2, 10, 18, or 45;
i=24, j=0, 3, 4, 11, 22, or 46;
i=25, j=1, 6, 7, 14, or 47;
i=26, j=0, 2, 4, 15, or 48;
i=27, j=1, 6, 8, or 49;
i=28, j=0, 4, 19, 21, or 50;
i=29, j=1, 14, 18, 25, or 51;
i=30, j=0, 10, 13, 24, or 52;
i=31, j=1, 7, 22, 25, or 53;
i=32, j=0, 12, 14, 24, or 54;
i=33, j=1, 2, 11, 21, or 55;
i=34, j=0, 7, 15, 17, or 56;
i=35, j=1, 6, 12, 22, or 57;
i=36, j=0, 14, 15, 18, or 58;
i=37, j=1, 13, 23, or 59;
i=38, j=0, 9, 10, 12, or 60;
i=39, j=1, 3, 7, 19, or 61;
i=40, j=0, 8, 17, or 62;
i=41, j=1, 3, 9, 18, or 63;
i=42, j=0, 4, 24, or 64;
i=43, j=1, 16, 18, 25, or 65;
i=44, j=0, 7, 9, 22, or 66;
i=45, j=1, 6, 10, or 67;
wherein i is a row index of the LDPC base graph, 0≤i<46, j is a column index of the LDPC base graph, 0≤j<68.

10. The apparatus according to claim 9, wherein in obtaining the encoding matrix H by replacing each element of the LDPC base graph with a matrix of Z rows and Z columns, the processor is configured to:
replace each element of value 0 in the LDPC base graph with an all zero matrix of Z rows×Z columns; and
replace a {row index i, column index j} element of value 1 in the LDPC base graph by a circular permutation matrix $I(P_{i,j})$ of Z rows×Z columns, wherein the circular permutation matrix $I(P_{i,j})$ is obtained by circularly shifting an identity matrix of Z rows×Z columns to the right $P_{i,j}$ times, wherein $P_{i,j}$=mod $(V_{i,j}, Z)$, $V_{i,j}$ is a shift value corresponding to a lifting factor set index of Z, $V_{i,j}$ is an integer, and $V_{i,j} \geq 0$.

11. The apparatus according to claim 8, wherein K=22×Z.

12. The apparatus according to claim 8, wherein the input sequence is c={$c_0, c_1, c_2, \ldots, c_{K-1}$}, the encoded sequence is d={$d_0, d_1, d_2, \ldots, d_{M-1}$}, wherein $c_i$ (i=0, 1, … K−1) are information bits, $d_j$ (j=0, 1, … N−1) are encoded bits, wherein N is a positive integer, and N=66×Z.

13. The apparatus according to claim 12, wherein the encoded sequence d comprises $K_0$ bits obtained from the input sequence c and N−$K_0$ parity bits in a parity sequence w={$w_0, w_1, w_2, \ldots, w_{N-K_0-1}$}, $K_0$ is an integer greater than 0 and less than or equal to K,
wherein the parity sequence w and the input sequence c meet:

$$H \times \begin{bmatrix} c^T \\ w^T \end{bmatrix} = 0^T,$$

wherein $c^T$=[$c_0, c_1, c_2, \ldots, c_{K-1}$]$^T$ is a transposed vector including bits in the input sequence, $w^T$=[$w_0, w_1, w_2, \ldots, w_{N-K_0-1}$]$^T$ is a transposed vector including bits in the parity sequence, $0^T$ is a column vector, and values of all elements of $0^T$ are zero.

14. The apparatus according to claim 13, wherein $K_0$=K−2×Z.

15. The apparatus to claim 8, wherein the communication device is a network device or a terminal device in a communication network.

16. A microchip, comprising one or more integrated circuits that are configured to:
obtain an input sequence, wherein the input sequence comprises K bits of information, and K is a positive integer;
determine a lifting factor Z according to K;
encode the input sequence using an encoding matrix H, to obtain an encoded sequence; and
output the encoded sequence;
wherein the encoding matrix H is obtained from a low density parity check (LDPC) base graph by replacing each element of the LDPC base graph with a matrix of Z rows and Z columns;
wherein the LDPC base graph comprises m rows and n columns, and 5≤m≤46, and 27≤n≤68,
and each element in the LDPC base graph has a value of 0 or 1;
wherein an element in the LDPC base graph has a value of 1 when:
i=0, j=0, 1, 2, 3, 5, 6, 9, 10, 11, 12, 13, 15, 16, 18, 19, 20, 21, 22, or 23;
i=1, j=0, 2, 3, 4, 5, 7, 8, 9, 11, 12, 14, 15, 16, 17, 19, 21, 22, 23, or 24;
i=2, j=0, 1, 2, 4, 5, 6, 7, 8, 9, 10, 13, 14, 15, 17, 18, 19, 20, 24, or 25;
i=3, j=0, 1, 3, 4, 6, 7, 8, 10, 11, 12, 13, 14, 16, 17, 18, 20, 21, 22, or 25;
i=4, j=0, 1, or 26;
wherein i is a row index of the LDPC base graph, 0≤i<m, j is a column index of the LDPC base graph, 0≤j<n.

17. The microchip according to claim 16, wherein the LDPC base graph comprises 46 rows and 68 columns, and wherein an element in the LDPC base graph has the value of 1 when:
i=0, j=0, 1, 2, 3, 5, 6, 9, 10, 11, 12, 13, 15, 16, 18, 19, 20, 21, 22, or 23;
i=1, j=0, 2, 3, 4, 5, 7, 8, 9, 11, 12, 14, 15, 16, 17, 19, 21, 22, 23, or 24;
i=2, j=0, 1, 2, 4, 5, 6, 7, 8, 9, 10, 13, 14, 15, 17, 18, 19, 20, 24, or 25;
i=3, j=0, 1, 3, 4, 6, 7, 8, 10, 11, 12, 13, 14, 16, 17, 18, 20, 21, 22, or 25;
i=4, j=0, 1, or 26;
i=5, j=0, 1, 3, 12, 16, 21, 22, or 27;
i=6, j=0, 6, 10, 11, 13, 17, 18, 20, or 28;
i=7, j=0, 1, 4, 7, 8, 14, or 29;
i=8, j=0, 1, 3, 12, 16, 19, 21, 22, 24, or 30;
i=9, j=0, 1, 10, 11, 13, 17, 18, 20, or 31;
i=10, j=1, 2, 4, 7, 8, 14, or 32;
i=11, j=0, 1, 12, 16, 21, 22, 23, or 33;
i=12, j=0, 1, 10, 11, 13, 18, or 34;

i=13, j=0, 3, 7, 20, 23, or 35;
i=14, j=0, 12, 15, 16, 17, 21, or 36;
i=15, j=0, 1, 10, 13, 18, 25, or 37;
i=16, j=1, 3, 11, 20, 22, or 38;
i=17, j=0, 14, 16, 17, 21, or 39;
i=18, j=1, 12, 13, 18, 19, or 40;
i=19, j=0, 1, 7, 8, 10, or 41;
i=20, j=0, 3, 9, 11, 22, or 42;
i=21, j=1, 5, 16, 20, 21, or 43;
i=22, j=0, 12, 13, 17, or 44;
i=23, j=1, 2, 10, 18, or 45;
i=24, j=0, 3, 4, 11, 22, or 46;
i=25, j=1, 6, 7, 14, or 47;
i=26, j=0, 2, 4, 15, or 48;
i=27, j=1, 6, 8, or 49;
i=28, j=0, 4, 19, 21, or 50;
i=29, j=1, 14, 18, 25, or 51;
i=30, j=0, 10, 13, 24, or 52;
i=31, j=1, 7, 22, 25, or 53;
i=32, j=0, 12, 14, 24, or 54;
i=33, j=1, 2, 11, 21, or 55;
i=34, j=0, 7, 15, 17, or 56;
i=35, j=1, 6, 12, 22, or 57;
i=36, j=0, 14, 15, 18, or 58;
i=37, j=1, 13, 23, or 59;
i=38, j=0, 9, 10, 12, or 60;
i=39, j=1, 3, 7, 19, or 61;
i=40, j=0, 8, 17, or 62;
i=41, j=1, 3, 9, 18, or 63;
i=42, j=0, 4, 24, or 64;
i=43, j=1, 16, 18, 25, or 65;
i=44, j=0, 7, 9, 22, or 66;
i=45, j=1, 6, 10, or 67;
wherein i is a row index of the LDPC base graph, 0≤i<46, j is a column index of the LDPC base graph, 0≤j<68.

18. The microchip according to claim 16, wherein in obtaining the encoding matrix H by replacing each element of the LDPC base graph with a matrix of Z rows and Z columns, the one or more one or more integrated circuits are configured to:
replace each element of value 0 in the LDPC base graph with an all zero matrix of Z rows×Z columns; and
replace a {row index i, column index j} element of value 1 in the LDPC base graph by a circular permutation matrix $I(P_{i,j})$ of Z rows×Z columns, wherein the circular permutation matrix $I(P_{i,j})$ is obtained by circularly shifting an identity matrix of Z rows×Z columns to the right $P_{i,j}$ times, wherein $P_{i,j}$=mod $(V_{i,j}, Z)$, $V_{i,j}$ is a shift value corresponding to a lifting factor set index of Z, $V_{i,j}$ is an integer, and $V_{i,j} \geq 0$.

19. The microchip according to claim 16, wherein K=22×Z.

20. The microchip according to claim 16, wherein the input sequence is $c=\{c_0, c_1, c_2, \ldots, c_{K-1}\}$, the encoded sequence is $d=\{d_0, d_1, d_2, \ldots, d_{N-1}\}$, wherein $c_i$ (i=0, 1, ... K−1) are information bits, $d_j$ (j=0, 1, ... N−1) are encoded bits, wherein N is a positive integer, and N=66×Z.

21. The microchip according to claim 20, wherein the encoded sequence d comprises $K_0$ bits obtained from the input sequence c and $N-K_0$ parity bits in a parity sequence $w=\{w_0, w_1, w_2, \ldots, w_{N-K_0-1}\}$, $K_0$ is an integer greater than 0 and less than or equal to K,
wherein the parity sequence w and the input sequence c meet:

$$H \times \begin{bmatrix} c^T \\ w^T \end{bmatrix} = 0^T,$$

wherein $c^T=[c_0, c_2, c_2, \ldots, c_{K-1}]^T$ is a transposed vector including bits in the input sequence, $w^T=[w_0, w_1, w_2, \ldots, w_{N-K_0-1}]^T$ is a transposed vector including bits in the parity sequence, $0^T$ is a column vector, and values of all elements of $0^T$ are zero.

22. The microchip according to claim 21, wherein $K_0=K-2 \times Z$.

23. A method for processing information, performed by a communication apparatus in a wireless network, comprising:
obtaining an input sequence, wherein the input sequence comprises K bits of information, and K is a positive integer;
determining a lifting factor Z according to K;
encoding the input sequence using an encoding matrix H, to obtain an encoded sequence; and
outputting the encoded sequence;
wherein the encoding matrix H is obtained from a low density parity check (LDPC) base graph by replacing each element of the LDPC base graph with a matrix of Z rows and Z columns;
wherein the LDPC base graph comprises m rows and n columns, 5≤m≤46, and 27≤n≤68, and each element in the LDPC base graph has a value of 0 or 1;
wherein an element in the LDPC base graph has a value of 1 when:
i=0, j=0, 1, 2, 3, 5, 6, 9, 10, 11, 12, 13, 15, 16, 18, 19, 20, 21, 22, or 23;
i=1, j=0, 2, 3, 4, 5, 7, 8, 9, 11, 12, 14, 15, 16, 17, 19, 21, 22, 23, or 24;
i=2, j=0, 1, 2, 4, 5, 6, 7, 8, 9, 10, 13, 14, 15, 17, 18, 19, 20, 24, or 25;
i=3, j=0, 1, 3, 4, 6, 7, 8, 10, 11, 12, 13, 14, 16, 17, 18, 20, 21, 22, or 25;
i=4, j=0, 1, or 26;
wherein i is a row index of the LDPC base graph, 0≤i<46, j is a column index of the LDPC base graph, 0≤j<68.

24. The method according to claim 23, wherein the LDPC base graph comprises 46 rows and 68 columns, and wherein an element in the LDPC base graph has the value of 1 when:
i=0, j=0, 1, 2, 3, 5, 6, 9, 10, 11, 12, 13, 15, 16, 18, 19, 20, 21, 22, or 23;
i=1, j=0, 2, 3, 4, 5, 7, 8, 9, 11, 12, 14, 15, 16, 17, 19, 21, 22, 23, or 24;
i=2, j=0, 1, 2, 4, 5, 6, 7, 8, 9, 10, 13, 14, 15, 17, 18, 19, 20, 24, or 25;
i=3, j=0, 1, 3, 4, 6, 7, 8, 10, 11, 12, 13, 14, 16, 17, 18, 20, 21, 22, or 25;
i=4, j=0, 1, or 26;
i=5, j=0, 1, 3, 12, 16, 21, 22, or 27;
i=6, j=0, 6, 10, 11, 13, 17, 18, 20, or 28;
i=7, j=0, 1, 4, 7, 8, 14, or 29;
i=8, j=0, 1, 3, 12, 16, 19, 21, 22, 24, or 30;
i=9, j=0, 1, 10, 11, 13, 17, 18, 20, or 31;
i=10, j=1, 2, 4, 7, 8, 14, or 32;
i=11, j=0, 1, 12, 16, 21, 22, 23, or 33;
i=12, j=0, 1, 10, 11, 13, 18, or 34;
i=13, j=0, 3, 7, 20, 23, or 35;

i=14, j=0, 12, 15, 16, 17, 21, or 36;
i=15, j=0, 1, 10, 13, 18, 25, or 37;
i=16, j=1, 3, 11, 20, 22, or 38;
i=17, j=0, 14, 16, 17, 21, or 39;
i=18, j=1, 12, 13, 18, 19, or 40;
i=19, j=0, 1, 7, 8, 10, or 41;
i=20, j=0, 3, 9, 11, 22, or 42;
i=21, j=1, 5, 16, 20, 21, or 43;
i=22, j=0, 12, 13, 17, or 44;
i=23, j=1, 2, 10, 18, or 45;
i=24, j=0, 3, 4, 11, 22, or 46;
i=25, j=1, 6, 7, 14, or 47;
i=26, j=0, 2, 4, 15, or 48;
i=27, j=1, 6, 8, or 49;
i=28, j=0, 4, 19, 21, or 50;
i=29, j=1, 14, 18, 25, or 51;
i=30, j=0, 10, 13, 24, or 52;
i=31, j=1, 7, 22, 25, or 53;
i=32, j=0, 12, 14, 24, or 54;
i=33, j=1, 2, 11, 21, or 55;
i=34, j=0, 7, 15, 17, or 56;
i=35, j=1, 6, 12, 22, or 57;
i=36, j=0, 14, 15, 18, or 58;
i=37, j=1, 13, 23, or 59;
i=38, j=0, 9, 10, 12, or 60;
i=39, j=1, 3, 7, 19, or 61;
i=40, j=0, 8, 17, or 62;
i=41, j=1, 3, 9, 18, or 63;
i=42, j=0, 4, 24, or 64;
i=43, j=1, 16, 18, 25, or 65;
i=44, j=0, 7, 9, 22, or 66;
i=45, j=1, 6, 10, or 67;
wherein i is a row index of the LDPC base graph, 0≤i<46, j is a column index of the LDPC base graph, 0≤j<68.

25. The method according to claim 24, wherein obtaining the encoding matrix H by replacing each element of the LDPC base graph with a matrix of Z rows and Z columns comprises:

replacing each element of value 0 in the LDPC base graph with an all zero matrix of Z rows×Z columns; and replacing a {row index i, column index j} element of value 1 in the LDPC base graph by a circular permutation matrix $I(P_{i,j})$ of Z rows×Z columns, wherein the circular permutation matrix $I(P_{i,j})$ is obtained by circularly shifting an identity matrix of Z rows×Z columns to the right $P_{i,j}$ times, wherein $P_{i,j}$=mod $(V_{i,j}, Z)$, $V_{i,j}$ is a shift value corresponding to a lifting factor set index of Z, $V_{i,j}$ is an integer, and $V_{i,j} \geq 0$.

26. The method according to claim 23, wherein K=22×Z.

27. The method according to claim 23, wherein the input sequence is c={$c_0, c_1, c_2, \ldots, c_{K-1}$}, the encoded sequence is d={$d_0, d_1, d_2, \ldots, d_{N-1}$}, wherein $c_i$ (i=0, 1, ... K−1) are information bits, $d_j$ (j=0, 1, ... N−1) are encoded bits, N is a positive integer, and N=66×Z.

28. The method according to claim 27, wherein the encoded sequence d comprises $K_0$ bits obtained from the input sequence c and N−$K_0$ parity bits in a parity sequence w={$w_0, w_1, w_2, \ldots, w_{N-K_0-1}$}, $K_0$ is an integer greater than 0 and less than or equal to K, wherein the parity sequence w and the input sequence c meet:

$$H \times \begin{bmatrix} c^T \\ w^T \end{bmatrix} = 0^T,$$

wherein $c^T$=[$c_0, c_1, c_2, \ldots, c_{K-1}$]$^T$ is a transposed vector including bits in the input sequence, $w^T$=[$w_0, w_1, w_2, \ldots, w_{N-L_0-1}$]$^T$ is a transposed vector including bits in the parity sequence, $0^T$ is a column vector, and values of all elements of $0^T$ are zero.

29. The method according to claim 28, wherein $K_0$=K−2×Z.

* * * * *